US012765367B2

(12) United States Patent
Koezuka et al.

(10) Patent No.: US 12,765,367 B2
(45) Date of Patent: Oct. 13, 2026

(54) SEMICONDUCTOR DEVICE WITH IMPURITY DOPED OXIDE SEMICONDUCTOR LAYER AND METHOD FOR MANUFACTURING THE SEMICONDUCTOR DEVICE THEREOF

(71) Applicant: SEMICONDUCTOR ENERGY LABORATORY CO., LTD., Atsugi (JP)

(72) Inventors: Junichi Koezuka, Tochigi (JP); Toshimitsu Obonai, Shimotsuke (JP); Masami Jintyou, Shimotsuga (JP); Daisuke Kurosaki, Utsunomiya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 19/022,942

(22) Filed: Jan. 15, 2025

(65) Prior Publication Data

US 2025/0157933 A1 May 15, 2025

Related U.S. Application Data

(63) Continuation of application No. 18/370,916, filed on Sep. 21, 2023, now Pat. No. 12,261,119, which is a (Continued)

(30) Foreign Application Priority Data

Jan. 5, 2018 (JP) ................................ 2018-000501
Feb. 9, 2018 (JP) ................................ 2018-021912

(51) Int. Cl.
*H10W 20/48* (2026.01)
*H10P 14/692* (2026.01)

(Continued)

(52) U.S. Cl.
CPC ......... *H10W 20/48* (2026.01); *H10P 14/6923* (2026.01); *H10P 30/20* (2026.01); *H10P 95/90* (2026.01)

(58) Field of Classification Search
CPC ........... H01L 23/5329; H01L 21/02129; H01L 21/2636; H01L 21/265; H01L 21/02488;

(Continued)

(56) References Cited

U.S. PATENT DOCUMENTS 7,923,722 B2 4/2011 Ryu et al.
8,729,613 B2 5/2014 Honda et al.

(Continued)

FOREIGN PATENT DOCUMENTS

CN 105960712 A 9/2016
JP 2008-153644 A 7/2008

(Continued)

OTHER PUBLICATIONS

International Search Report (Application No. PCT/IB2018/060299) Dated Apr. 2, 2019.

(Continued)

*Primary Examiner* — John P. Dulka
(74) *Attorney, Agent, or Firm* — Fish & Richardson P.C.

(57) ABSTRACT

A semiconductor device having favorable electrical characteristics is provided. A semiconductor device having stable electrical characteristics is provided. A highly reliable semiconductor device is provided. The semiconductor device includes a semiconductor layer, a first insulating layer, and a first conductive layer. The semiconductor layer includes an island-shaped top surface. The first insulating layer is provided in contact with a top surface and a side surface of the semiconductor layer. The first conductive layer is positioned over the first insulating layer and includes a portion overlapping with the semiconductor layer. In addition, the semi- (Continued)

conductor layer includes a metal oxide, and the first insulating layer includes an oxide. The semiconductor layer includes a first region overlapping with the first conductive layer and a second region not overlapping with the first conductive layer. The first insulating layer includes a third region overlapping with the first conductive layer and a fourth region not overlapping with the first conductive layer. Furthermore, the second region and the fourth region contain phosphorus or boron.

14 Claims, 29 Drawing Sheets

Related U.S. Application Data continuation of application No. 17/729,306, filed on Apr. 26, 2022, now Pat. No. 11,810,858, which is a continuation of application No. 16/957,159, filed as application No. PCT/IB2018/060299 on Dec. 19, 2018, now Pat. No. 11,322,442.

(51) Int. Cl.
*H10P 30/20* (2026.01)
*H10P 95/90* (2026.01)

(58) Field of Classification Search
CPC ........ H01L 21/02554; H01L 21/02631; H10D 30/6757; H10D 30/6739; H10D 62/235; H10D 62/80; H10D 30/6755; H10W 20/48; H10P 14/6923; H10P 30/20; H10P 95/90; H10P 14/22; H10P 14/3238; H10P 14/3426
See application file for complete search history.

(56) References Cited

U.S. PATENT DOCUMENTS

| | | | | |
|---|---|---|---|---|
| 8,941,113 | B2 | 1/2015 | Takeuchi et al. | |
| 9,041,453 | B2 | 5/2015 | Miyake et al. | |
| 9,087,908 | B2 | 7/2015 | Honda et al. | |
| 9,184,296 | B2 | 11/2015 | Koezuka et al. | |
| 9,240,488 | B2 | 1/2016 | Yamazaki et al. | |
| 9,378,980 | B2 | 6/2016 | Yamazaki et al. | |
| 9,382,611 | B2 | 7/2016 | Yamazaki et al. | |
| 9,478,187 | B2 | 10/2016 | Miyake et al. | |
| 9,496,408 | B2 | 11/2016 | Yamazaki et al. | |
| 9,530,894 | B2 | 12/2016 | Koezuka et al. | |
| 9,553,200 | B2 | 1/2017 | Isobe et al. | |
| 9,680,028 | B2 | 6/2017 | Honda et al. | |
| 9,728,651 | B2 | 8/2017 | Yamazaki et al. | |
| 9,837,547 | B2 | 12/2017 | Koezuka et al. | |
| 9,847,358 | B2 | 12/2017 | Koezuka et al. | |
| 9,852,926 | B2 | 12/2017 | Akimoto et al. | |
| 9,859,437 | B2 | 1/2018 | Morosawa et al. | |
| 9,978,329 | B2 | 5/2018 | Miyake et al. | |
| 10,319,861 | B2 | 6/2019 | Koezuka et al. | |
| 10,361,290 | B2 | 7/2019 | Yamazaki et al. | |
| 10,367,013 | B2 | 7/2019 | Koezuka et al. | |
| 10,453,964 | B2 | 10/2019 | Yamazaki et al. | |
| 10,763,282 | B2 | 9/2020 | Koezuka et al. | |
| 10,763,371 | B2 | 9/2020 | Morosawa et al. | |
| 10,861,981 | B2 | 12/2020 | Koezuka et al. | |
| 10,903,368 | B2 | 1/2021 | Koezuka et al. | |
| 11,322,442 | B2 | 5/2022 | Koezuka et al. | |
| 11,329,166 | B2 | 5/2022 | Hosaka et al. | |
| 11,355,529 | B2 | 6/2022 | Koezuka et al. | |
| 11,527,657 | B2 | 12/2022 | Hata et al. | |
| 2008/0258143 | A1 | 10/2008 | Kim et al. | |
| 2009/0021661 | A1 | 1/2009 | Tsuboi | |
| 2010/0051949 | A1 | 3/2010 | Yamazaki et al. | |
| 2011/0147738 | A1* | 6/2011 | Yamazaki .......... | H10D 30/6755 257/43 |
| 2013/0092945 | A1* | 4/2013 | Honda ................. | H10D 86/423 257/E29.273 |
| 2013/0221347 | A1 | 8/2013 | Isobe et al. | |
| 2014/0239293 | A1* | 8/2014 | Yamazaki .......... | H10D 30/6757 257/43 |
| 2015/0155505 | A1 | 6/2015 | Yamazaki et al. | |
| 2015/0263141 | A1 | 9/2015 | Yamazaki et al. | |
| 2017/0104090 | A1 | 4/2017 | Koezuka et al. | |
| 2017/0110337 | A1 | 4/2017 | Akimoto et al. | |
| 2017/0110586 | A1 | 4/2017 | Isobe et al. | |
| 2019/0326420 | A1 | 10/2019 | Yamazaki et al. | |
| 2020/0287002 | A1 | 9/2020 | Hosono et al. | |
| 2021/0005754 | A1 | 1/2021 | Hosaka et al. | |
| 2021/0119056 | A1 | 4/2021 | Koezuka et al. | |
| 2021/0371623 | A1 | 12/2021 | Ueda et al. | |
| 2022/0068925 | A1 | 3/2022 | Kawai et al. | |
| 2022/0149205 | A1 | 5/2022 | Hosaka et al. | |
| 2022/0293641 | A1 | 9/2022 | Koezuka et al. | |
| 2022/0367691 | A1 | 11/2022 | Watakabe et al. | |

FOREIGN PATENT DOCUMENTS

| | | | |
|---|---|---|---|
| JP | 2011-146694 | A | 7/2011 |
| JP | 2011-228622 | A | 11/2011 |
| JP | 2013-211538 | A | 10/2013 |
| JP | 2013-229588 | A | 11/2013 |
| JP | 2014-007399 | A | 1/2014 |
| JP | 2014-211621 | A | 11/2014 |
| JP | 2015-188079 | A | 10/2015 |
| JP | 2017-028252 | A | 2/2017 |
| JP | 2017-034272 | A | 2/2017 |
| JP | 2017-076788 | A | 4/2017 |
| JP | 2017-079330 | A | 4/2017 |
| KR | 2011-0109885 | A | 10/2011 |
| KR | 2017-0076190 | A | 7/2017 |
| TW | 201138114 | | 11/2011 |
| WO | WO-2011/074407 | | 6/2011 |
| WO | WO-2013/054933 | | 4/2013 |
| WO | WO-2015/118472 | | 8/2015 |
| WO | WO-2016/189411 | | 12/2016 |
| WO | WO-2017/085591 | | 5/2017 |

OTHER PUBLICATIONS

Written Opinion (Application No. PCT/IB2018/060299) Dated Apr. 2, 2019.

Chinese Office Action (Application No. 201880081313.0) Dated Dec. 15, 2023.

* cited by examiner

FIG. 18A

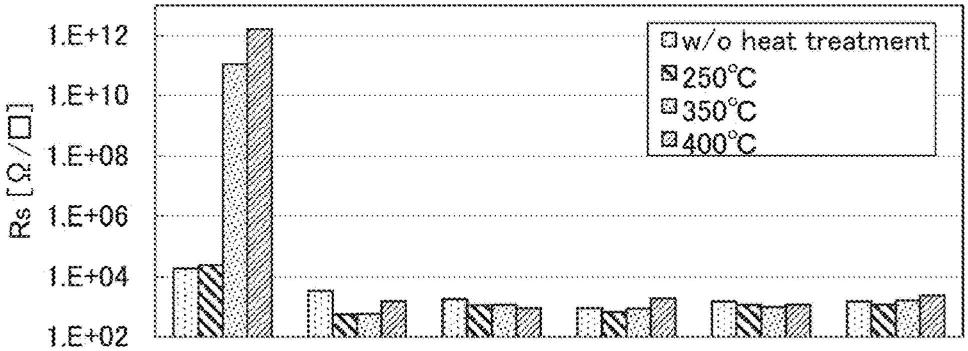

| Acceleration voltage | 20 [kV] | | | | | |
|---|---|---|---|---|---|---|
| B dosage | $1\times10^{15}$ [$cm^{-2}$] | $3\times10^{15}$ [$cm^{-2}$] | $5\times10^{15}$ [$cm^{-2}$] | $8\times10^{15}$ [$cm^{-2}$] | $1\times10^{16}$ [$cm^{-2}$] | $1.5\times10^{16}$ [$cm^{-2}$] |

FIG. 18B

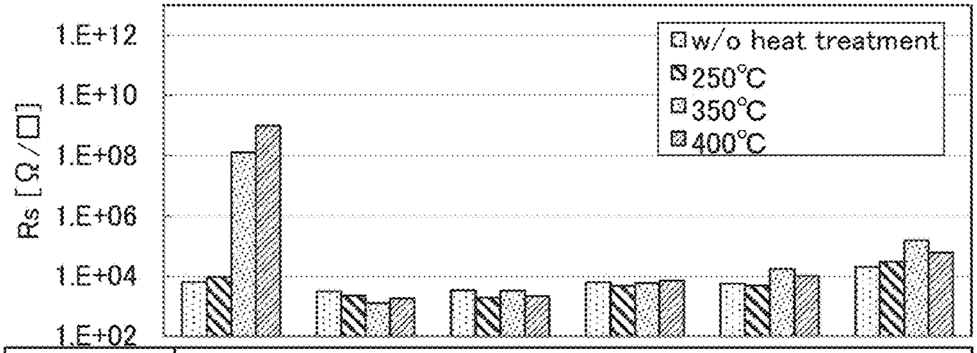

| Acceleration voltage | 40 [kV] | | | | | |
|---|---|---|---|---|---|---|
| B dosage | $1\times10^{15}$ [$cm^{-2}$] | $3\times10^{15}$ [$cm^{-2}$] | $5\times10^{15}$ [$cm^{-2}$] | $8\times10^{15}$ [$cm^{-2}$] | $1\times10^{16}$ [$cm^{-2}$] | $1.5\times10^{16}$ [$cm^{-2}$] |

FIG. 18C

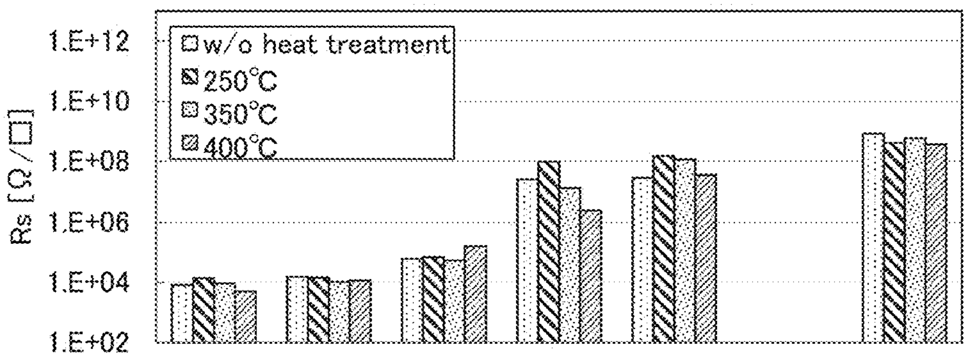

| Acceleration voltage | 60 [kV] | | | | | |
|---|---|---|---|---|---|---|
| B dosage | $1\times10^{15}$ [$cm^{-2}$] | $3\times10^{15}$ [$cm^{-2}$] | $5\times10^{15}$ [$cm^{-2}$] | $8\times10^{15}$ [$cm^{-2}$] | $1\times10^{16}$ [$cm^{-2}$] | $1.5\times10^{16}$ [$cm^{-2}$] |

| Acceleration voltage | 60 [kV] | | | | | |
|---|---|---|---|---|---|---|
| P dosage | $1\times10^{15}$ [$cm^{-2}$] | $3\times10^{15}$ [$cm^{-2}$] | $5\times10^{15}$ [$cm^{-2}$] | $8\times10^{15}$ [$cm^{-2}$] | $1\times10^{16}$ [$cm^{-2}$] | $1.5\times10^{16}$ [$cm^{-2}$] |

| Acceleration voltage | 70 [kV] | | | | | |
|---|---|---|---|---|---|---|
| P dosage | $1\times10^{15}$ [$cm^{-2}$] | $3\times10^{15}$ [$cm^{-2}$] | $5\times10^{15}$ [$cm^{-2}$] | $8\times10^{15}$ [$cm^{-2}$] | $1\times10^{16}$ [$cm^{-2}$] | $1.5\times10^{16}$ [$cm^{-2}$] |

FIG. 22
| | Non Dope | B-Dope | | | | | | |
|---|---|---|---|---|---|---|---|---|
| Acceleration voltage | – | 20 [kV] | | | | | 40 [kV] | 60 [kV] |
| Dosage | – | $1\times10^{15}$ [ions/cm$^2$] | $3\times10^{15}$ [ions/cm$^2$] | $5\times10^{15}$ [ions/cm$^2$] | $8\times10^{15}$ [ions/cm$^2$] | $1\times10^{16}$ [ions/cm$^2$] | $5\times10^{15}$ [ions/cm$^2$] | $5\times10^{15}$ [ions/cm$^2$] |
| L/W = 2 µm/50 µm | 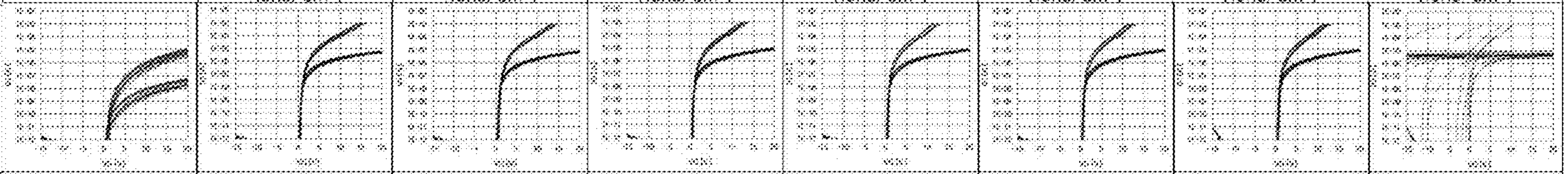 | | | | | | | |
| L/W = 3 µm/50 µm | 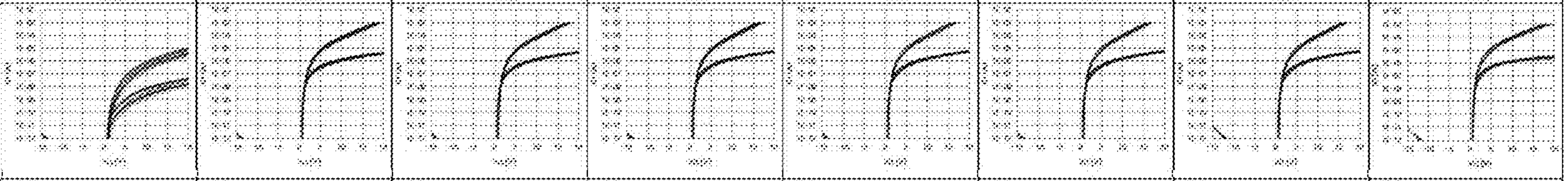 | | | | | | | |
| L/W = 6 µm/50 µm | 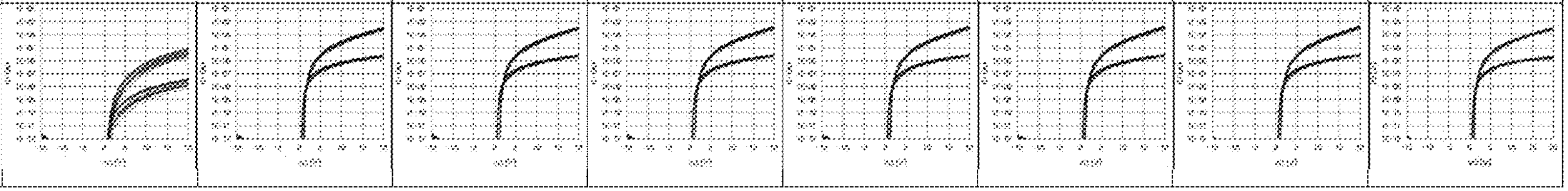 | | | | | | | |

FIG. 29

<table>
<tr><td></td><td>$^{11}B$ ion implantation</td><td>$^{31}P$ ion implantation</td></tr>
<tr><td>Beam energy</td><td>15 [keV]</td><td>45 [keV]</td></tr>
<tr><td>Dosage</td><td>$3 \times 10^{15}$ [ions/cm$^2$]</td><td>$1 \times 10^{15}$ [ions/cm$^2$]</td></tr>
<tr><td>L/W =<br>2 µm/50 µm</td><td>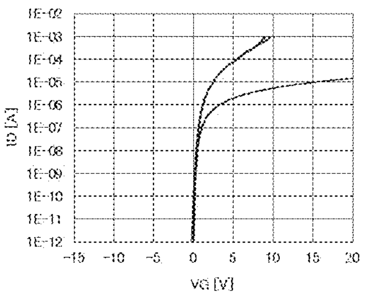
</td><td>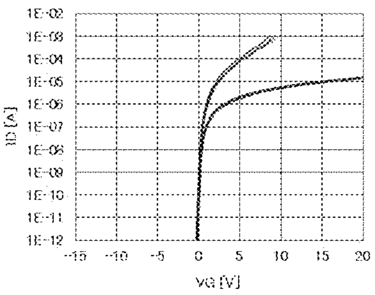
</td></tr>
<tr><td>L/W =<br>3 µm/50 µm</td><td>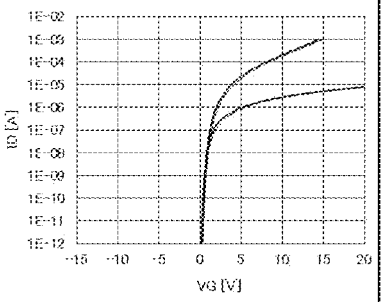
</td><td>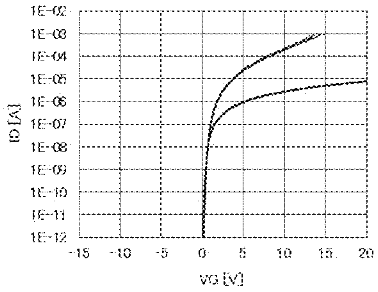
</td></tr>
<tr><td>L/W =<br>6 µm/50 µm</td><td>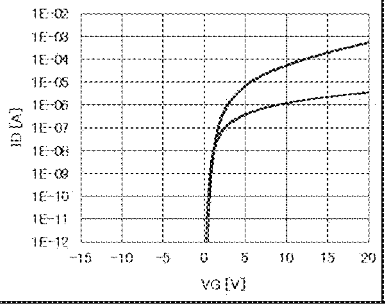
</td><td>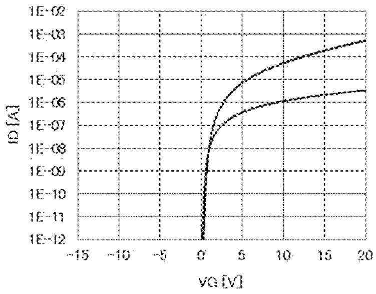
</td></tr>
</table>

SEMICONDUCTOR DEVICE WITH IMPURITY DOPED OXIDE SEMICONDUCTOR LAYER AND METHOD FOR MANUFACTURING THE SEMICONDUCTOR DEVICE THEREOF

CROSS REFERENCE TO RELATED APPLICATIONS

This application is a continuation of U.S. application Ser. No. 18/370,916, filed Sep. 21, 2023, now allowed, which is incorporated by reference and is a continuation of U.S. application Ser. No. 17/729,306, filed Apr. 26, 2022, now U.S. Pat. No. 11,810,858, which is incorporated by reference and is a continuation of U.S. application Ser. No. 16/957,159, filed Jun. 23, 2020, now U.S. Pat. No. 11,322,442, which is incorporated by reference and is a U.S. National Phase Application under 35 U.S.C. § 371 of International Application PCT/IB2018/060299, filed on Dec. 19, 2018, which is incorporated by reference and claims the benefit of foreign priority applications filed in Japan on Jan. 5, 2018, as Application No. 2018-000501, and on Feb. 9, 2018, as Application No. 2018-021912.

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device refers to a device that can function by utilizing semiconductor characteristics in general.

BACKGROUND ART

As a semiconductor material applicable to a transistor, an oxide semiconductor using a metal oxide has attracted attention. For example, Patent Document 1 discloses a semiconductor device that makes field-effect mobility (simply referred to as mobility or μFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

In addition, Patent Document 2 discloses a thin film transistor in which an oxide semiconductor film including a low-resistance region containing at least one kind of aluminum, boron, gallium, indium, titanium, silicon, germanium, tin, and lead as a dopant is applied to a source region and a drain region.

PRIOR ART DOCUMENTS

Patent Documents

[Patent Document 1] Japanese Published Patent Application No. 2014-7399
[Patent Document 2] Japanese Published Patent Application No. 2011-228622

SUMMARY OF THE INVENTION

Problems to be Solved by the Invention

An object of one embodiment of the present invention is to provide a semiconductor device having favorable electrical characteristics. Another object is to provide a semiconductor device having stable electrical characteristics. Another object is to provide a highly reliable semiconductor device.

Note that the description of these objects does not disturb the existence of other objects. Note that one embodiment of the present invention does not need to achieve all the objects. Note that objects other than these can be derived from the description of the specification, the drawings, the claims, and the like.

Means for Solving the Problems

One embodiment of the present invention is a semiconductor device that includes a semiconductor layer, a first insulating layer, and a first conductive layer. The semiconductor layer includes an island-shaped top surface. The first insulating layer is provided in contact with a top surface and a side surface of the semiconductor layer. The first conductive layer is positioned over the first insulating layer and includes a portion overlapping with the semiconductor layer. In addition, the semiconductor layer includes a metal oxide, and the first insulating layer includes an oxide. The semiconductor layer includes a first region overlapping with the first conductive layer and a second region not overlapping with the first conductive layer. The first insulating layer includes a third region overlapping with the first conductive layer and a fourth region not overlapping with the first conductive layer. Furthermore, the second region and the fourth region contain a first element. Furthermore, the first element is preferably phosphorus, boron, magnesium, aluminum, or silicon. Moreover, it is preferable that the first element exist in a state of being bonded to oxygen.

In addition, in the above, a peak derived from an oxidation state of the first element is preferably observed in the second region or the fourth region in X-ray photoelectron spectroscopy analysis.

In addition, in the above, it is preferable that the second region include a region with a higher concentration of the first element than the fourth region.

In addition, in the above, it is preferable that the second region have a concentration gradient such that the concentration of the first element is higher in a portion closer to the first insulating layer.

In addition, in the above, it is preferable that the fourth region have a concentration gradient such that the concentration of the first element is higher in a portion closer to the semiconductor layer.

In addition, in the above, it is preferable that the semiconductor layer include a region where the concentration of the first element is higher than or equal to $1\times10^{20}$ atoms/$cm^3$ and lower than or equal to $1\times10^{22}$ atoms/$cm^3$.

In addition, in the above, a second insulating layer is preferably included. In that case, the semiconductor layer is preferably provided over and in contact with the second insulating layer. Furthermore, the first insulating layer preferably includes a portion in contact with the second insulating layer in a region not overlapping with the semiconductor layer. Moreover, the second insulating layer preferably includes a fifth region containing the first element and not overlapping with the semiconductor layer.

In addition, in the above, a second insulating layer is preferably included. In that case, it is preferable that the second conductive layer be positioned below the second insulating layer and include a region overlapping with the semiconductor layer and the first conductive layer.

In addition, in the above, a metal oxide layer is preferably included between the first insulating layer and the first conductive layer. In that case, the metal oxide layer preferably contains one or more of the same elements as those of the semiconductor layer.

In addition, another embodiment of the present invention is a method for manufacturing a semiconductor device that includes a first step of forming an island-shaped semiconductor layer containing a metal oxide, a second step of forming a first insulating layer containing an oxide over the island-shaped semiconductor layer, a third step of forming a first conductive layer overlapping with part of the semiconductor layer over the first insulating layer, and a fourth step of supplying a first element into the first insulating layer and the semiconductor layer in a region not covered with the first conductive layer. Furthermore, the first element is preferably phosphorus, boron, magnesium, aluminum, or silicon.

In addition, in the fourth step in the above, the first element is preferably supplied to achieve concentration distribution where a concentration of the first element in the semiconductor layer becomes higher as the first element becomes closer to the first insulating layer.

In addition, in the fourth step in the above, the first element is preferably supplied by a plasma ion doping method or an ion implantation method.

In addition, in the above, a fifth step of performing heat treatment is preferably included after the fourth step. In that case, the heat treatment is preferably performed within a temperature range of higher than or equal to 200° C. to lower than or equal to 400° C.

Effect of the Invention

According to one embodiment of the present invention, it is possible to provide a semiconductor device having favorable electrical characteristics. Alternatively, it is possible to provide a semiconductor device having stable electrical characteristics. Alternatively, it is possible to provide a highly reliable semiconductor device.

Note that the description of the effects does not disturb the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIGS. 6A to 6C Diagrams illustrating a method for manufacturing a transistor.

FIGS. 7A and 7B Top views of display devices.

FIGS. 18A to 18C Sheet resistance measurement results.

FIG. 22 Electrical characteristics of transistors.

FIG. 29 Electrical characteristics of transistors.

MODE FOR CARRYING OUT THE INVENTION

Figure 1A:
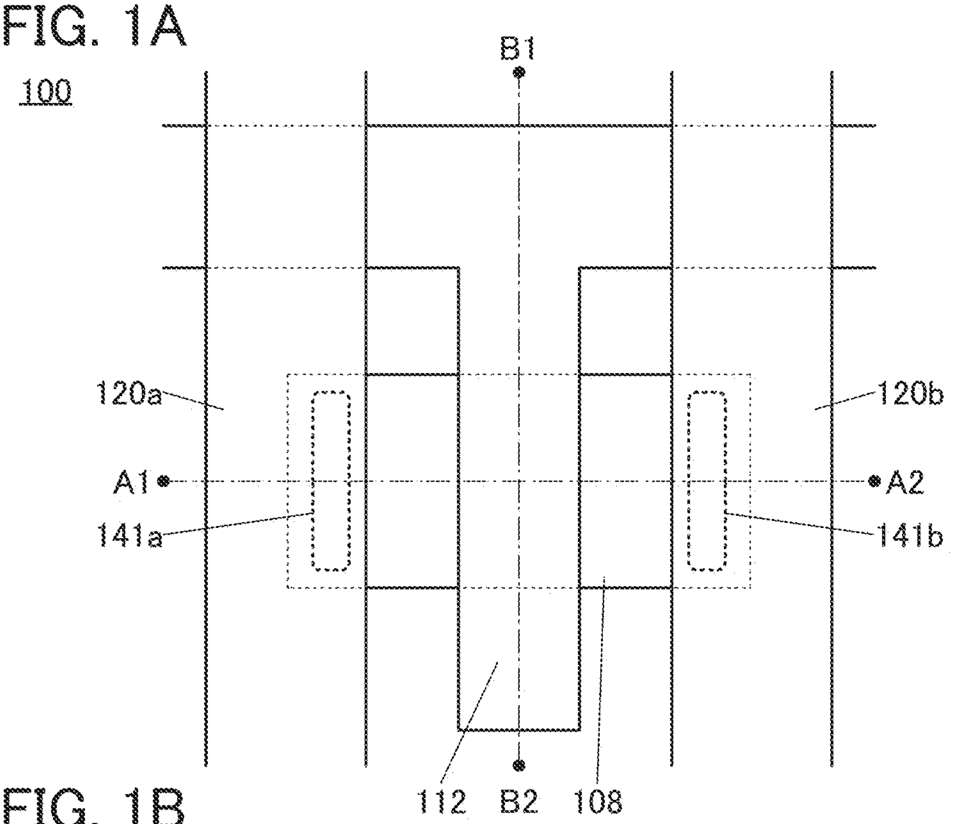
FIGS. 1A to 1C A structure example of a transistor.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Furthermore, in each drawing described in this specification, the size, the layer thickness, or the region of each component is exaggerated for clarity in some cases.

Furthermore, ordinal numbers such as “first,” “second,” and “third” used in this specification are used in order to avoid confusion among components, and the terms do not limit the components numerically.

In addition, in this specification, terms for describing arrangement, such as “over” and “under,” are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

Furthermore, in this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, a channel length direction corresponds to one of the directions of current flowing through a semiconductor layer when a transistor is in an on state. In addition, a channel width direction refers to a direction orthogonal to the channel length direction. Note that each of the channel length direction and the channel width direction is not fixed to one direction in some cases depending on the structure and the shape of a transistor.

Furthermore, in this specification and the like, "electrically connected" includes the case where connection is made through an "object having any electric action." Here, there is no particular limitation on the "object having any electric action" as long as electric signals can be transmitted and received between the connected components. Examples of the "object having any electric action" include a switching element such as a transistor, a resistor, an inductor, a capacitor, and other elements with a variety of functions as well as an electrode and a wiring.

Furthermore, in this specification and the like, the term "film" and the term "layer" can be interchanged with each other. For example, in some cases, the term "conductive layer" and the term "insulating layer" can be interchanged with the term "conductive film" and the term "insulating film," respectively.

Furthermore, unless otherwise specified, off-state current in this specification and the like refers to drain current of a transistor in an off state (also referred to as a non-conducting state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

Furthermore, in this specification and the like, a substrate of a touch panel to which a connector or an IC is attached is referred to as a touch panel module, a display module, or simply a touch panel or the like in some cases.

Embodiment 1

In this embodiment, a semiconductor device and a display device of one embodiment of the present invention and a manufacturing method thereof are described.

One embodiment of the present invention is a transistor including, over a formation surface, a semiconductor layer in which a channel is formed, a gate insulating layer (also referred to as a first insulating layer) over the semiconductor layer, and a conductive layer (also referred to as a first conductive layer) functioning as a gate electrode over the gate insulating layer. The semiconductor layer preferably contains a metal oxide exhibiting semiconductor characteristics (hereinafter also referred to as an oxide semiconductor).

The gate insulating layer is preferably provided in contact with a top surface and a side surface of the semiconductor layer processed into an island shape. In addition, especially in the case where a metal oxide is used for the semiconductor layer, the gate insulating layer preferably contains an oxide.

The semiconductor layer includes a channel formation region where a channel can be formed and a pair of low-resistance regions functioning as a source region and a drain region. The channel formation region is a region of the semiconductor layer that overlaps with the gate electrode. In addition, the pair of low-resistance regions is provided with the channel formation region therebetween and has lower resistance than the channel formation region.

The pair of low-resistance regions preferably contains an impurity element. Examples of an impurity element include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. In particular, boron or phosphorus is preferably contained.

In particular, the pair of low-resistance regions preferably contains an impurity element that is likely to be bonded to oxygen. Examples of such an impurity element include boron, phosphorus, aluminum, magnesium, and silicon.

An impurity element contained in the pair of low-resistance regions preferably has a concentration gradient such that the concentration is higher in a portion closer to the gate insulating layer.

Note that the impurity element contained in the low-resistance region is sometimes partly diffused into the channel formation region owing to the influence of heat applied during a manufacturing process, or the like. In such a case, the concentration of the impurity element in the channel formation region is preferably lower than or equal to one tenth, further preferably lower than or equal to one hundredth of that of the impurity element in the low-resistance region.

In addition, it is preferable that the impurity element be contained also in a portion of the gate insulating layer that is in contact with the pair of low-resistance regions, i.e., a portion of the gate insulating layer that does not overlap with the gate electrode. Furthermore, it is preferable that the impurity not be added to a portion of the gate insulating layer that is in contact with the channel formation region, i.e., a portion of the gate insulating layer that overlaps with the gate electrode.

When heat treatment is performed in a state where the gate insulating layer containing an oxide is provided in contact with the top surface of the semiconductor layer, oxygen released from the gate insulating layer can be supplied to the semiconductor layer. Thus, oxygen vacancies in the semiconductor layer can be filled, and a highly reliable transistor can be achieved.

Meanwhile, when oxygen is supplied to the low-resistance region, carrier density decreases and electrical resistance increases in some cases. However, in one embodiment of the present invention, the impurity element is added to the portion of the gate insulating layer that is in contact with the low-resistance region. When the impurity element is added to an oxide film from which oxygen can be released by heating, the amount of released oxygen can be reduced. As a result, supply of oxygen from the gate insulating layer to the low-resistance region can be inhibited, and the low-resistance region can maintain the low-electrical-resistance state.

Employing such a structure makes it possible to achieve a semiconductor device including both a channel formation region with sufficiently reduced oxygen vacancies and extremely low carrier density and a source region and a drain region that have extremely low electrical resistance and having excellent electrical characteristics and high reliability.

Such a transistor can be manufactured by, for example, heat treatment after treatment for supplying the impurity element to the gate insulating layer and the semiconductor layer using the gate electrode as a mask.

A this time, the impurity element is further preferably supplied by a plasma ion doping method or an ion implantation method. These methods can easily adjust the depth at which ions are added and thus make it easy to add ions aiming at a region including the gate insulating layer and the semiconductor layer.

In addition, conditions for supplying ions are preferably set such that when an impurity element is added, an impurity concentration in a region of the semiconductor layer on a gate insulating layer side or in the vicinity of an interface between the semiconductor layer and the gate insulating layer is the highest. In that case, an impurity element at an appropriate concentration can be added to both the semiconductor layer and the gate insulating layer by one step. Furthermore, when an impurity element at a high concentration is added to an upper portion of the low-resistance region to decrease resistance, contact resistance between the low-resistance region and a source electrode or a drain electrode can be further decreased. Moreover, by formation of a region having a high concentration of the impurity element in a portion of the gate insulating layer near the low-resistance region, diffusibility of oxygen in this portion is effectively reduced, and oxygen in the gate insulating layer can be further effectively inhibited from diffusing into a low-resistance region side.

For example, the low-resistance region of the semiconductor layer preferably includes a region whose impurity concentration is higher than or equal to $1\times10^{19}$ atoms/cm$^3$ and lower than or equal to $1\times10^{23}$ atoms/cm$^3$, preferably higher than or equal to $1\times10^{20}$ atoms/cm$^3$ and lower than or equal to $1\times10^{22}$ atoms/cm$^3$. In addition, the low-resistance region of the semiconductor layer preferably includes a region having a higher impurity concentration than a region of the gate insulating layer that is in contact with the low-resistance region. Accordingly, the low-resistance region can have extremely low resistance.

In addition, a region of the gate insulating layer that does not overlap with the gate electrode preferably includes a region whose impurity concentration is lower than the low-resistance region and higher than a region of the gate insulating layer that overlaps with the gate electrode.

In addition, in the case where an element that is likely to be bonded to oxygen is used as the impurity element, the impurity element exists in a state of being bonded to oxygen in a semiconductor. In other words, the impurity element takes oxygen in the semiconductor layer away to cause oxygen vacancies in the semiconductor layer, the oxygen vacancies are bonded to hydrogen in a film, and thus, carriers are generated. Furthermore, an impurity element in the semiconductor layer exists stably in an oxidized state; thus, the impurity element is not desorbed by heat or the like applied during the process, which makes it possible to achieve a low-resistance region that has low resistance stably. For example, even when a temperature of higher than or equal to 400° C., higher than or equal to 600° C., or higher than or equal to 800° C. is applied during the process, a stable low-resistance region can be maintained.

Here, in general, in the case where a silicon film is used for the semiconductor layer, a donor that supplies an electron to a semiconductor or an acceptor that supplies a hole to a semiconductor is used as an impurity, and the donor or the acceptor is replaced with a silicon atom, so that the semiconductor layer can have N-type or P-type conductivity. Meanwhile, as described above, in one embodiment of the present invention, an impurity element contained in an oxide semiconductor has a function of taking oxygen in the oxide semiconductor away to cause oxygen vacancies in the semiconductor layer, and the impurity element itself does not need to have a function of generating carriers. In this respect, it can be said that a mechanism to reduce the resistance of the semiconductor layer in one embodiment of the present invention is completely different from the case of silicon or the like.

In addition, an insulating film containing an oxide is preferably used for the gate insulating layer. Furthermore, oxygen (also referred to as excess oxygen) that is released by heating is preferably contained in the gate insulating layer. In that case, an impurity element in the gate insulating layer exists in a state of being bonded to excess oxygen in the gate insulating layer. When the impurity element is bonded to excess oxygen to be stabilized, oxygen is hardly released from a region to which the impurity element is added even when heating is performed. Moreover, oxygen is less likely to be diffused. Accordingly, oxygen is supplied to the channel formation region while preventing an increase in resistance due to supply of oxygen from the gate insulating layer to the low-resistance region, so that oxygen vacancies can be reduced. As a result, a transistor that has favorable electrical characteristics and high reliability can be achieved.

As the impurity element, an element that is stabilized by being bonded to oxygen in the semiconductor layer and in the gate insulating layer is preferably used. For example, an element an oxide of which can exist as a solid in a normal state is preferably used. A particularly preferable element can be selected from a typical non-metal element other than a rare gas and hydrogen, a typical metal element, and a transition metal element. It is particularly preferable to use boron, phosphorus, aluminum, magnesium, silicon, or the like.

More specific examples will be described below with reference to drawings.

Structure Example 1

Figure 1B:
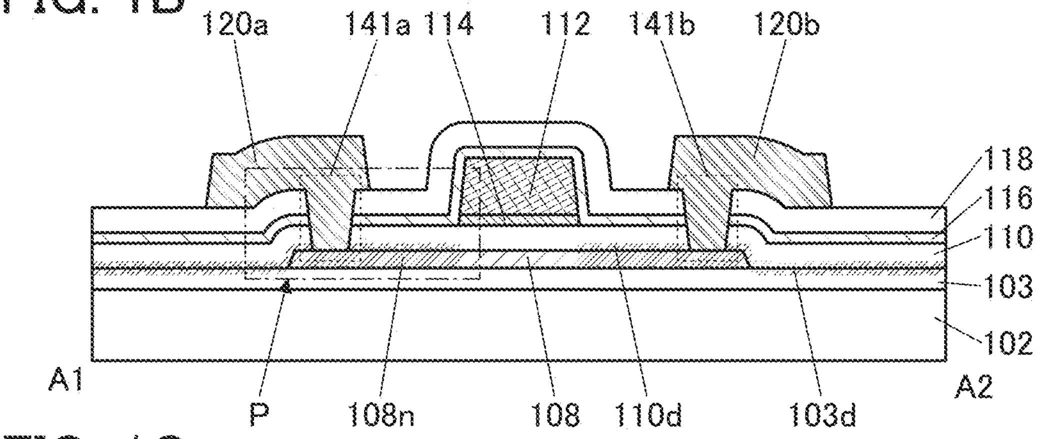
Figure 1C:
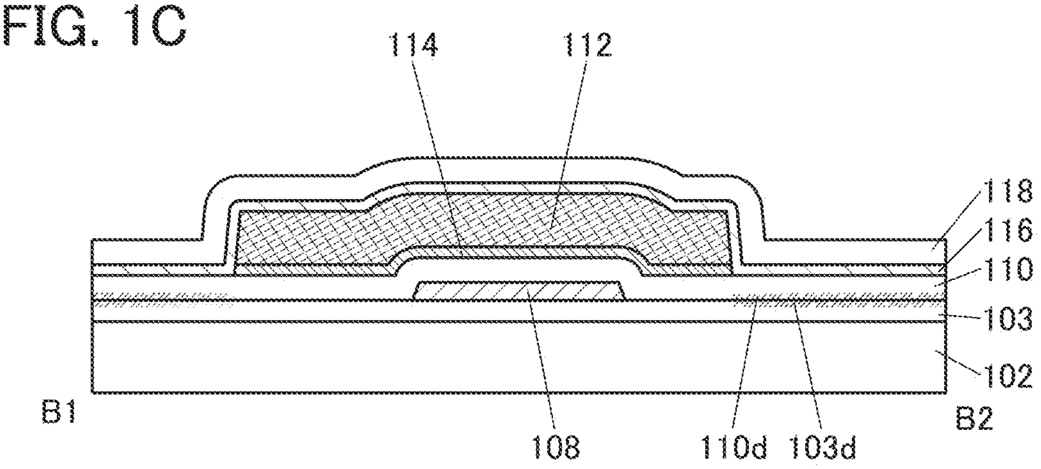

FIG. 1(A) is a top view of a transistor 100. FIG. 1(B) corresponds to a cross-sectional view of a cut plane taken along a dashed-dotted line A1-A2 in FIG. 1(A). FIG. 1(C) corresponds to a cross-sectional view of a cut plane taken along a dashed-dotted line B1-B2 in FIG. 1(A). Note that in FIG. 1(A), some components of the transistor 100 (a gate insulating layer and the like) are not illustrated. In addition, the direction of the dashed-dotted line A1-A2 corresponds to a channel length direction, and the direction of the dashed-dotted line B1-B2 corresponds to a channel width direction. Furthermore, some components are not illustrated in top views of transistors in the following drawings, as in FIG. 1(A).

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The island-shaped semiconductor layer 108 is provided over the insulating layer 103. The insulating layer 110 is provided in contact with a top surface of the insulating layer 103 and a top surface and a side surface of the semiconductor layer 108. The metal oxide layer 114 and the conductive layer 112 are provided to be stacked in that order over the insulating layer 110 and include portions overlapping with the semiconductor layer 108. The insulating layer 116 is provided to cover a top surface of the insulating layer 110, a side surface of the metal oxide layer 114, and a top surface of the conductive layer 112. The insulating layer 118 is provided to cover the insulating layer 116.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

In addition, as illustrated in FIGS. 1(A) and 1(B), the transistor 100 may include a conductive layer 120*a* and a conductive layer 120*b* over the insulating layer 118. The conductive layer 120*a* and the conductive layer 120*b* function as a source electrode and a drain electrode. The conductive layer 120*a* and the conductive layer 120*b* are electrically connected to regions 108*n* to be described later through an opening portion 141*a* and an opening portion 141*b*, respectively, which are provided in the insulating layer 118, the insulating layer 116, and the insulating layer 110.

The semiconductor layer 108 preferably contains a metal oxide.

The semiconductor layer 108 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The conductive layer 112 and the metal oxide layer 114 are processed to have substantially the same top surface shapes.

Note that in this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes."

The metal oxide layer 114 positioned between the insulating layer 110 and the conductive layer 112 functions as a barrier film that prevents diffusion of oxygen contained in the insulating layer 110 into a conductive layer 112 side. Furthermore, the metal oxide layer 114 also functions as a barrier film that prevents diffusion of hydrogen and water contained in the conductive layer 112 into an insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, carrier density in a channel formation region of the semiconductor layer 108 can be extremely low.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

An insulating material having a higher permittivity than silicon oxide is preferably used for the metal oxide layer 114. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

Alternatively, for the metal oxide layer 114, an oxide material containing one or more of the same elements as those of the semiconductor layer 108 is preferably used. It is particularly preferable to use an oxide semiconductor material that can be used for the semiconductor layer 108. Here, a metal oxide film formed using the same sputtering target as that for the semiconductor layer 108 is preferably applied to the metal oxide layer 114 because an apparatus can be shared.

Alternatively, when a metal oxide material containing indium and gallium is used for both the semiconductor layer 108 and the metal oxide layer 114, a material whose composition (content ratio) of gallium is higher than that in the semiconductor layer 108 is preferably used because an oxygen blocking property can be further increased. Here, when a material whose composition of indium is higher than that in the metal oxide layer 114 is used for the semiconductor layer 108, field-effect mobility of the transistor 100 can be increased.

In addition, the metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

The semiconductor layer 108 includes a region overlapping with the conductive layer 112 and a pair of low-resistance regions 108*n* between which the region is sandwiched. A region of the semiconductor layer 108 that overlaps with the conductive layer 112 functions as a channel formation region of the transistor 100. Meanwhile, the regions 108*n* function as a source region and a drain region of the transistor 100.

The low-resistance region 108*n* can also be regarded as a region having lower resistance than the channel formation region, a region having a higher carrier concentration than the channel formation region, a region having higher oxygen defect density than the channel formation region, a region having a higher impurity concentration than the channel formation region, or an n-type region.

The low-resistance region 108*n* of the semiconductor layer 108 is a region containing an impurity element. Examples of the impurity element include hydrogen, boron, carbon, nitrogen, fluorine, phosphorus, sulfur, arsenic, aluminum, and a rare gas. Note that typical examples of a rare gas include helium, neon, argon, krypton, and xenon. In particular, boron or phosphorus is preferably contained. Alternatively, two or more of these elements may be contained.

The insulating layer 110 includes a region in contact with the channel formation region of the semiconductor layer 108, i.e., a region overlapping with the conductive layer 112. The insulating layer 110 further includes a region that is in contact with the low-resistance region 108*n* of the semiconductor layer 108 and does not overlap with the conductive layer 112.

In addition, for each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, heat treatment or the like in the manufacturing process of the transistor 100 can supply oxygen released from the insulating layer 103 and the insulating layer 110 to the channel formation region of the semiconductor layer 108 to reduce oxygen vacancies in the semiconductor layer 108.

Figure 2:
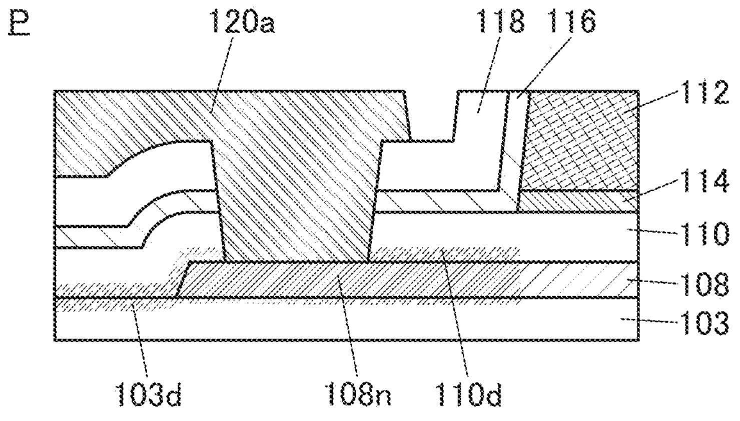
FIG. 2 A structure example of a transistor.

FIG. 2 shows an enlarged cross-sectional view of a region P surrounded by a dashed-dotted line in FIG. 1(B).

The insulating layer 110 includes a region 110*d* that contains the impurity element. The region 110*d* is positioned at least in the vicinity of an interface with the low-resistance region 108*n*. In addition, the region 110*d* is not provided with the semiconductor layer 108 and is also positioned at least in the vicinity of an interface with the insulating layer 103 in a region not overlapping with the insulating layer 112. Furthermore, it is preferable that the region 110*d* not be provided in a portion that is in contact with the channel formation region of the semiconductor layer 108, as illustrated in FIG. 1(B), FIG. 1(C), and FIG. 2.

In addition, the insulating layer 103 includes a region 103*d* containing the impurity element in the vicinity of an interface in contact with the insulating layer 110. Furthermore, as illustrated in FIG. 2, the region 103*d* may also be provided in the vicinity of an interface in contact with the region 108*n*. In that case, a portion overlapping with the region 108*n* has a lower impurity concentration than a portion in contact with the insulating layer 110.

Here, the region 108*n* preferably has a concentration gradient such that the impurity concentration is higher in a portion closer to the insulating layer 110. In that case, an upper portion of the region 108*n* has lower resistance, and thus contact resistance with the conductive layer 120*a* (or the conductive layer 120*b*) can be more effectively reduced. In addition, the total amount of the impurity element in the region 108*n* can be smaller than that in the case where the concentration is uniform throughout the entire region 108*n*; thus, the amount of the impurity that might be diffused into the channel formation region owing to the influence of heat applied during the manufacturing process, or the like can be kept small.

In addition, the region 110*d* preferably has a concentration gradient such that the impurity concentration is higher in a portion closer to the semiconductor layer 108. In the insulating layer 110 to which an oxide film from which oxygen can be released by heating is applied, release of oxygen in the region 110*d* to which the impurity element is added can be reduced as compared to that in the other regions. Thus, the region 110*d* that is positioned in the vicinity of an interface with the region 108*n* in the insulating layer 110 can function as a blocking layer against oxygen and can effectively reduce oxygen supplied to the region 108*n*.

As described later, treatment for adding the impurity element to the region 108*n* and the region 110*d* can be performed using the conductive layer 112 as a mask. Accordingly, the region 110*d* can be formed in a self-aligned manner at the same time as formation of the region 108*n*.

Note that in FIG. 2 and the like, to show that a high-impurity-concentration portion of the insulating layer 110 is positioned in the vicinity of an interface with the semiconductor layer 108 in an exaggerated way, the region 110*d* is illustrated with a hatch pattern only in the vicinity of the semiconductor layer 108 in the insulating layer 110; however, the impurity element can be actually contained in the entire insulating layer 110 in a thickness direction.

The region 108*n* and the region 110*d* each preferably include a region whose impurity concentration is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$. In addition, the region 108*n* preferably includes a portion having a higher impurity concentration than the region 110*d* of the insulating layer 110 because the electrical resistance of the region 108*n* can be further effectively reduced.

The concentrations of the impurities contained in the region 108*n* and the region 110*d* can be analyzed by an analysis method such as secondary ion mass spectrometry (SIMS) or X-ray photoelectron spectroscopy (XPS), for example. In the case of using XPS analysis, it is possible to find out concentration distribution in a depth direction by the combination of XPS analysis and ion sputtering from a front surface side or a rear surface side.

In addition, the impurity element preferably exists in an oxidized state in the region 108*n*. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 108 to be oxidized, the element can be inhibited from being released even when a high temperature (e.g., higher than or equal to 400° C., higher than or equal to 600° C., or higher than or equal to 800° C.) is applied in a later step. Furthermore, the impurity element takes oxygen in the semiconductor layer 108 away, and many oxygen vacancies are generated in the region 108*n*. The oxygen vacancies are bonded to hydrogen in a film to serve as carrier supply sources; thus, the region 108*n* is in an extremely low-resistance state.

Note that an increase in resistance might be caused if much oxygen is supplied from the outside or a film near the region 108*n* to the region 108*n* at the time of performing high-temperature treatment in a later step. Thus, in the case where high-temperature treatment is performed, the treatment is preferably performed with the region 108*n* covered with the insulating layer 116 that has a high barrier property against oxygen.

In addition, the impurity element preferably exists in an oxidized state also in the region 110*d*. Since such an element that is easily oxidized can exist stably in a state of being bonded to oxygen in the insulating layer 110 to be oxidized, the element can be inhibited from being released even when a high temperature is applied in a later step. Furthermore, particularly in the case where oxygen (also referred to as excess oxygen) that might be released by heating is contained in the insulating layer 110, excess oxygen and the impurity element are bonded to each other and stabilized, so that oxygen can be inhibited from being supplied from the region 110*d* to the region 108*n*. Moreover, oxygen is less likely to be diffused into the region 110*d* containing the impurity element in the oxidized state, so that oxygen can also be prevented from being supplied from a portion above the region 110*d* to the region 108*n* through the region 110*d*.

For example, in the case where boron is used as the impurity element, boron contained in the 1 region 108*n* and the region 110*d* can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement lower limit.

Each of the insulating layer 116 and the insulating layer 118 functions as a protective layer protecting the transistor 100. In addition, either the insulating layer 116 or the insulating layer 118 preferably has a function of preventing diffusion of oxygen that might be released from the insulating layer 110 to the outside. For example, an inorganic insulating material such as an oxide or a nitride can be used. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used.

Note that although the case where a stacked-layer structure of the insulating layer 116 and the insulating layer 118 is employed as the protective layer is described here, either the insulating layer 116 or the insulating layer 118 is not necessarily provided when not needed.

Here, the semiconductor layer 108 and oxygen vacancies that might be formed in the semiconductor layer 108 will be described.

Oxygen vacancies formed in the semiconductor layer 108 adversely affect the transistor characteristics and therefore cause a problem. For example, when an oxygen vacancy is formed in the semiconductor layer 108, the oxygen vacancy might be bonded to hydrogen to serve as a carrier supply source. The carrier supply source generated in the semiconductor layer 108 causes a change in the electrical characteristics, typically, a shift in the threshold voltage, of the transistor 100. Therefore, it is preferable that the amount of oxygen vacancies in the semiconductor layer 108 be as small as possible.

In view of this, one embodiment of the present invention has a structure in which insulating films in the vicinity of the semiconductor layer 108, specifically, the insulating layer 110 positioned above the semiconductor layer 108 and the insulating layer 103 positioned below the semiconductor layer 108 each include an oxide film. When oxygen is moved from the insulating layer 103 and the insulating layer 110 to the semiconductor layer 108 by heat during the manufacturing process or the like, the amount of oxygen vacancies in the semiconductor layer 108 can be reduced.

In addition, the semiconductor layer 108 preferably includes a region where the atomic proportion of In is higher than the atomic proportion of M. A higher atomic proportion of In results in higher field-effect mobility of the transistor.

Here, in the case of a metal oxide containing In, Ga, and Zn, bonding strength between In and oxygen is weaker than bonding strength between Ga and oxygen; thus, with a higher atomic proportion of In, oxygen vacancies are likely to be generated in the metal oxide film. There is a similar tendency even when a metal element shown above as M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied into the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher the atomic proportion of M can be suitably used.

It is particularly preferable that the atomic ratio of In, M, and Zn in the semiconductor layer 108 be In:M:Zn=5:1:6 or in the neighborhood thereof (M be greater than or equal to 0.5 and less than or equal to 1.5 and Zn be greater than or equal to 5 and less than or equal to 7 when In is 5). Alternatively, the atomic ratio of In, M, and Zn is preferably In:M:Zn=4:2:3 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the transistor with high field-effect mobility in a gate driver that generates a gate signal, a display device with small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 be as small as possible. It is preferable to use a metal oxide film in which the impurity concentration is low and the density of defect states is low because a transistor having excellent electrical characteristics can be manufactured. By reducing the impurity concentration and reducing the density of defect states (reducing oxygen vacancies), the carrier density in the film can be reduced. A transistor using such a metal oxide film for a semiconductor layer rarely has electrical characteristics with a negative threshold voltage (also referred to as normally-on). Furthermore, a transistor using such a metal oxide film can have characteristics of an extremely low off-state current.

In addition, the semiconductor layer 108 may have a stacked-layer structure of two or more layers.

For example, the semiconductor layer 108 in which two or more metal oxide films with different compositions are stacked can be used. For instance, in the case of using an In-M-Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

Alternatively, the semiconductor layer 108 in which two or more metal oxide films with different crystallinities are stacked can be used. In that case, the metal oxide films are preferably successively formed without exposure to the air using the same oxide target under different deposition conditions.

For example, the oxygen flow rate ratio at the time of depositing an earlier-formed first metal oxide film is set lower than that at the time of depositing a subsequently formed second metal oxide film. Alternatively, a condition without oxygen flowing is employed at the time of depositing the first metal oxide film. In such a manner, oxygen can be effectively supplied at the time of depositing the second metal oxide film. In addition, the first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

More specifically, the oxygen flow rate ratio at the time of depositing the first metal oxide film is higher than or equal to 0% and lower than 50%, preferably higher than or equal to 0% and lower than or equal to 30%, further preferably higher than or equal to 0% and lower than or equal to 20%, typically 10%. In addition, the oxygen flow rate ratio at the time of depositing the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although the conditions at the time of the deposition, such as pressure, temperature, and power may, vary between the first metal oxide film and the second metal oxide film, it is preferable to employ the same conditions except for the oxygen flow rate ratio because the time required for deposition steps can be shortened.

With such a structure, the transistor 100 with excellent electrical characteristics and high reliability can be achieved.

The above is the description of Structure Example 1.

Structure Example 2

A structure example of a transistor whose structure is partly different from that of Structure Example 1 will be described below. Note that description of the same portions as those in Structure Example 1 is omitted below in some cases. Furthermore, in drawings that are referred to later, the same hatching pattern is applied to portions having functions similar to those in Structure Example 1, and the portions are not denoted by reference numerals in some cases.

Figure 3A:
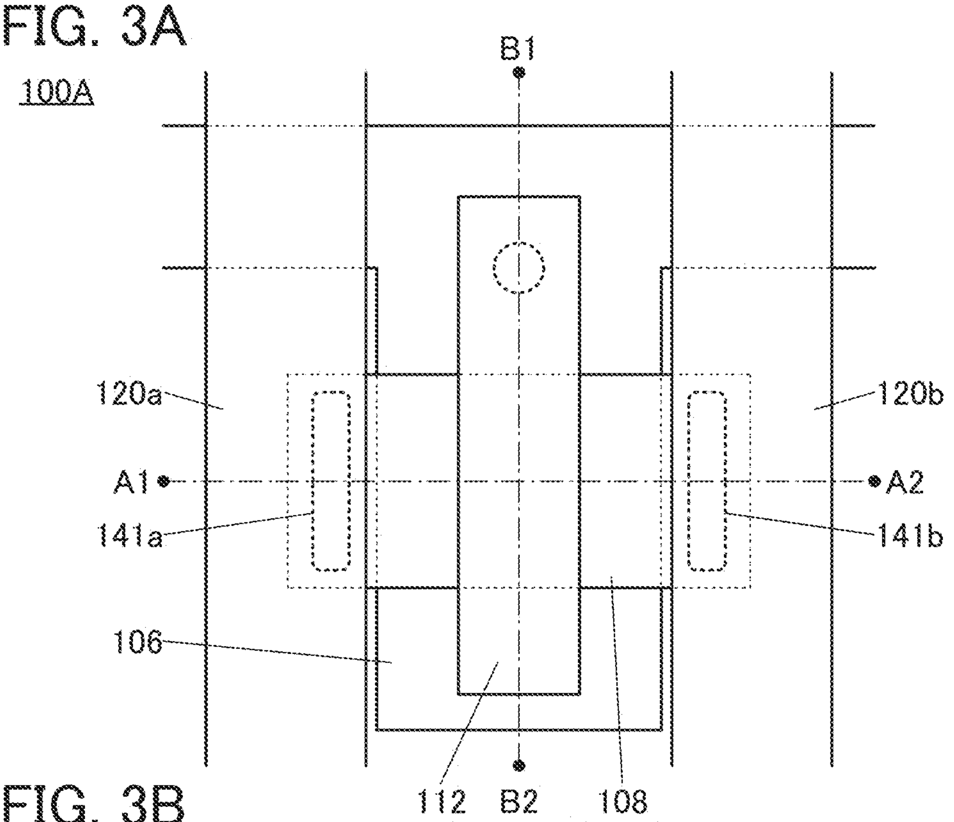
FIGS. 3A to 3C A structure example of a transistor.
Figure 3B:
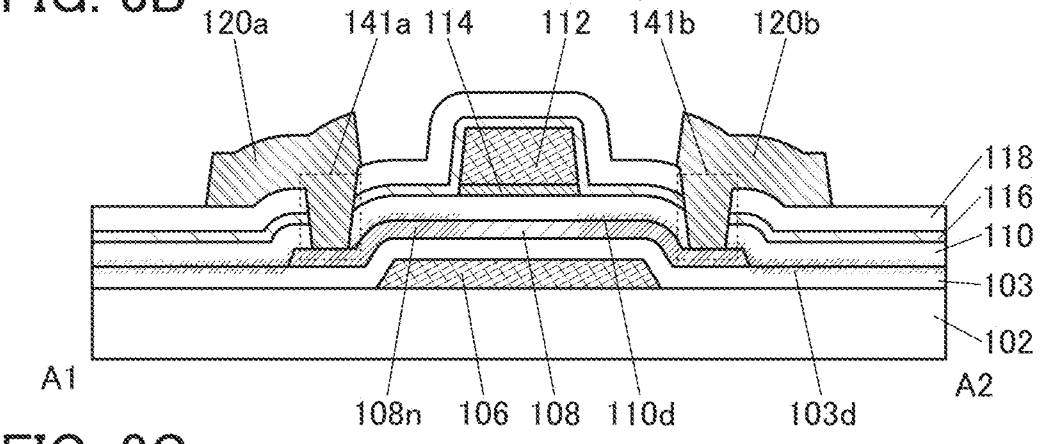
Figure 3C:
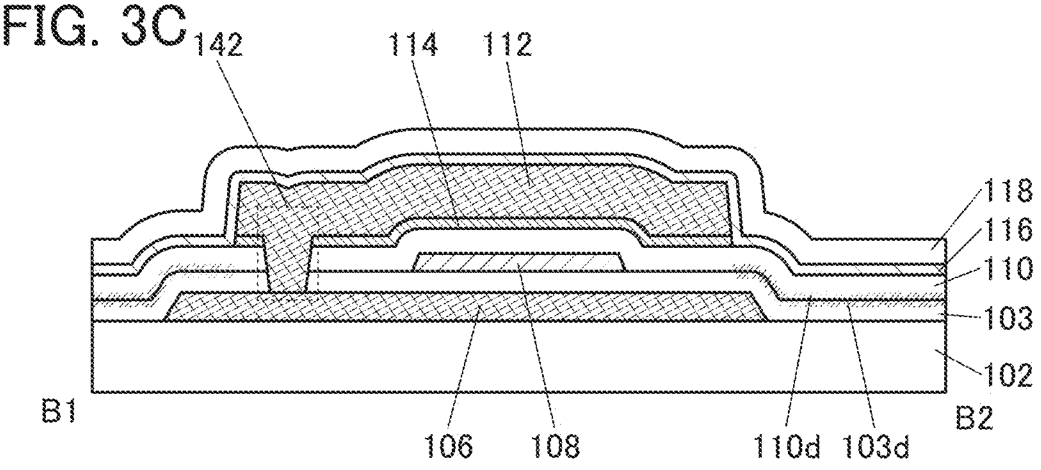

FIG. 3(A) is a top view of a transistor 100A. FIG. 3(B) is a cross-sectional view of the transistor 100A in a channel length direction. FIG. 3(C) is a cross-sectional view of the transistor 100A in a channel width direction.

The transistor 100A is different from Structure Example 1 mainly in including a conductive layer 106 between the substrate 102 and the insulating layer 103. The conductive layer 106 includes a region overlapping with the semiconductor layer 108 and the conductive layer 112.

In the transistor 100A, the conductive layer 106 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 will be sometimes referred to as a channel formation region in the following description; however, a channel can also be actually formed in a portion not overlapping with the conductive layer 112 and overlapping with the conductive layer 106 (a portion including the region 108*n*).

In addition, as illustrated in FIG. 3(C), the conductive layer 106 may be electrically connected to the conductive layer 112 through an opening portion 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120*a*, or the conductive layer 120*b* can be used. In particular, a material containing copper is preferably used for the conductive layer 106 because wiring resistance can be reduced.

In addition, as illustrated in FIGS. 3(A) and 3(C), the conductive layer 112 and the conductive layer 106 preferably extend beyond an end portion of the semiconductor layer 108 in the channel width direction. In that case, as illustrated in FIG. 3(C), a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 106 and the conductive layer 112. In that case, electric fields for inducing a channel can be effectively applied to the semiconductor layer 108, so that the on-state current of the transistor 100A can be increased. Thus, the transistor 100A can also be miniaturized.

Note that a structure in which the conductive layer 112 and the conductive layer 106 are not connected to each other may be employed. In that case, a constant potential may be applied to one of the pair of gate electrodes, and a signal for driving the transistor 100A may be applied to the other of the pair of gate electrodes. In this case, the potential applied to one of the electrodes can control the threshold voltage at the time of driving the transistor 100A with the other electrode.

The above is the description of Structure Example 2.

Application Example

Examples where a semiconductor film containing an impurity is used as one electrode of a capacitor and a transistor and the capacitor are formed on the same plane will be described below.

Figure 4A:
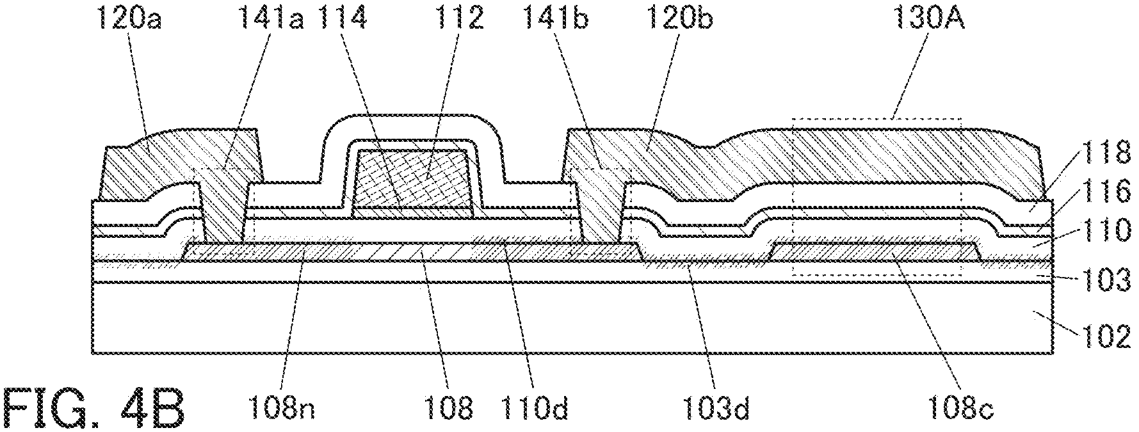
FIGS. 4A to 4C A structure example of a transistor.

In a cross-sectional view illustrated in FIG. 4(A), a capacitor 130A is provided next to the transistor 100 illustrated in Structure Example 1.

Figure 4B:
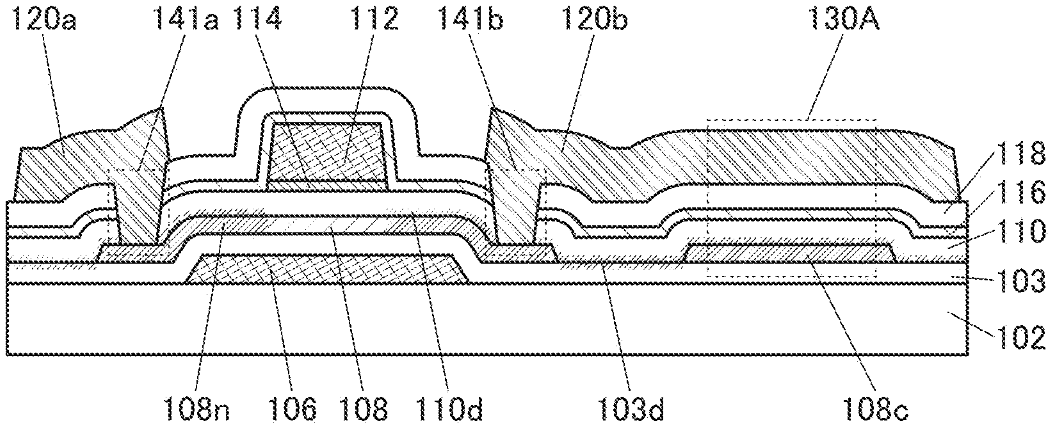

In addition, in a cross-sectional view illustrated in FIG. 4(B), the capacitor 130A is provided next to the transistor 100A illustrated in Structure Example 2.

The capacitor 130A has a structure in which the insulating layer 110, the insulating layer 116, and the insulating layer 118 that serve as a dielectric are provided between a semiconductor layer 108*c* and the conductive layer 120*b*.

The semiconductor layer 108*c* is provided on the same plane as the semiconductor layer 108. For example, the semiconductor layer 108*c* can be formed in such a manner that the same metal oxide film as that for the semiconductor layer 108 is processed and the same impurity element as that for the region 108*n* is then added.

With such a structure, the capacitor 130A can be manufactured without an increase in the number of steps.

Figure 4C:
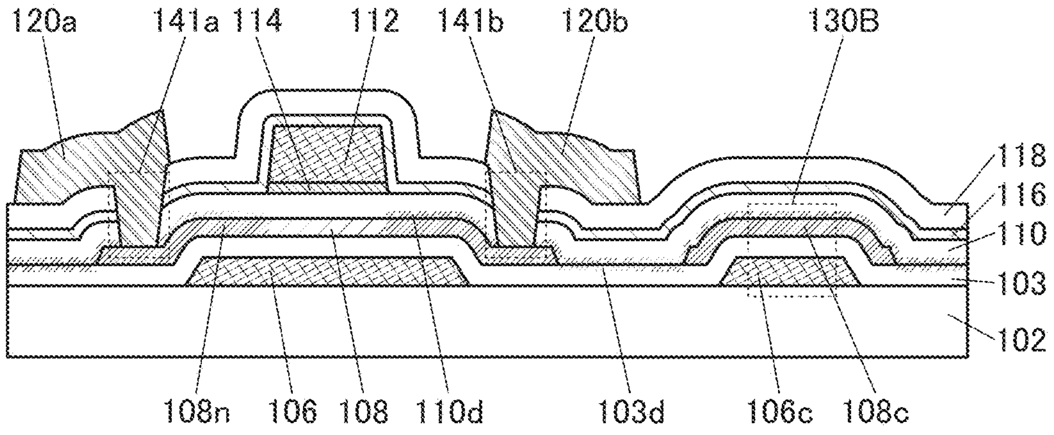

A capacitor 130B illustrated in FIG. 4(C) has a structure in which the insulating layer 103 serving as a dielectric is provided between a conductive layer 106*c* and the semiconductor layer 108*c*.

The conductive layer 106*c* is provided on the same plane as the conductive layer 106. The conductive layer 106*c* can be formed by processing the same conductive film as that for the conductive layer 106.

The capacitor 130B can have a thinner dielectric than the capacitor 130A and thus can have higher capacitance.

The above is the description of the application example.

[Components of Semiconductor Device]

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, these substrates provided with semiconductor elements may be used as the substrate 102.

Alternatively, a flexible substrate may be used as the substrate 102, and the transistor 100 or the like may be formed directly on the flexible substrate. Alternatively, a separation layer may be provided between the substrate 102 and the transistor 100 or the like. The separation layer can be used in separating a semiconductor device from the substrate 102 after partly or wholly completing the semiconductor device over the separation layer, and in transferring the separated semiconductor device to another substrate. In such a case, the transistor 100 or the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. In addition, for example, the insulating layer 103 can be formed to have a single layer or stacked layer of an oxide insulating film or a nitride insulating film. Note that to improve the properties of the interface with the semiconductor layer 108, at least a region in the insulating layer 103 that is in contact with the semiconductor layer 108 is preferably formed using an oxide insulating film. Furthermore, a film from which oxygen is released by heating is preferably used for the insulating layer 103.

For example, the insulating layer 103 can be provided to have a single layer or stacked layers using silicon oxide, silicon oxynitride, silicon nitride oxide, silicon nitride, aluminum oxide, hafnium oxide, gallium oxide, a Ga—Zn oxide, or the like.

In addition, in the case where a film other than an oxide film, such as a silicon nitride film, is used for a side of the insulating layer 103 that is in contact with the semiconductor layer 108, pretreatment such as oxygen plasma treatment is preferably performed on a surface in contact with the semiconductor layer 108 to oxidize the surface or the vicinity of the surface.

[Conductive Film]

The conductive layer 112 and the conductive layer 106 that function as the gate electrode, the conductive layer 120*a* that functions as the source electrode, and the conductive layer 120*b* that functions as the drain electrode can each be formed using a metal element selected from chromium, copper, aluminum, gold, silver, zinc, molybdenum, tantalum, titanium, tungsten, manganese, nickel, iron, and cobalt; an alloy containing the metal element as its component; an alloy including a combination of the metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be applied to each of the conductive layer 112, the conductive layer 106, the conductive layer 120*a*, and the conductive layer 120*b*.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of a conductive film containing a metal or an alloy can reduce wiring resistance. In that case, a conductive film containing an oxide conductor is preferably applied to a conductive film on a side in contact with an insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120*a*, and the conductive layer 120*b*. It is particularly preferable to use a tantalum nitride film. The tantalum nitride film has conductivity, has a high barrier property against copper, oxygen, or hydrogen, and releases little hydrogen from itself; thus, the tantalum nitride film can be suitably used as a conductive film that is in contact with the semiconductor layer 108 or a conductive film that is in the vicinity of the semiconductor layer 108.

[Insulating Layer 110]

The insulating layer 110 functioning as a gate insulating film of the transistor 100 or the like can be formed by a PECVD method, a sputtering method, or the like. For the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

In addition, the insulating layer 110 that is in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For the insulating layer 110, a material having a higher relative permittivity than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher relative permittivity than amorphous hafnium oxide.

[Semiconductor Layer]

In the case where the semiconductor layer 108 is an In-M-Zn oxide, a sputtering target used for depositing the In-M-Zn oxide preferably has the atomic proportion of In higher than or equal to the atomic proportion of M. Examples of the atomic ratio of metal elements in such a sputtering target includes In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, and In:M:Zn=5:2:5.

In addition, a target containing a polycrystalline oxide is preferably used as the sputtering target, which facilitates formation of the semiconductor layer 108 having crystallinity. Note that the atomic ratio in the semiconductor layer 108 to be deposited varies within the range of ±40% from the atomic ratio of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is in the neighborhood of In:Ga:Zn=4:2:3 [atomic ratio] in some cases.

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

In addition, the energy gap of the semiconductor layer 108 is greater than or equal to 2 eV, preferably greater than or equal to 2.5 eV. With the use of such a metal oxide having a wider energy gap than silicon, the off-state current of the transistor can be reduced.

Furthermore, the semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals each have c-axis alignment in a particular direction, the nanocrystals each have neither a-axis alignment nor b-axis alignment, and the nanocrystals have continuous crystal connection in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an $InGaZnO_4$ crystal having a $YbFe_2O_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

An example of a crystal structure of a metal oxide is described. Note that a metal oxide deposited by a sputtering method using an In—Ga—Zn oxide target (In:Ga:Zn=4:2:4.1 [atomic ratio]) is described below as an example. A metal oxide that is deposited by a sputtering method using the target at a substrate temperature higher than or equal to 100° C. and lower than or equal to 130° C. is likely to have either an nc (nano crystal) structure or the CAAC structure, or a structure in which both structures are mixed. In contrast, a metal oxide formed by a sputtering method at a substrate temperature set at room temperature (R.T.) is likely to have the nc structure. Note that room temperature (R.T.) here also includes a temperature when a substrate is not heated intentionally.

Manufacturing Method Example

A manufacturing method example of a transistor in one embodiment of the present invention will be described below. Here, description will be made giving, as an example, the transistor 100A illustrated in Structure Example 2.

Note that thin films (insulating films, semiconductor films, conductive films, and the like) that constitute the semiconductor device can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

Alternatively, the thin films (the insulating films, the semiconductor films, the conductive films, and the like) that constitute the semiconductor device can be formed by a method such as spin coating, dipping, spray coating, ink-jetting, dispensing, screen printing, offset printing, a doctor knife, slit coating, roll coating, curtain coating, or knife coating.

In addition, when the thin films that constitute the semiconductor device are processed, a photolithography method or the like can be used for the processing. Alternatively, the thin films may be processed by a nanoimprinting method, a sandblasting method, a lift-off method, or the like. Alternatively, island-shaped thin films may be directly formed by a deposition method using a blocking mask such as a metal mask.

There are the following two typical ways of a photolithography method. One is a method in which a resist mask is formed over a thin film that is to be processed, the thin film is processed by etching or the like, and the resist mask is removed. The other is a method in which, after a photosensitive thin film is deposited, exposure and development are performed to process the thin film into a desired shape.

As light for exposure in a photolithography method, for example, an i-line (with a wavelength of 365 nm), a g-line (with a wavelength of 436 nm), an h-line (with a wavelength of 405 nm), or light in which the i-line, the g-line, and the h-line are mixed can be used. Alternatively, ultraviolet light, KrF laser light, ArF laser light, or the like can be used. In addition, exposure may be performed by liquid immersion exposure technique. Furthermore, as the light for the exposure, extreme ultra-violet light (EUV: Extreme Ultra-violet) or X-rays may be used. Moreover, instead of the light for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is unnecessary.

For etching of the thin films, a dry etching method, a wet etching method, a sandblasting method, or the like can be used.

In each of drawings shown in FIG. 5 and FIG. 6, cross sections of the transistor 100A in the channel length direction and in the channel width direction in each step in the manufacturing process are shown side by side.

[Formation of Conductive Layer 106]

A conductive film is deposited over the substrate 102 and processed by etching to form the conductive layer 106 functioning as a gate electrode.

[Formation of Insulating Layer 103]

Figure 5A:
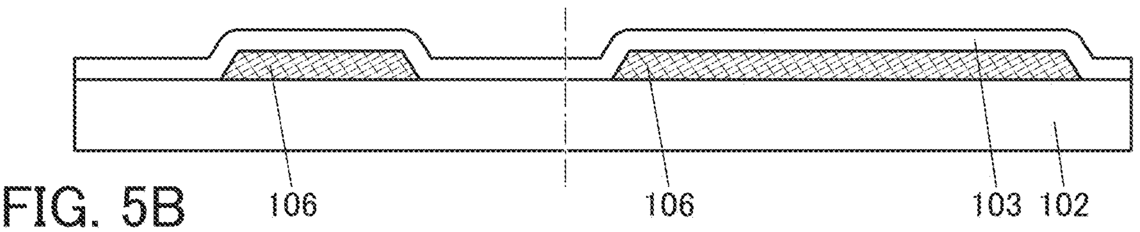
FIGS. 5A to 5E Diagrams illustrating a method for manufacturing a transistor.

Then, the insulating layer 103 is formed to cover the substrate 102 and the conductive layer 106 (FIG. 5(A)). The insulating layer 103 can be formed by a PECVD method, an ALD method, a sputtering method, or the like.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

[Formation of Semiconductor Layer 108]

Figure 5B:
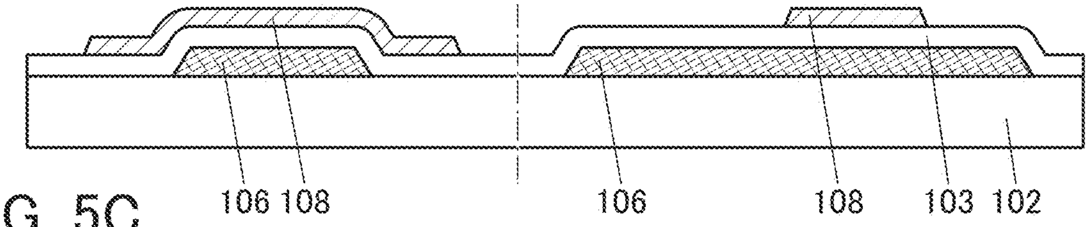
Figure 5C:
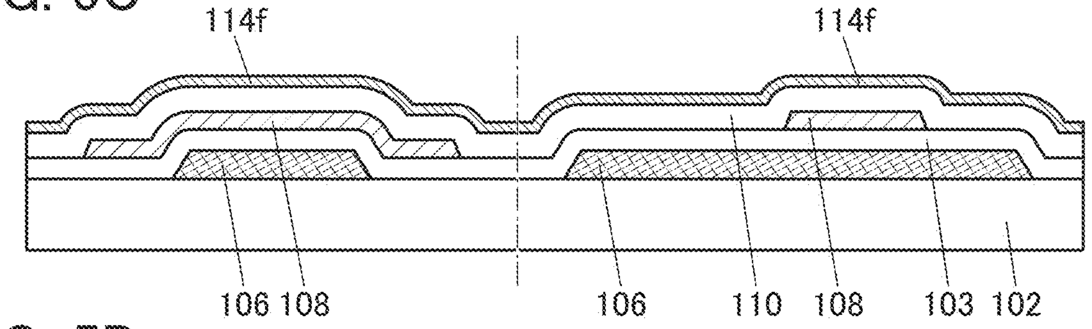

Next, a metal oxide film is deposited over the insulating layer 103 and processed to form the island-shaped semiconductor layer 108 (FIG. 5(B)).

The metal oxide film is preferably formed by a sputtering method using a metal oxide target.

In addition, in depositing the metal oxide film, an inert gas (such as a helium gas, an argon gas, or a xenon gas) may be mixed in addition to an oxygen gas. Note that when the proportion of the oxygen gas in the whole deposition gas (hereinafter also referred to as an oxygen flow rate ratio) at the time of depositing the metal oxide film is higher, the crystallinity of the metal oxide film can be higher and a transistor with high reliability can be achieved. In contrast, when the oxygen flow rate ratio is lower, the crystallinity of the metal oxide film is lower and a transistor with a high on-state current can be obtained.

In addition, as deposition conditions of the metal oxide film, the substrate temperature is higher than or equal to room temperature and lower than or equal to 200° C., and the substrate temperature is preferably higher than or equal to room temperature and lower than or equal to 140° C. F or example, when the substrate temperature is higher than or equal to room temperature and lower than 140° C., high productivity is achieved, which is preferable. Furthermore, when the metal oxide film is deposited with the substrate temperature set at room temperature or without intentional heating, the crystallinity can be made low.

In addition, it is preferable to perform treatment for desorbing water, hydrogen, an organic substance, or the like adsorbed onto a surface of the insulating layer 103 or treatment for supplying oxygen into the insulating layer 103 before deposition of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. In addition, when plasma treatment is performed in an atmosphere containing a nitric oxide gas, an organic substance on the surface of the insulating layer 103 can be suitably removed. After such treatment, the metal oxide film is preferably deposited successively without exposure of the surface of the insulating layer 103 to the air.

For processing of the metal oxide film, either one or both a wet etching method and a dry etching method is used. At this time, part of the insulating layer 103 that does not overlap with the semiconductor layer 108 is etched and thinned in some cases.

In addition, after the metal oxide film is deposited or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Note that it is preferable that the atmosphere of the heat treatment not contain hydrogen, water, or the like. An electric furnace, an RTA apparatus, or the like can be used for the heat treatment. The use of an RTA apparatus can shorten the heat treatment time.

[Formation of Insulating Layer 110 and Metal Oxide Film **114*f***]

Next, a stack of the insulating layer 110 and a metal oxide film **114*f* is deposited to cover the insulating layer 103 and the semiconductor layer 108 (FIG. 5**(C)).

As the insulating layer 110, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating layer 110 may be formed by a PECVD method using a microwave.

The metal oxide film **114*f* is preferably deposited in an oxygen-containing atmosphere, for example. It is particularly preferable that the metal oxide film 114*f* be formed by a sputtering method in an oxygen-containing atmosphere. In that case, oxygen can be supplied to the insulating layer 110 at the time of deposition of the metal oxide film 114*f***.

In the case where the metal oxide film **114*f* is formed by a sputtering method using an oxide target containing a metal oxide similar to that in the case of the semiconductor layer 108**, the above method can be referred to.

For example, as deposition conditions of the metal oxide film **114*f***, a metal oxide film may be formed by a reactive sputtering method with a metal target using oxygen as a deposition gas. When aluminum is used for the metal target, for example, an aluminum oxide film can be deposited.

At the time of depositing the metal oxide film **114*f*, the amount of oxygen supplied into the insulating layer 110** can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio be 100% and the oxygen partial pressure be as close to 100% as possible.

When the metal oxide film **114*f* is formed by a sputtering method in an oxygen-containing atmosphere in this manner, oxygen can be supplied to the insulating layer 110 and release of oxygen from the insulating layer 110 can be prevented during the deposition of the metal oxide film 114*f*. As a result, an extremely large amount of oxygen can be enclosed in the insulating layer 110. Moreover, a large amount of oxygen can be supplied to the semiconductor layer 108 by heat treatment performed later. Consequently, the amount of oxygen vacancies in the semiconductor layer 108** can be reduced and a highly reliable transistor can be achieved.

In addition, oxygen may be supplied from the insulating layer 110 to the semiconductor layer 108 by heat treatment performed after the formation of the metal oxide film **114*f***. The heat treatment can be performed at a temperature higher than or equal to 200° C. and lower than or equal to 400° C. in an atmosphere containing one or more of nitrogen, oxygen, and a rare gas.

Then, after the deposition of the metal oxide film **114*f*, the metal oxide film 114*f*, the insulating layer 110, and the insulating layer 103 are partly etched to form an opening reaching the conductive layer 106. Accordingly, the conductive layer 112 to be formed later can be electrically connected to the conductive layer 106** through the opening.

[Formation of Conductive Layer 112 and Metal Oxide Layer 114]

Figure 5D:
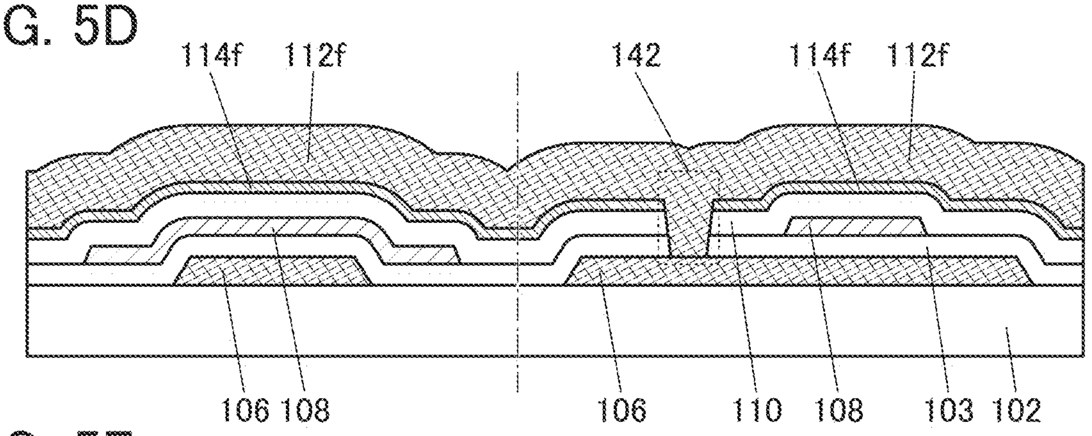

Next, a conductive film **112*f* to be the conductive layer 112 is deposited over the metal oxide film 114*f* (FIG. 5(D)). The conductive film 112*f*** is preferably deposited by a sputtering method using a sputtering target of a metal or an alloy.

Figure 5E:
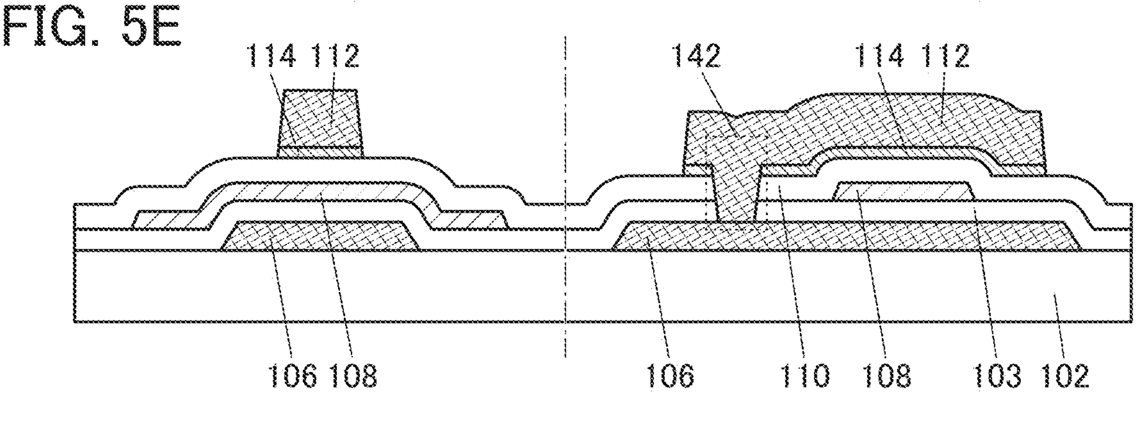

Next, the conductive film **112*f* and the metal oxide film 114*f* are partly etched to form the conductive layer 112 and the metal oxide layer 114 (FIG. 5(E)). The conductive film 112*f* and the metal oxide film 114*f* are preferably processed using the same resist mask. Alternatively, the metal oxide film 114*f* may be etched using the conductive layer 112** after etching as a hard mask.

In such a manner, the conductive layer 112 and the metal oxide layer 114 that have substantially the same top surface shapes can be formed.

When the insulating layer 110 is not etched and covers the top surface and the side surface of the semiconductor layer 108 and the insulating layer 103 in this manner, it is possible to prevent the semiconductor layer 108 and the insulating layer 103 from being partly etched and thinned in etching the conductive layer 112 or the like.

[Treatment for Supplying Impurity Element]

Figure 6A:
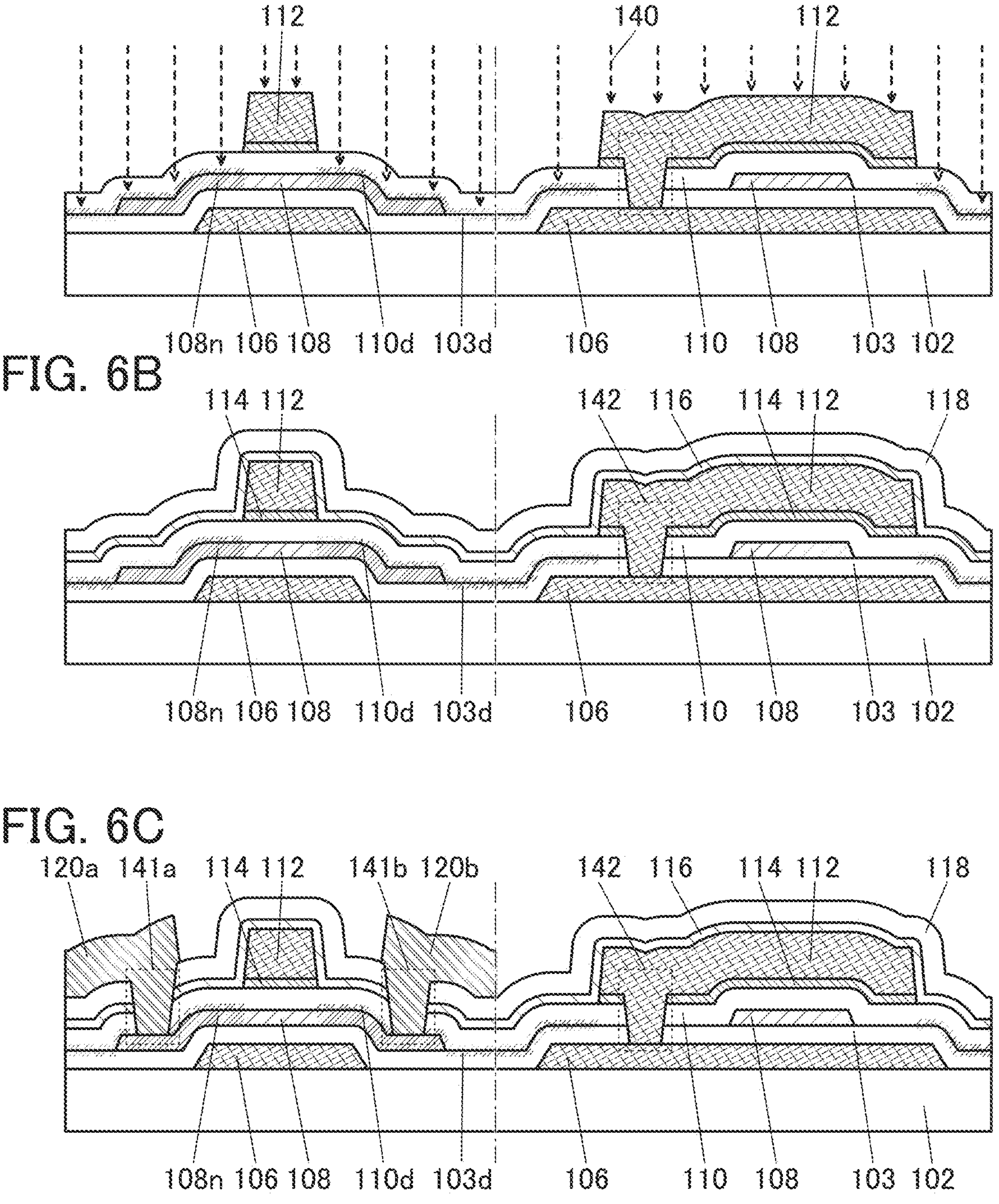

Next, treatment for supplying (also referred to as "adding" or "implanting") an impurity element 140 to the insulating layer 110 and the semiconductor layer 108 is performed using the conductive layer 112 as a mask to form the region **108*n*, the region 110*d*, and the region 103*d* (FIG. 6(A)). In the semiconductor layer 108 and the insulating layer 110, regions overlapping with the conductive layer 112 are not supplied with the impurity element 140 owing to the conductive layer 112** serving as the mask.

A plasma ion doping method or an ion implantation method can be suitably used for the supply of the impurity element 140. In these methods, a concentration profile in a depth direction can be controlled with high accuracy by the acceleration voltage and dosage of ions, or the like. The use of a plasma ion doping method can increase productivity. In addition, the use of an ion implantation method with mass separation can increase the purity of an impurity element to be supplied.

In the treatment for supplying the impurity element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the impurity element 140 at an optimal concentration can be supplied to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. It is particularly preferable to use boron, phosphorus, aluminum, magnesium, or silicon.

As a source gas of the impurity element 140, a gas containing the impurity element can be used. In the case where boron is supplied, typically, a $B_2H_6$ gas, a $BF_3$ gas, or the like can be used. In addition, in the case where phosphorus is supplied, typically, a $PH_3$ gas can be used. Alternatively, a mixed gas in which these source gases are diluted with a rare gas may be used.

Alternatively, $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, or the like can be used as the source gas. In addition, an ion source is not limited to a gas, and a solid or a liquid that is vaporized by heating may be used.

Addition of the impurity element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, within the range of higher than or equal to 5 kV to lower than or equal to 100 kV, preferably higher than or equal to 7 kV to lower than or equal to 70 kV, further preferably higher than or equal to 10 kV to lower than or equal to 50 kV. In addition, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

In addition, in the case where a phosphorus ion is added by an ion implantation method or a plasma ion doping method, the acceleration voltage can be, for example, within the range of higher than or equal to 10 kV to lower than or equal to 100 kV, preferably higher than or equal to 30 kV to lower than or equal to 90 kV, further preferably higher than or equal to 40 kV to lower than or equal to 80 kV. Furthermore, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

Note that a method for supplying the impurity element 140 is not limited thereto; plasma treatment, treatment using thermal diffusion by heating, or the like may be used, for example. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

In one embodiment of the present invention, the impurity element 140 can be supplied to the semiconductor layer 108 through the insulating layer 110. Thus, even in the case where the semiconductor layer 108 has crystallinity, degradation of crystallinity can be suppressed at the time of supplying the impurity element 140. Therefore, this is particularly suitable for the case where a reduction in crystallinity increases electrical resistance.

[Formation of Insulating Layer 116 and Insulating Layer 118]

Next, the insulating layer 116 and the insulating layer 118 are sequentially formed (FIG. 6(B)).

In the case where the insulating layer 116 or the insulating layer 118 is formed by a plasma CVD method at a deposition temperature too high, impurities contained in the region **108*n* and the like might be diffused into a peripheral portion including the channel formation region of the semiconductor layer 108 or might increase the electrical resistance of the region 108*n*. The deposition temperature of the insulating layer 116 or the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Deposition of the insulating layer 116 or the insulating layer 118** at low temperatures enables the transistor to have favorable electrical characteristics even when the transistor has a short channel length.

[Heat Treatment]

After the formation of the insulating layer 116 or the insulating layer 118, heat treatment is performed. It is preferable that the heat treatment be performed at a temperature higher than or equal to 150° C. and lower than or equal to 450° C., preferably higher than or equal to 200° C. and lower than or equal to 400° C. in an atmosphere containing one or more of nitrogen, oxygen, and a rare gas. The region 108*n* that has low resistance more stably can be formed by the heat treatment. For example, by the heat treatment at the above temperature, the impurity element 140 is diffused moderately and the concentration of the impurity element 140 is homogenized locally, so that the region 108*n* and the region 110*d* each having an ideal concentration gradient of the impurity element can be formed. Note that when the temperature of the heat treatment is too high (e.g., higher than or equal to 500° C.), the impurity element 140 is also diffused into the channel formation region, so that the electrical characteristics or reliability of the transistor might be degraded.

In addition, when the impurity element 140 is supplied to the region 108*n*, defects generated in the semiconductor layer 108 and the insulating layer 110 can be repaired by the heat 10) treatment in some cases.

Furthermore, oxygen can be supplied from the insulating layer 110 to the channel formation region of the semiconductor layer 108 by the heat treatment. In that case, the region 110*d* supplied with the impurity element 140 is formed in the insulating layer 110 in the vicinity of an interface between the insulating layer 110 and the region 108*n*; thus, oxygen released from the insulating layer 110 is inhibited from being diffused into the region 108*n*. As a result, the resistance of the region 108*n* can be effectively prevented from being increased again. Moreover, in this case, the region 110*d* is not formed in a region of the insulating layer 110 that overlaps with the channel formation region of the semiconductor layer 108; thus, oxygen released from the insulating layer 110 can be selectively supplied to the channel formation region.

In addition, the region 108*n* is in a state where a larger amount of oxygen vacancies than that in the channel formation region exist; thus, through the heat treatment, an effect of performing gettering of hydrogen contained in the channel formation region by the oxygen vacancies can be expected. Thus, a hydrogen concentration in the channel formation region can be reduced, so that a more reliable transistor can be achieved. Furthermore, hydrogen supplied from the channel formation region is bonded to the oxygen vacancy in the region 108*n* to serve as a carrier generation source, so that the region 108*n* that has much lower resistance can be achieved.

Note that although the heat treatment may be performed before the insulating layer 116 is formed, the heat treatment is further preferably performed after the insulating layer 116 or the insulating layer 118 is formed. For example, when an insulating film into which oxygen is less likely to be diffused is used for the insulating layer 116 or the insulating layer 118, oxygen released from the insulating layer 110 by the heat treatment can be prevented from being diffused into the outside, and the amount of oxygen that is to be supplied to the channel formation region of the semiconductor layer 108 can be increased.

[Formation of Opening Portion 141*a* and Opening Portion 141*b*]

Next, a mask is formed by lithography in a desired position on the insulating layer 118, and then the insulating layer 118, the insulating layer 116, and the insulating layer 110 are partly etched to form an opening portion 141*a* and an opening portion 141*b* reaching the regions 108*n*.

[Formation of Conductive Layer 120*a* and Conductive Layer 120*b*]

Next, a conductive film is deposited over the insulating layer 118 to cover the opening portion 141*a* and the opening portion 141*b*, and the conductive film is processed into a desired shape, so that the conductive layer 120*a* and the conductive layer 120*b* are formed (FIG. 6(C)).

Through the above process, the transistor 100A can be manufactured. In the case where the transistor 100A is applied to a pixel of a display device, for example, this process may be followed by a process for forming one or more of a protective insulating layer, a planarization layer, a pixel electrode, and a wiring.

The above is the description of the manufacturing method example.

At least part of the structure examples, the manufacturing method examples, the drawings corresponding thereto, and the like illustrated in this embodiment can be implemented in combination with the other structure examples, the other manufacturing method examples, the other drawings, and the like as appropriate.

At least part of this embodiment can be implemented in combination with the other embodiments described in this specification as appropriate.

Embodiment 2

In this embodiment, examples of a display device that includes the transistors illustrated in the above embodiment are described.

Structure Example

Figure 7A:
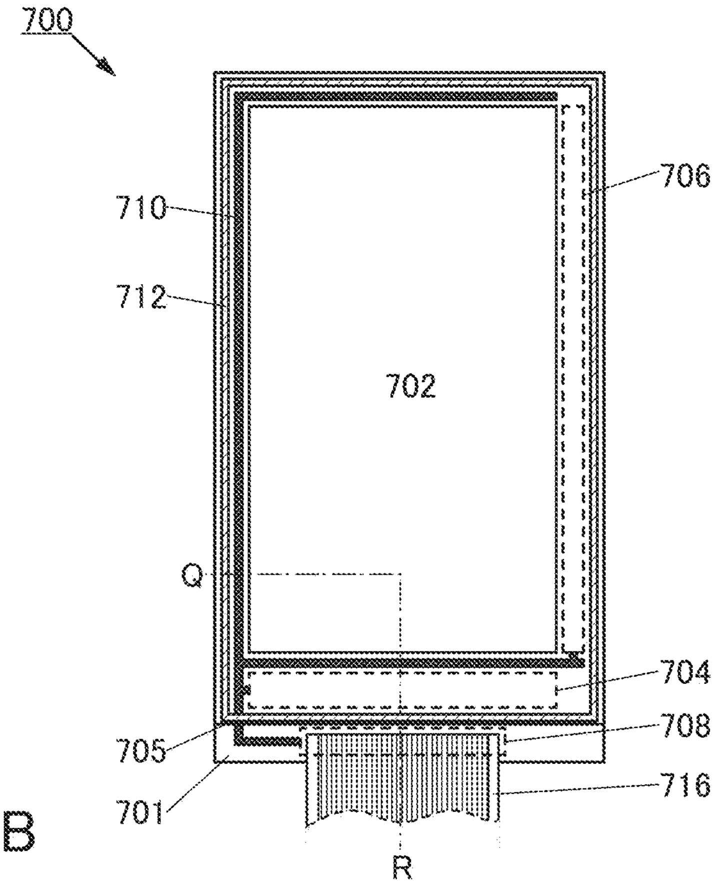

FIG. 7(A) shows a top view of a display device 700. The display device 700 includes a first substrate 701 and a second substrate 705 that are attached to each other with a sealant 712. In addition, over the first substrate 701, a pixel portion 702, a source driver circuit portion 704, and a gate driver circuit portion 706 are provided in a region sealed with the first substrate 701, the second substrate 705, and the sealant 712. Furthermore, a plurality of display elements are provided in the pixel portion 702.

In addition, a portion of the first substrate 701 that does not overlap with the second substrate 705 is provided with an FPC terminal portion 708 to which an FPC 716 (FPC: Flexible printed circuit) is connected. The pixel portion 702, the source driver circuit portion 704, and the gate driver circuit portion 706 are supplied with a variety of signals and the like from the FPC 716 through the FPC terminal portion 708 and a signal line 710.

A plurality of gate driver circuit portions 706 may be provided. In addition, each of the gate driver circuit portion 706 and the source driver circuit portion 704 may be formed separately over a semiconductor substrate or the like and may be in the form of a packaged IC chip. The IC chip can be mounted over the first substrate 701 or on the FPC 716.

The transistor that is a semiconductor device of one embodiment of the present invention can be applied to transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. In addition, examples of the light-emitting element include self-luminous elements such as an LED (Light Emitting Diode), an OLED (Organic Light Emitting Diode), a QLED (Quantum-dot LED), and a semiconductor laser. Moreover, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can also be used, for example.

Figure 7B:
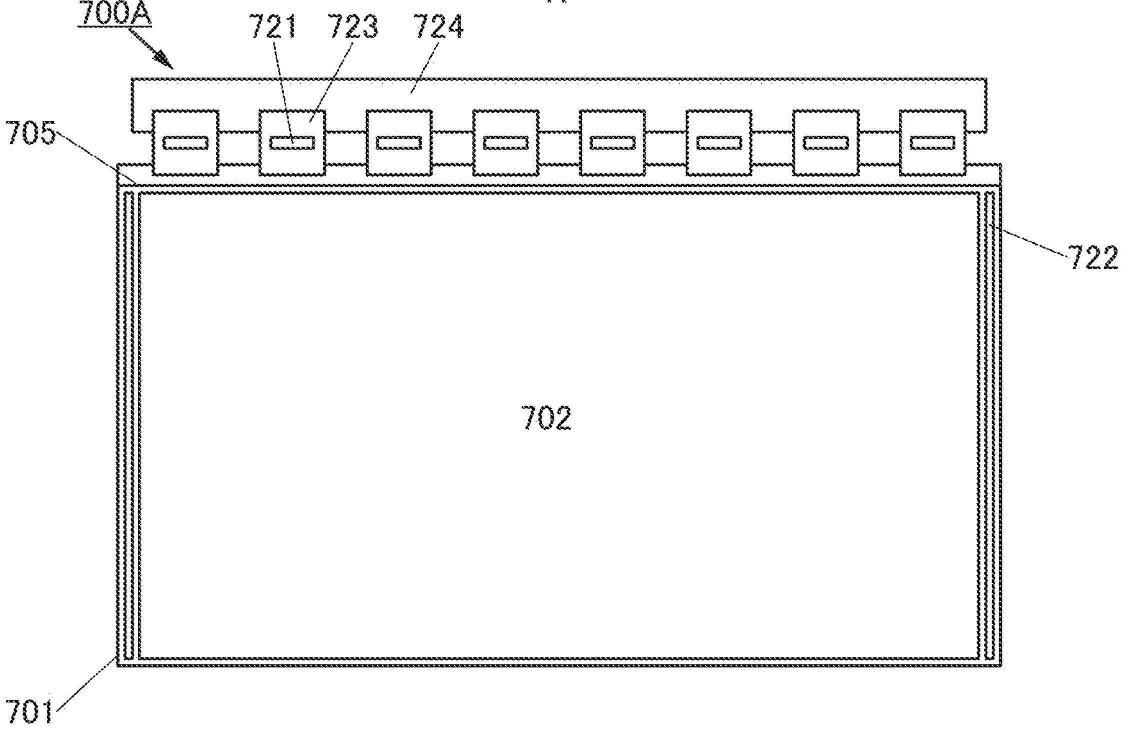

A display device 700A illustrated in FIG. 7(B) is a display device that can be suitably used for an electronic device with a large screen. For example, the display device 700A can be suitably used for a television device, a monitor device, a personal computer (including a laptop personal computer and a desktop personal computer), a tablet terminal, digital signage, or the like.

The display device 700A includes a plurality of source driver ICs 721 and a pair of gate driver circuit portions 722.

The plurality of source driver ICs 721 are attached to respective FPCs 723. In addition, in each of the plurality of FPCs 723, one terminal is connected to the first substrate 701, and the other terminal is connected to a printed circuit board 724. By bending the FPCs 723, the printed circuit board 724 can be placed on a rear side of the pixel portion 702 to be mounted on an electronic device; thus, the space of the electronic device can be saved.

On the other hand, the gate driver circuit portions 722 are formed over the first substrate 701. Thus, an electronic device with a narrow frame can be achieved.

With such a structure, a large high-resolution display device can be achieved. For example, such a structure can also be applied to a display device whose screen diagonal is greater than or equal to 30 inches, greater than or equal to 40 inches, greater than or equal to 50 inches, or greater than or equal to 60 inches. Furthermore, a display device with extremely high resolution such as 4K2K or 8K4K can be achieved.

[Cross-Sectional Structure Example]

Figure 8:
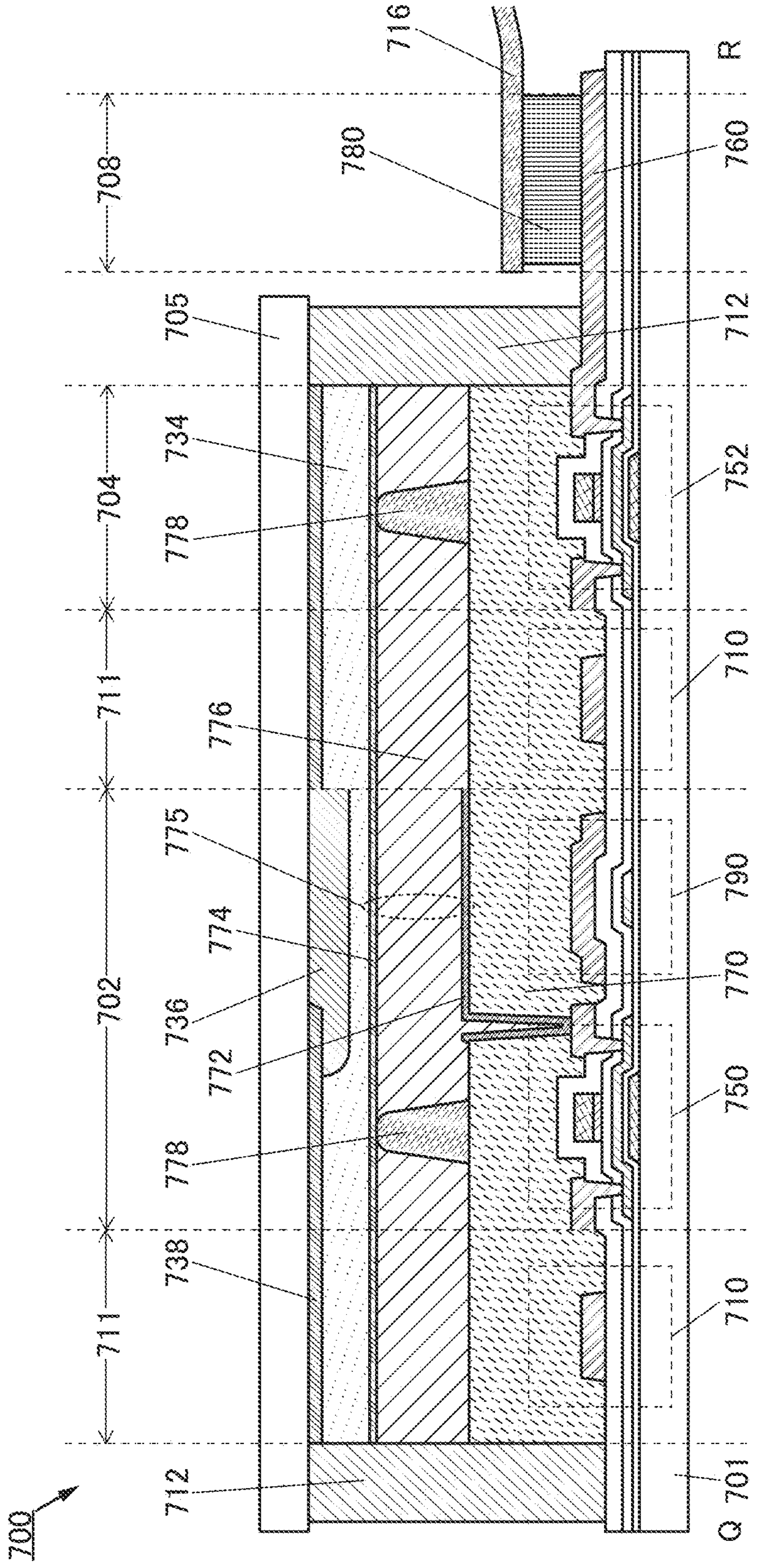
FIG. 8 A cross-sectional view of a display device.
Figure 9:
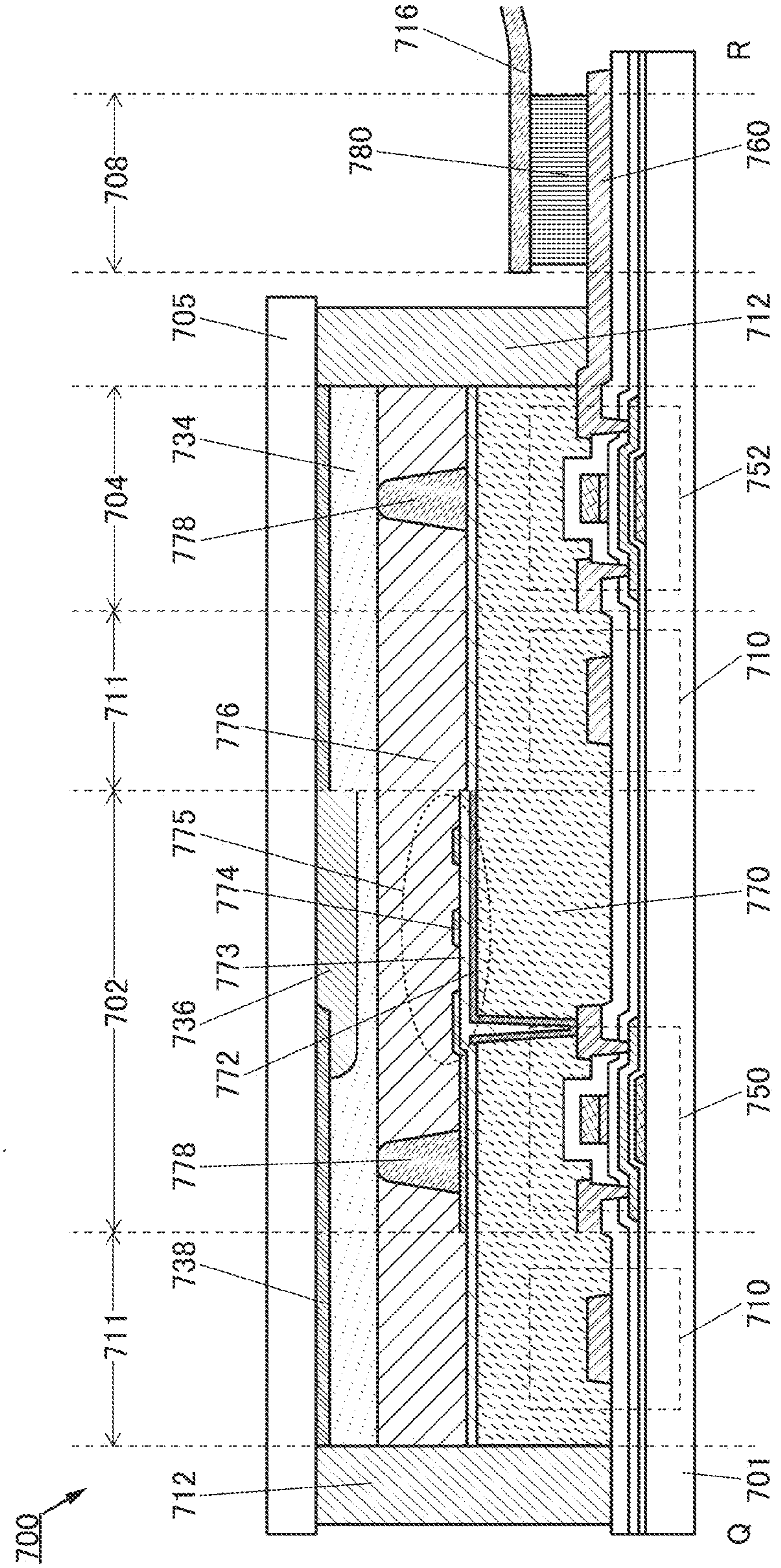
FIG. 9 A cross-sectional view of a display device.
Figure 10:
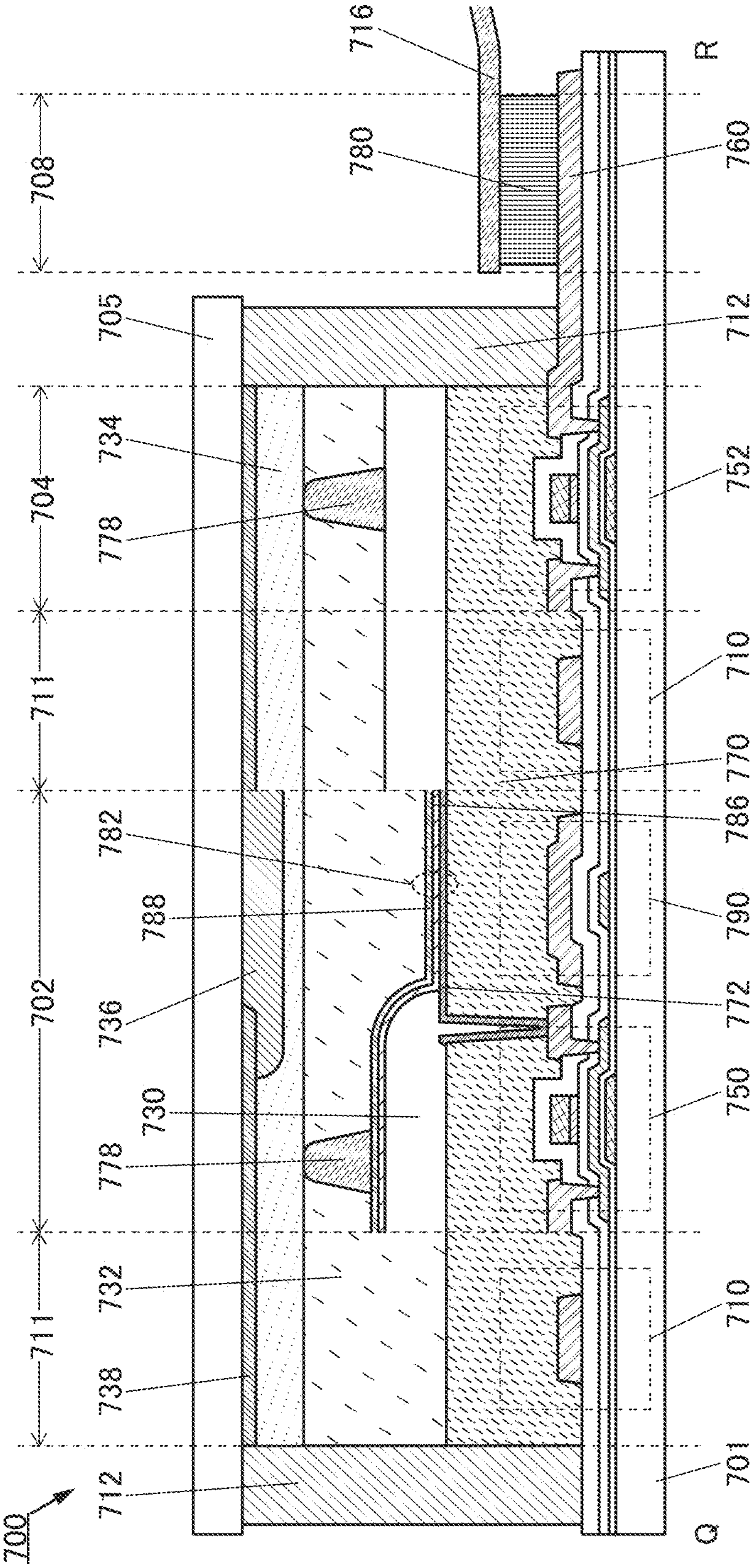
FIG. 10 A cross-sectional view of a display device.

Structures using a liquid crystal element and an EL element as display elements are described below with reference to FIG. 8 to FIG. 10. Note that FIG. 8 to FIG. 10 are cross-sectional views taken along a dashed-dotted line Q-R in FIG. 7(A). FIG. 8 and FIG. 9 each illustrate a structure using a liquid crystal element as a display element, and FIG. 10 illustrates a structure using an EL element.

[Description of Common Portions in Display Devices]

The display device 700 illustrated in FIG. 8 to FIG. 10 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 9 illustrates the case where the capacitor 790 is not provided.

The transistors illustrated in Embodiment 1 can be applied to the transistor 750 and the transistor 752.

The transistors used in this embodiment each include an oxide semiconductor film that is highly purified and in which formation of oxygen vacancies is suppressed. The transistors can each have a low off-state current. Accordingly, the holding time of an electrical signal such as an image signal can be made longer, and an interval between writings of image signals and the like can also be set longer in a power on state. Therefore, the frequency of refresh operations can be reduced, resulting in an effect of reducing power consumption.

In addition, the transistors used in this embodiment can each have comparatively high field-effect mobility and thus is capable of high-speed operation. For example, with the use of such transistors capable of high-speed operation for a display device, a switching transistor in a pixel portion and a driver transistor used in a driver circuit portion can be formed over the same substrate. That is, a semiconductor device formed with a silicon wafer or the like does not need to be used separately as a driver circuit, which enables a reduction in the number of components of the display device. Moreover, the use of the transistors capable of high-speed operation also in the pixel portion can provide a high-quality image.

The capacitor 790 illustrated in FIG. 8 and FIG. 10 includes a lower electrode that is formed by processing the same film as that for a semiconductor layer of the transistor 750 and reducing resistance, and an upper electrode that is formed by processing the same conductive film as that for a source electrode or a drain electrode. Furthermore, two insulating films covering the transistor 750 are provided between the lower electrode and the upper electrode. That is, the capacitor 790 has a stacked-layer structure in which the insulating films functioning as dielectric films are interposed between a pair of electrodes.

In addition, a planarization insulating film 770 is provided over the transistor 750, the transistor 752, and the capacitor 790.

As the transistor 750 included in the pixel portion 702 and the transistor 752 included in the source driver circuit portion 704, transistors having different structures may be used. For example, a structure may be employed in which a top-gate transistor is applied to either one of the transistors and a bottom-gate transistor is applied to the other. Note that "source driver circuit portion 704" described above can be replaced with "gate driver circuit portion."

The signal line 710 is formed using the same conductive film as that for the source electrodes and the drain electrodes of the transistors 750 and 752, and the like. Here, a low-resistance material such as a material containing a copper element is preferably used because signal delay or the like due to wiring resistance can be reduced and display on a large screen is possible.

In addition, the FPC terminal portion 708 includes a connection electrode 760, an anisotropic conductive film 780, and the FPC 716. The connection electrode 760 is electrically connected to a terminal of the FPC 716 through the anisotropic conductive film 780. Here, the connection electrode 760 is formed using the same conductive film as that for the source electrodes and the drain electrodes of the transistors 750 and 752, and the like.

As the first substrate 701 and the second substrate 705, a glass substrate or a flexible substrate such as a plastic substrate can be used, for example.

In addition, on a second substrate 705 side, a light-blocking film 738, a coloring film 736, and an insulating film 734 that is in contact with these films are provided.

[Structure Example of Display Device Using Liquid Crystal Element]

The display device 700 illustrated in FIG. 8 includes a liquid crystal element 775. The liquid crystal element 775 includes a conductive layer 772, a conductive layer 774, and a liquid crystal layer 776 provided therebetween. The conductive layer 774 is provided on the second substrate 705 side and has a function of a common electrode. In addition, the conductive layer 772 is electrically connected to the source electrode or the drain electrode of the transistor 750.

The conductive layer 772 is formed over the planarization insulating film 770 and functions as a pixel electrode.

For the conductive layer 772, a material having a visible-light-transmitting property or a material having a visible-light-reflective property can be used. An oxide material containing indium, zinc, tin, or the like is preferably used as a material having a light-transmitting property, for example. A material containing aluminum, silver, or the like is preferably used as a material having a reflective property, for example.

When a material having a reflective property is used for the conductive layer 772, the display device 700 is a reflective liquid crystal display device. On the other hand, when a material having a light-transmitting property is used for the conductive layer 772, the display device 700 is a transmissive liquid crystal display device. In the case of a reflective liquid crystal display device, a polarizing plate is provided on a viewer side. On the other hand, in the case of a transmissive liquid crystal display device, a pair of polarizing plates are provided such that a liquid crystal element is sandwiched therebetween.

The display device 700 illustrated in FIG. 9 is an example in which the liquid crystal element 775 in a horizontal electric field mode (e.g., an FFS mode) is used. The conductive layer 774 functioning as a common electrode is provided over the conductive layer 772 with an insulating layer 773 therebetween. The alignment state of the liquid crystal layer 776 can be controlled by an electric field generated between the conductive layer 772 and the conductive layer 774.

In FIG. 9, a storage capacitor can be composed of a stacked-layer structure of the conductive layer 774, the insulating layer 773, and the conductive layer 772. Therefore, it is not necessary to provide a capacitor separately, and thus the aperture ratio can be increased.

In addition, although not illustrated in FIG. 8 and FIG. 9, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

For the liquid crystal layer 776, thermotropic liquid crystal, low-molecular liquid crystal, high-molecular liquid crystal, polymer dispersed liquid crystal, polymer network liquid crystal, ferroelectric liquid crystal, anti-ferroelectric liquid crystal, or the like can be used. In addition, in the case of employing a horizontal electric field mode, liquid crystal exhibiting a blue phase for which an alignment film is not used may be used.

In addition, as the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like can be employed.

[Display Device Using Light-Emitting Element]

The display device 700 illustrated in FIG. 10 includes a light-emitting element 782. The light-emitting element 782 includes the conductive layer 772, an EL layer 786, and a conductive film 788. The EL layer 786 contains an organic compound or an inorganic compound such as a quantum dot.

Examples of materials that can be used for an organic compound include a fluorescent material and a phosphorescent material. In addition, examples of materials that can be used for a quantum dot include a colloidal quantum dot material, an alloyed quantum dot material, a core-shell quantum dot material, and a core quantum dot material.

In the display device 700 illustrated in FIG. 10, an insulating film 730 covering part of the conductive layer 772 is provided over the planarization insulating film 770. Here, the light-emitting element 782 is a top-emission light-emitting element including the light-transmitting conductive film 788. Note that the light-emitting element 782 may have a bottom-emission structure in which light is emitted to a conductive layer 772 side or a dual-emission structure in which light is emitted to both a conductive layer 772 side and a conductive film 788 side.

In addition, the coloring film 736 is provided in a position overlapping with the light-emitting element 782, and the light-blocking film 738 is provided in a position overlapping with the insulating film 730, in the lead wiring portion 711, and in the source driver circuit portion 704. Furthermore, the coloring film 736 and the light-blocking film 738 are covered with the insulating film 734. Moreover, a space between the light-emitting element 782 and the insulating film 734 is filled with a sealing film 732. Note that a structure in which the coloring film 736 is not provided may also be employed in the case where the EL layer 786 is formed into an island shape per pixel or a stripe shape per pixel column, i.e., formed by separate coloring.

[Structure Example of Display Device Provided with Input Device]

In addition, an input device may be provided in the display device 700 illustrated in FIG. 8 to FIG. 10. Examples of the input device include a touch sensor.

For example, a variety of types such as a capacitive type, a resistive type, a surface acoustic wave type, an infrared type, an optical type, and a pressure-sensitive type can be used for the sensor. Alternatively, a combination of two or more of these types may be employed.

Note that examples of the structure of a touch panel include what is called an in-cell touch panel in which an input device is formed inside a pair of substrates; what is called an on-cell touch panel in which an input device is formed over the display device 700; and what is called an out-cell touch panel that is attached to the display device 700 to be used.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes a semiconductor device of one embodiment of the present invention is described with reference to FIG. 11.

Figure 11A:
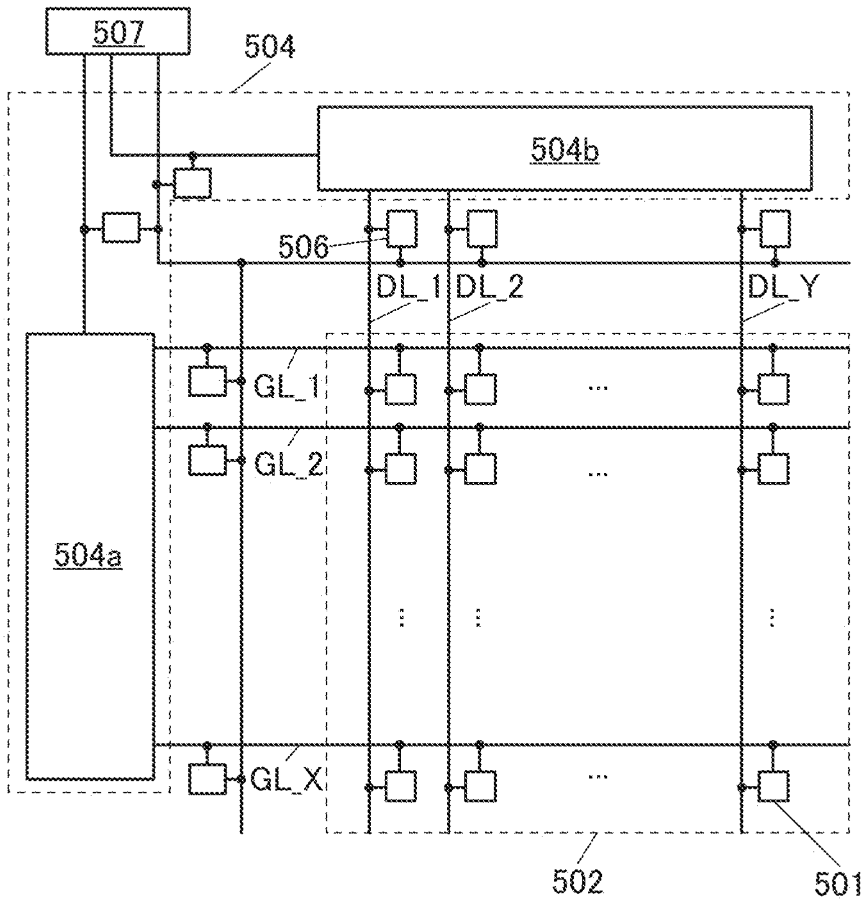
FIGS. 11A to 11C A block diagram and circuit diagrams of a display device.

The display device illustrated in FIG. 11(A) includes a pixel portion 502, a driver circuit portion 504, protection circuits 506, and a terminal portion 507. Note that a structure in which the protection circuits 506 are not provided may be employed.

The transistors of one embodiment of the present invention can be applied to transistors included in the pixel portion 502 and the driver circuit portion 504. In addition, the transistors of one embodiment of the present invention can also be applied to the protection circuits 506. The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504*a* that outputs a scan signal to gate lines GL_1 to GL_X and a source driver 504*b* that supplies a data signal to data lines DL_1 to DL_Y. The gate driver 504*a* includes at least a shift register. In addition, the source driver 504*b* is formed using a plurality of analog switches, for example. Alternatively, the source driver 504*b* may be formed using a shift register or the like.

The terminal portion 507 refers to a portion provided with terminals for inputting power, control signals, image signals, and the like to the display device from external circuits.

The protection circuit 506 is a circuit that makes, when a potential out of a certain range is applied to a wiring connected to the protection circuit, the wiring and another wiring be in a conduction state. The protection circuit 506 illustrated in FIG. 11(A) is connected to a variety of wirings such as scan lines GL, which are wirings between the gate driver 504*a* and the pixel circuits 501, and data lines DL, which are wirings between the source driver 504*b* and the pixel circuits 501.

In addition, the gate driver 504*a* and the source driver 504*b* may each be provided over the same substrate as the pixel portion 502, or a substrate over which a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 11B:
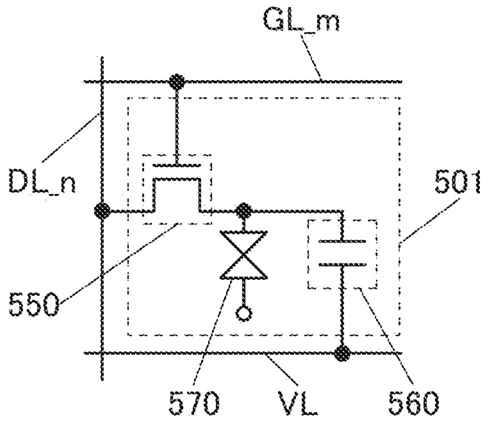
Figure 11C:
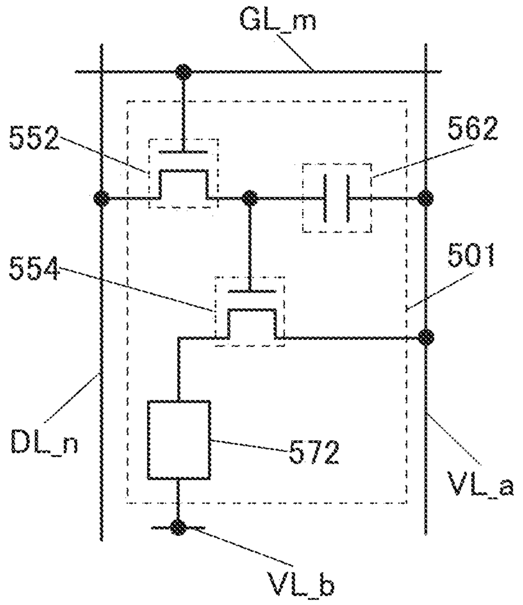

Furthermore, the plurality of pixel circuits 501 illustrated in FIG. 11(A) can have configurations illustrated in FIGS. 11(B) and 11(C), for example.

The pixel circuit 501 illustrated in FIG. 11(B) includes a liquid crystal element 570, a transistor 550, and a capacitor 560. In addition, the data line DL_n, the scan line GL_m, a potential supply line VL, and the like are connected to the pixel circuit 501.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be applied to one of the pair of electrodes of the liquid crystal element 570 included in each of the plurality of pixel circuits 501. Moreover, a different potential may be applied to one of the pair of electrodes of the liquid crystal element 570 included in the pixel circuit 501 in each row.

In addition, the pixel circuit 501 illustrated in FIG. 11(C) includes transistors 552 and 554, a capacitor 562, and a light-emitting element 572. Furthermore, the data line DL_n, the scan line GL_m, a potential supply line VL_a, a potential supply line VL_b, and the like are connected to the pixel circuit 501.

Note that a high power supply potential $V_{DD}$ is applied to one of the potential supply line VL_a and the potential supply line VL_b, and a low power supply potential $V_{SS}$ is applied to the other. Current flowing through the light-emitting element 572 is controlled in accordance with a potential applied to a gate of the transistor 554, so that the luminance of light emitted from the light-emitting element 572 is controlled.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit are described below. The transistors described in Embodiment 1 can be applied to transistors used in the pixel circuit described below.

[Circuit Configuration]

Figure 12A:
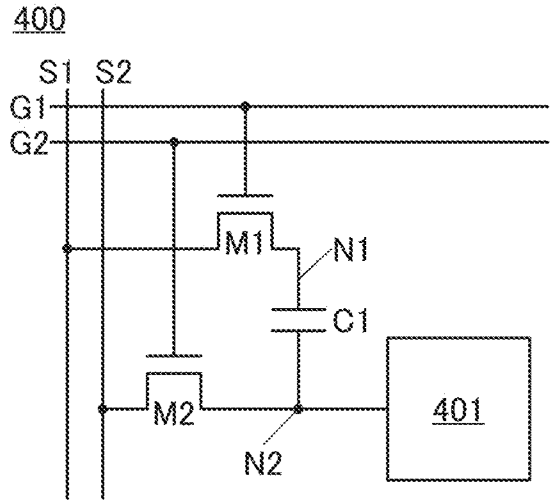
FIGS. 12A to 12D Circuit diagrams of display devices.

FIG. 12(A) shows a circuit diagram of a pixel circuit 400. The pixel circuit 400 includes a transistor M1, a transistor M2, a capacitor C1, and a circuit 401. In addition, a wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 a circuit including at least one display element. A variety of elements can be used as the display element, and typically, a light-emitting element such as an organic EL element or an LED element, a liquid crystal element, a MEMS (Micro Electro Mechanical Systems) element, or the like can be employed.

A node connecting the transistor M1 and the capacitor C1 is denoted by N1, and a node connecting the transistor M2 and the circuit 401 is denoted by N2.

In the pixel circuit 400, the potential of the node N1 can be retained when the transistor M1 is turned off. In addition, the potential of the node N2 can be retained when the transistor M2 is turned off. Furthermore, when a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1 as an example, can be applied to either one or both the transistor M1 and the transistor M2. Accordingly, the potentials of the node N1 and the node N2 can be retained for a long time owing to an extremely low off-state current. Note that a transistor using a semiconductor such as silicon may be used in the case where the potential of each node is retained for a short time (specifically, in the case where frame frequency is higher than or equal to 30 Hz, for example).

Driving Method Example

Figure 12B:
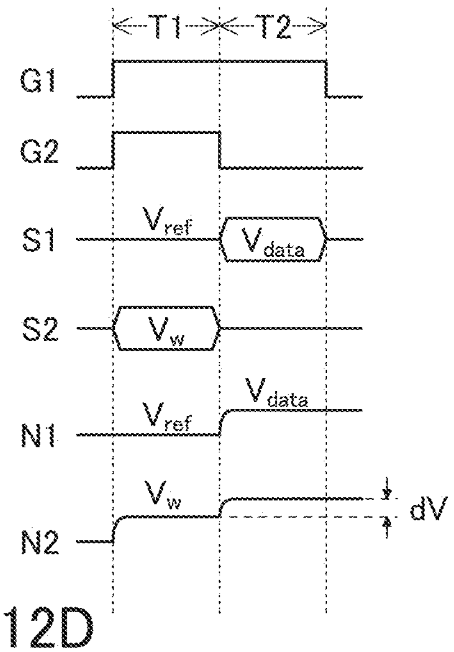

Next, an example of a method for operating the pixel circuit 400 is described with reference to FIG. 12(B). FIG. 12(B) is a timing chart according to the operation of the pixel circuit 400. Note that here, for simplification of description, the influence of a variety of resistance such as wiring resistance, parasitic capacitance of a transistor, a wiring, and the like, the threshold voltage of a transistor, and the like are not taken into consideration.

In the operation shown in FIG. 12(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is applied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is applied from the wiring S1 to the node N1 through the transistor M1. In addition, the first data potential $V_w$ is applied to the node $N_2$ through the transistor M2. Accordingly, a potential difference $V_w$-$V_{ref}$ is retained in the capacitor C1.

[Period T2]

Next, in the period T2, a potential for turning on the transistor M1 is applied to the wiring G1, and a potential for turning off the transistor M2 is applied to the wiring G2. In addition, a second data potential $V_{data}$ is supplied to the wiring S1. The wiring S2 may be supplied with a predetermined potential or may be set in a floating state.

The second data potential $V_{data}$ is applied to the node N1 through the transistor M1. At this time, capacitive coupling through the capacitor C1 changes the potential of the node N2 by a potential dV in accordance with the second data potential $V_{data}$. That is, a potential that is the sum of the first data potential $V_w$ and the potential dV is input to the circuit 401. Note that although dV is shown as having a positive value in FIG. 12(B), dV may have a negative value. In other words, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently higher than the capacitance of the circuit 401, the potential dV is a potential close to the second data potential $V_{data}$.

In the pixel circuit 400, a potential to be supplied to the circuit 401 including the display element can be generated by a combination of two kinds of data signals as described above, so that gray levels can be corrected in the pixel circuit 400.

In addition, in the pixel circuit 400, it is also possible to generate a potential exceeding the maximum potential that can be supplied to the wiring S1 and the wiring S2. For example, in the case of using a light-emitting element, high-dynamic range (HDR) display or the like can be performed. Furthermore, in the case of using a liquid crystal element, overdriving or the like can be achieved.

APPLICATION EXAMPLE

[Example Using Liquid Crystal Element]

Figure 12C:
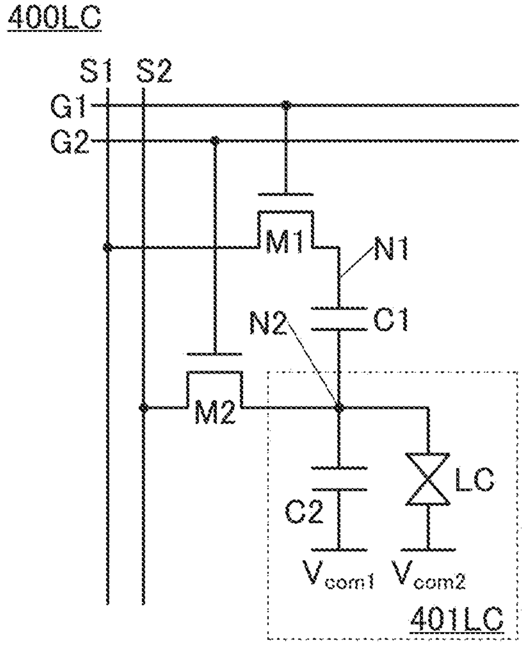

A pixel circuit 400LC illustrated in FIG. 12(C) includes a circuit 401LC. The circuit 401LC includes a liquid crystal element LC and a capacitor C2.

One electrode of the liquid crystal element LC is connected to the node N2 and one electrode of the capacitor C2, and the other electrode of the liquid crystal element LC is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high drive voltage can be employed, for example. In addition, gray levels can also be corrected in accordance with operating temperature, the degradation state of the liquid crystal element LC, or the like by supply of a correction signal to the wiring S1 or the wiring S2.

[Example Using Light-Emitting Element]

Figure 12D:
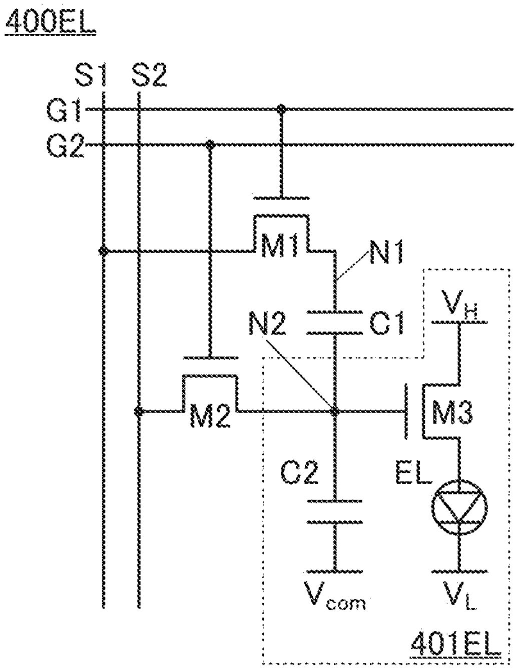

A pixel circuit 400EL illustrated in FIG. 12(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other of the source and the drain is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although a structure is described here in which the anode side of the light-emitting element EL is connected to the transistor M3, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is applied to the gate of the transistor M3, which enables HDR display or the like, for example. In addition, a variation in electrical characteristics of the transistor M3 and the light-emitting element EL can also be corrected by supply of a correction signal to the wiring S1 or the wiring S2.

Note that without limitation to the circuits illustrated in FIGS. 12(C) and 12(D), a configuration to which a transistor, a capacitor, or the like is further added may be employed.

At least part of this embodiment can be implemented in combination with the other embodiments described in this specification as appropriate.

Embodiment 5

In this embodiment, a display module that can be manufactured using one embodiment of the present invention is described.

Figure 13A:
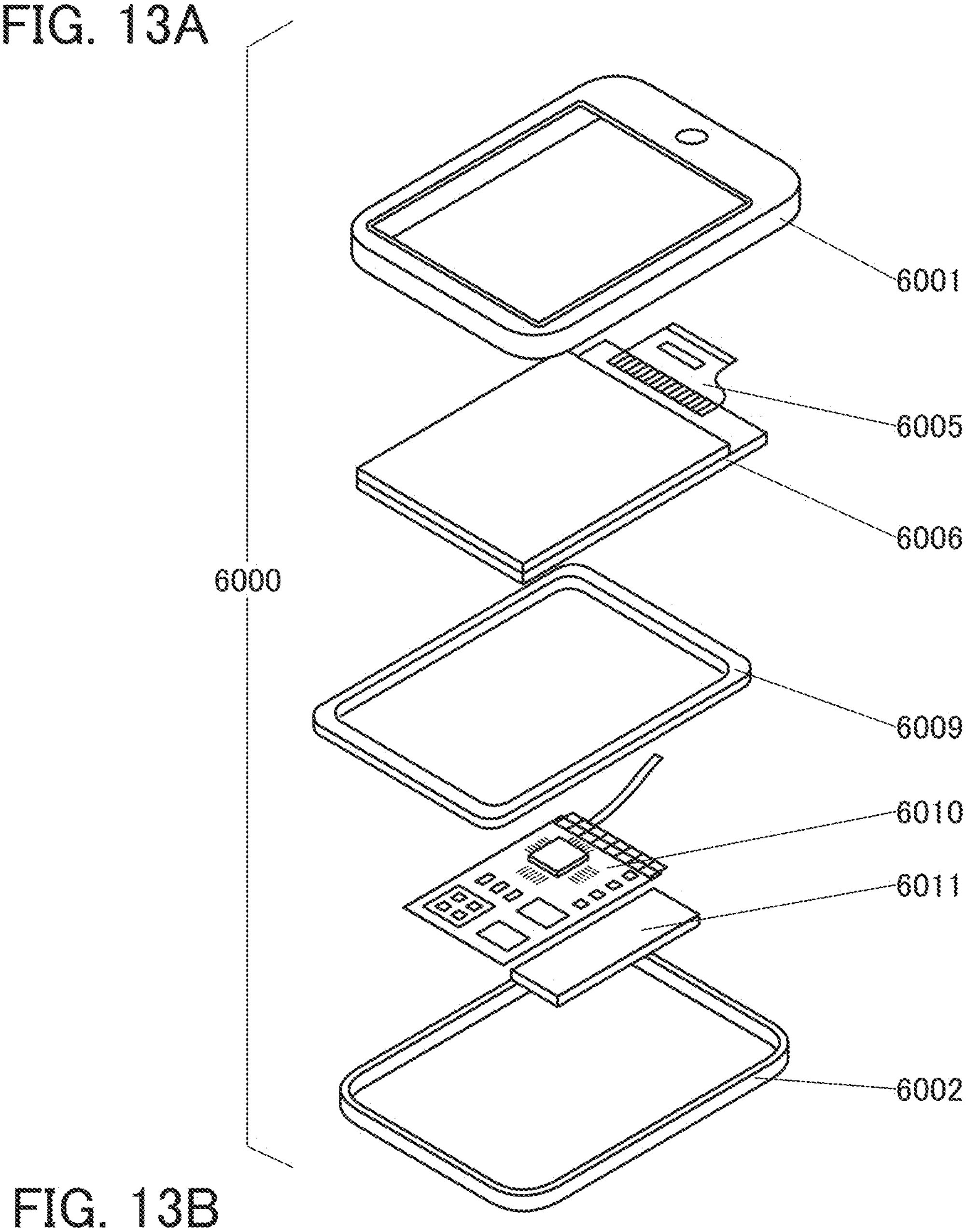
FIGS. 13A and 13B A structure example of a display module.

In a display module 6000 illustrated in FIG. 13(A), a display device 6006 to which an FPC 6005 is connected, a frame 6009, a printed circuit board 6010, and a battery 6011 are provided between an upper cover 6001 and a lower cover 6002.

A display device manufactured using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 13B:
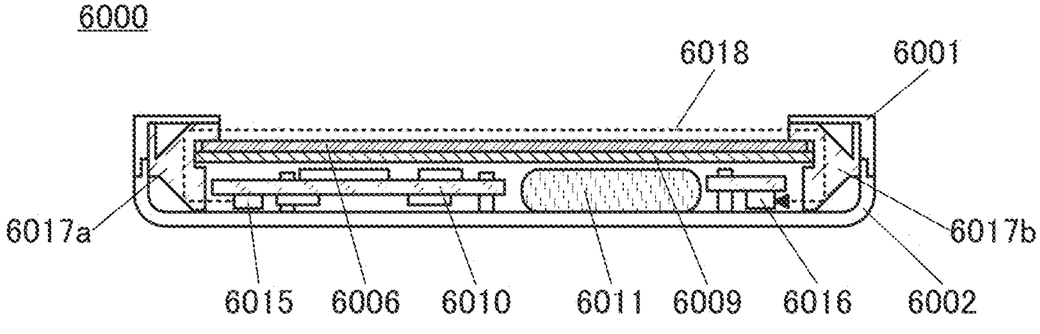

FIG. 13(B) is a schematic cross-sectional view of the display module 6000 with an optical touch sensor.

The display module 6000 includes a light-emitting portion 6015 and a light-receiving portion 6016 that are provided on the printed circuit board 6010. Furthermore, a pair of light guide portions (a light guide portion 6017*a* and a light guide portion 6017*b*) are provided in a region surrounded by the upper cover 6001 and the lower cover 6002.

The display device 6006 is provided to overlap with the printed circuit board 6010 and the battery 6011 with the frame 6009 therebetween. The display device 6006 and the frame 6009 are fixed to the light guide portion 6017*a* and the light guide portion 6017*b*.

Light 6018 emitted from the light-emitting portion 6015 travels over the display device 6006 through the light guide portion 6017*a* and reaches the light-receiving portion 6016 through the light guide portion 6017*b*. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at positions facing the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts the light into an electrical signal can be used. A photodiode that can receive infrared rays can be suitably used.

With the use of the light guide portion 6017*a* and the light guide portion 6017*b* that transmit the light 6018, the light-emitting portion 6015 and the light-receiving portion 6016 can be placed below the display device 6006, and malfunction of the touch sensor due to external light reaching the light-receiving portion 6016 can be inhibited. When a resin that absorbs visible light and transmits infrared rays is particularly used, malfunction of the touch sensor can be more effectively inhibited.

At least part of this embodiment can be implemented in combination with the other embodiments described in this specification as appropriate.

Embodiment 6

In this embodiment, electronic devices each including a display device manufactured using one embodiment of the present invention are described.

Electronic devices illustrated below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display an image with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a laptop personal computer, a monitor device, digital signage, a pachinko machine, and a game machine.

An electronic device to which one embodiment of the present invention is applied can be incorporated along a flat surface or a curved surface of an inside wall or an outside wall of a house or a building, an interior or an exterior of a car, or the like.

Figure 14A:
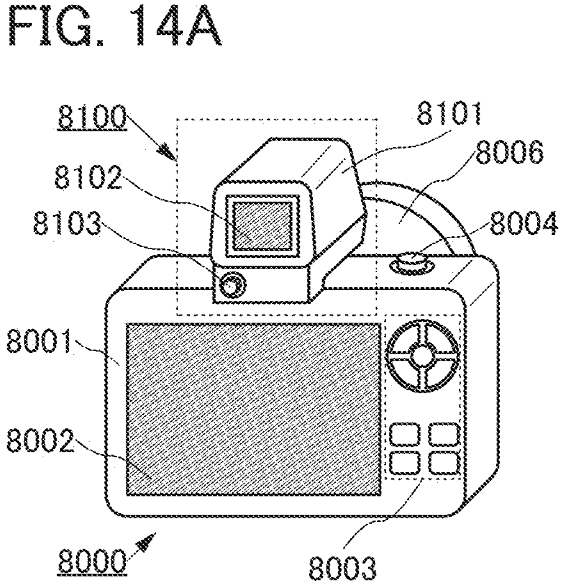
FIGS. 14A to 14E Structure examples of electronic devices.

FIG. 14(A) is a diagram showing appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. In the finder 8100, an image or the like received from the camera 8000 can be displayed on the display portion 8102.

The button 8103 has a function of a power button or the like.

The display device of one embodiment of the present invention can be applied to the display portion 8002 of the camera 8000 and the display portion 8102 of the finder 8100. Note that a finder may be incorporated in the camera 8000.

Figure 14B:
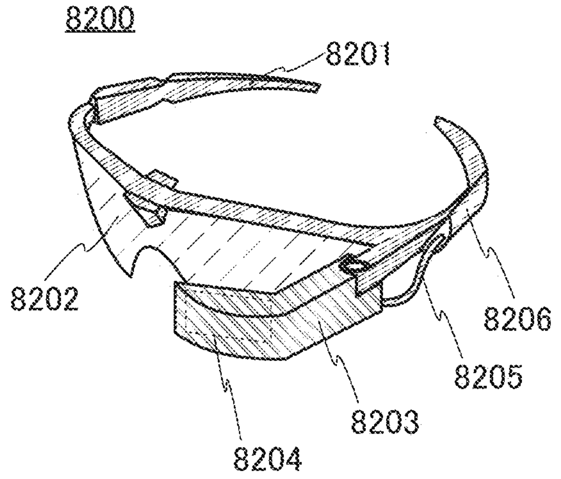

FIG. 14(B) is a diagram showing appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received image data on the display portion 8204. In addition, the main body 8203 is provided with a camera, and data on the movement of the user's eyeball and eyelid can be used as an input means.

In addition, the mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological data on the display portion 8204 or a function of changing an image displayed on the display portion 8204 in accordance with the movement of the user's head.

The display device of one embodiment of the present invention can be applied to the display portion 8204.

Figure 14C:
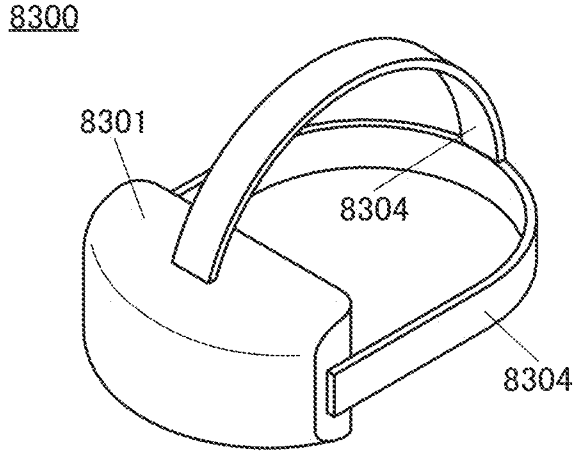
Figure 14D:
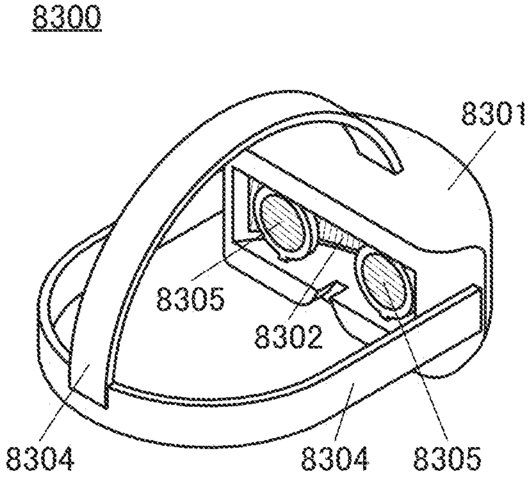
Figure 14E:
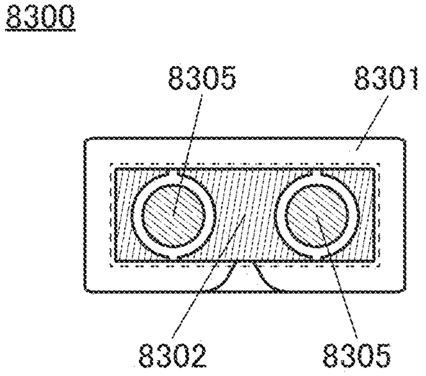

FIGS. 14(C), 14(D), and 14(E) are diagrams showing appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed in a different region of the display portion 8302 is viewed through the lenses 8305, 3D display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be applied to the display portion 8302. A display device including a semiconductor device of one embodiment of the present invention has extremely high resolution; thus, even when an image is magnified using the lenses 8305 as illustrated in FIG. 14(E), the user does not perceive pixels, and a more realistic image can be displayed.

Electronic devices illustrated in FIG. 15(A) to FIG. 15(G) include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 15(A) to FIG. 15(G) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 15(A) to FIG. 15(G) are described below.

Figure 15A:
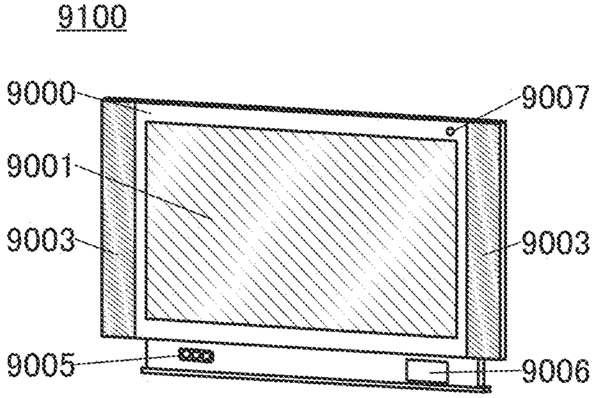
FIGS. 15A to 15G Structure examples of electronic devices.

FIG. 15(A) is a perspective view showing a television device 9100. In the television device 9100, the display portion 9001 having a large screen size of, for example, larger than or equal to 50 inches or larger than or equal to 100 inches can be incorporated in the display portion 9001.

Figure 15B:
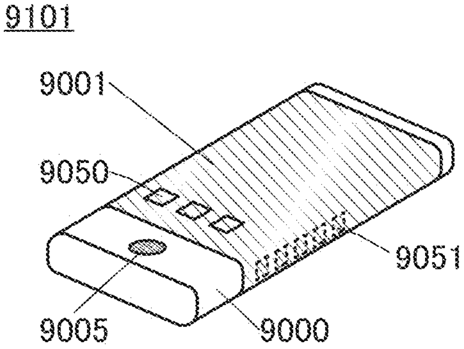

FIG. 15(B) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display characters and image information on its plurality of surfaces. FIG. 15(B) shows an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 15C:
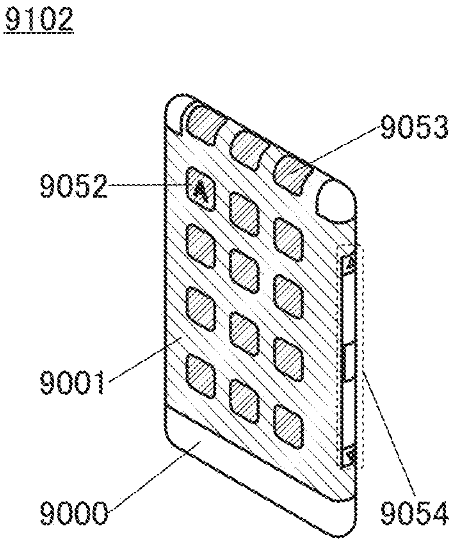

FIG. 15(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can also check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 15D:
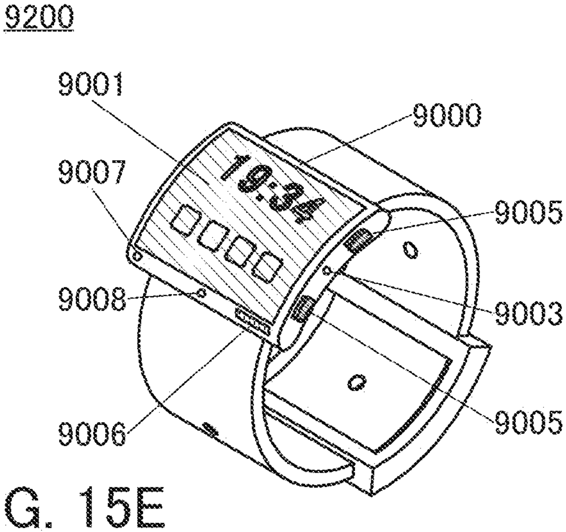

FIG. 15(D) is a perspective view showing a watch-type portable information terminal 9200. For example, the portable information terminal 9200 can be used as a smart watch. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal and charging. Note that charging operation may be performed by wireless power feeding.

Figure 15E:
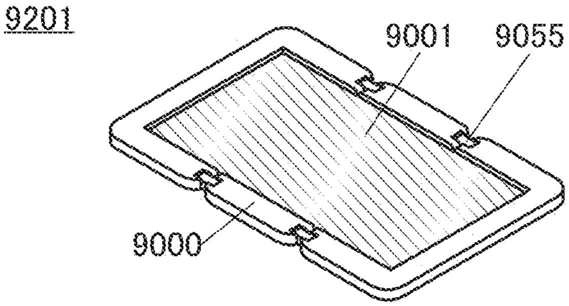
Figure 15F:
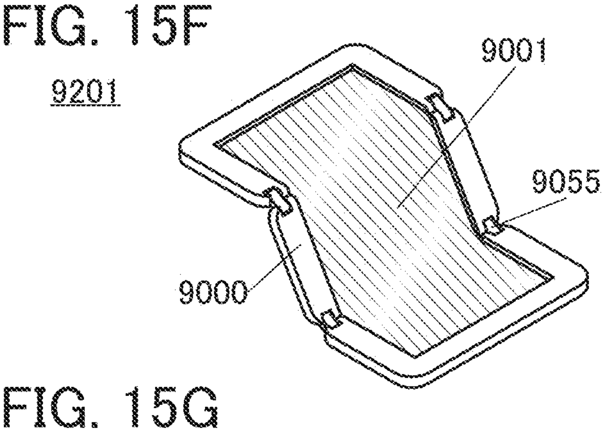
Figure 15G:
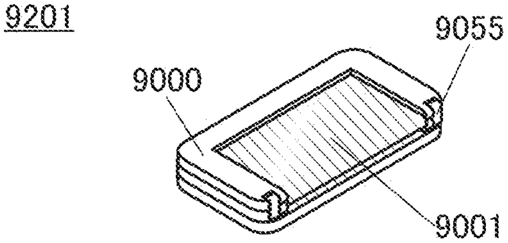

FIGS. 15(E), 15(F), and 15(G) are perspective views showing a foldable portable information terminal 9201. In addition, FIG. 15(E) is a perspective view of an unfolded state of the portable information terminal 9201, FIG. 15(G) is a perspective view of a folded state thereof, and FIG. 15(F) is a perspective view of a state in the middle of change from one of FIG. 15(E) and FIG. 15(G) to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature of greater than or equal to 1 mm and less than or equal to 150 mm.

Figure 16A:
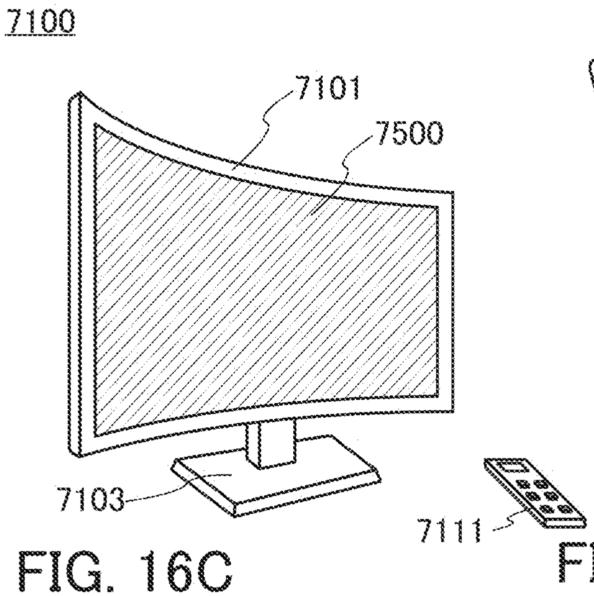
FIGS. 16A to 16D Structure examples of electronic devices.

FIG. 16(A) illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 16(A) can be performed with an operation switch provided in the housing 7101 or a separate remote control 7111. Alternatively, a touch panel may be applied to the display portion 7500, and the television device 7100 may be operated by touch on the touch panel. The remote control 7111 may include a display portion in addition to operation buttons.

Note that the television device 7100 may include a television receiver and a communication device for network connection.

Figure 16B:
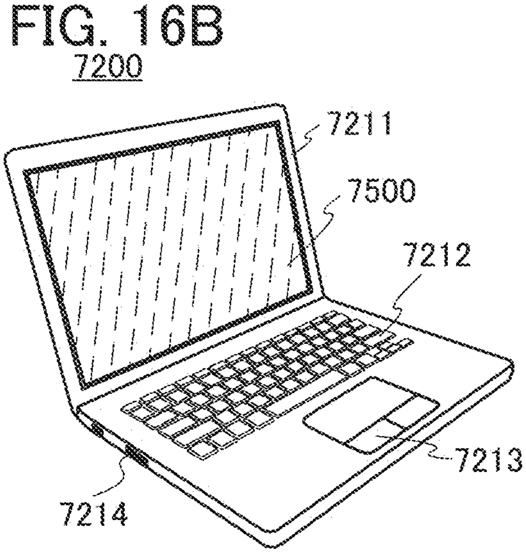

FIG. 16(B) illustrates a laptop personal computer 7200. The laptop personal computer 7200 includes a housing 7211, a keyboard 7212, a pointing device 7213, an external connection port 7214, and the like. The display portion 7500 is incorporated in the housing 7211.

Figure 16C:
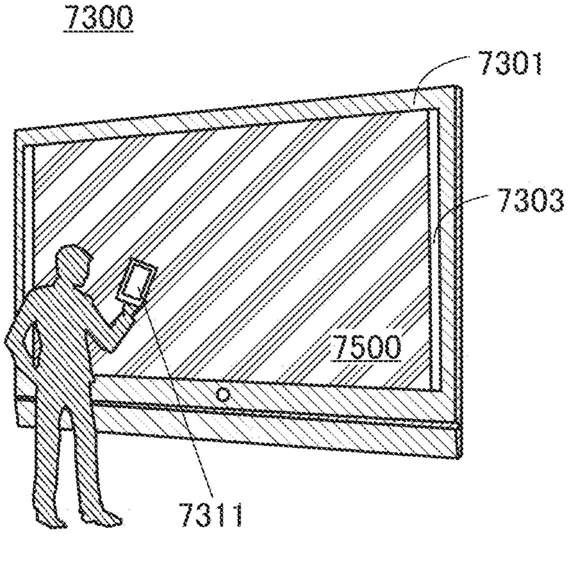
Figure 16D:
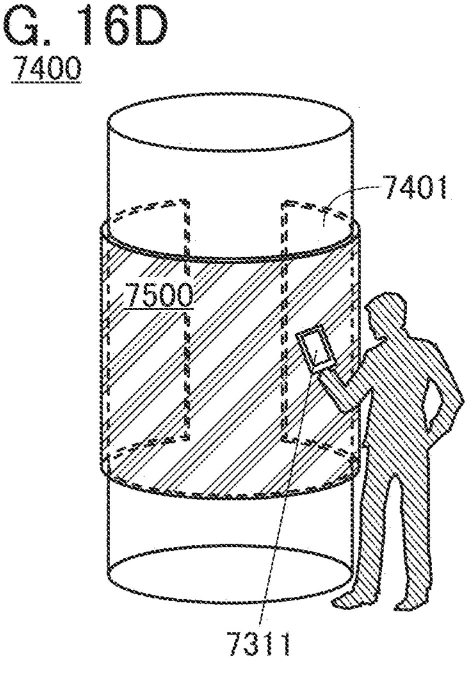

FIGS. 16(C) and 16(D) show examples of digital signage.

Digital signage 7300 illustrated in FIG. 16(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 16(D) is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effect of advertising can be increased, for example.

A touch panel is preferably applied to the display portion 7500 so that the user can operate the digital signage. Thus, the digital signage can be used not only for advertising but also for providing information that the user needs, such as route information, traffic information, and guidance information on a commercial facility.

In addition, as illustrated in FIGS. 16(C) and 16(D), it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

Furthermore, it is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be applied to the display portion 7500 in FIGS. 16(A) to 16(D).

The electronic devices in this embodiment each have a structure including a display portion; however, one embodiment of the present invention can also be applied to an electronic device that does not include a display portion.

At least part of this embodiment can be implemented in combination with the other embodiments described in this specification as appropriate.

Example 1

In this example, the sheet resistance of an oxide semiconductor film to which impurities were added to have lower resistance was measured. In addition, treatment for supplying oxygen to the oxide semiconductor film was performed, and changes in sheet resistance were evaluated.

[Simulation]

First, the implanted amounts of boron and phosphorus used as impurity elements in a depth direction were calculated.

In the calculation, TRIM (Transport of Ion in Matter), which is software for calculating an ion implantation process by a Monte Carlo method, was used.

The film used for the calculation in which the impurity elements were implanted was a stacked film where a 100-nm-thick silicon oxide film as a second insulating film, a 40-nm-thick $InGaZnO_4$ film as an oxide semiconductor film, and a 100-nm-thick silicon oxide film as a first insulating film were sequentially stacked. Two kinds of impurity elements, boron and phosphorus, were calculated as the impurity elements. The dosage of boron and phosphorus was $5\times10^{15}$ $cm^{-2}$. In addition, as beam energy, five conditions of 10 keV, 15 keV, 20 keV, 30 keV, and 40 keV were used for boron, and three conditions of 50 keV, 60 keV, and 70 keV were used for phosphorus.

Figure 17A:
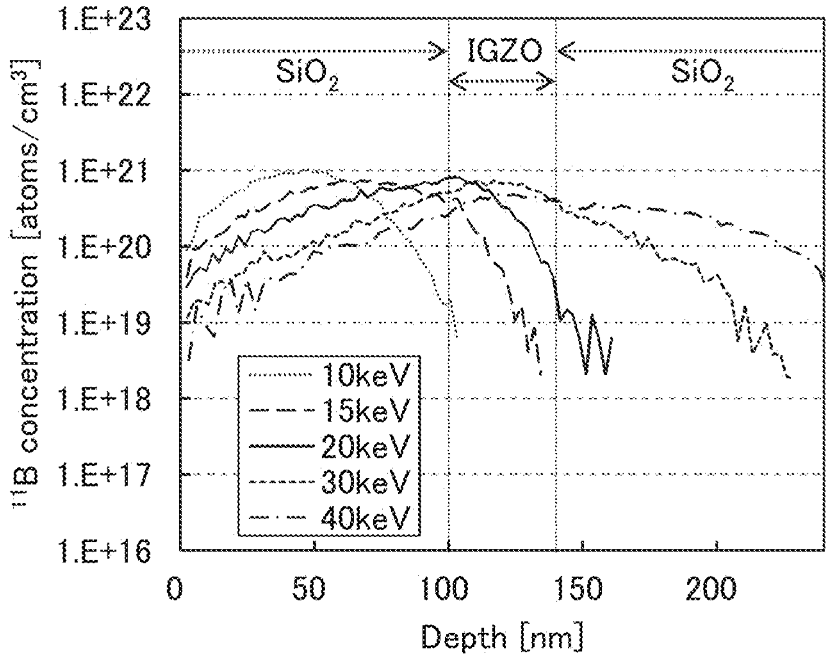
FIGS. 17A and 17B Impurity concentration calculation results.
Figure 17B:
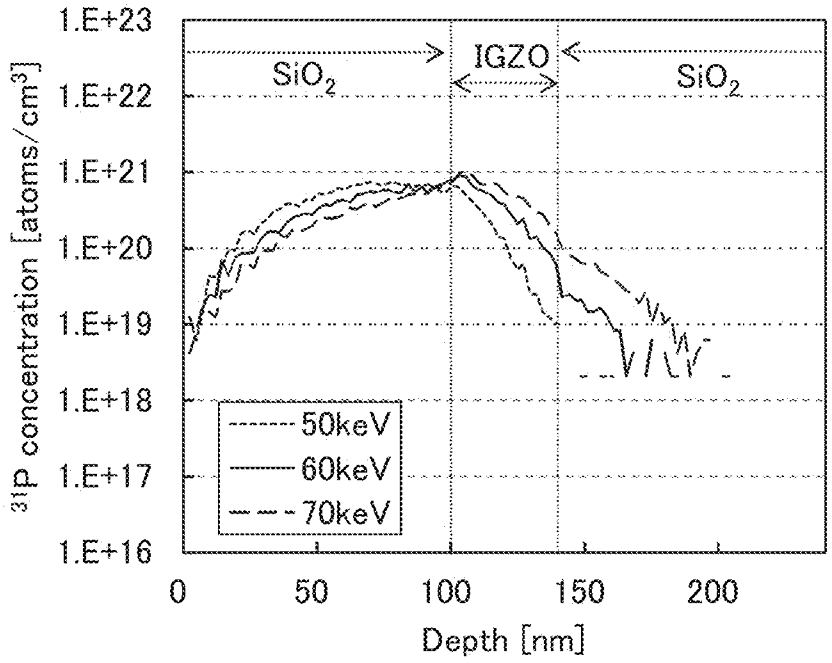

FIG. 17(A) shows calculation results of boron ($^{11}B$), and FIG. 17(B) shows calculation results of phosphorus ($^{31}P$). The vertical axis represents the volume concentration of boron or phosphorus, and the horizontal axis represents depth.

As shown in FIG. 17(A), it was found that an impurity concentration in the oxide semiconductor film became higher as the beam energy became higher. In addition, it was found that as the beam energy became higher, the position of a peak at the highest impurity concentration became deeper and the profile of the peak became broad. Furthermore, it was found that the vicinity of an interface between the oxide semiconductor film (IGZO) and the first insulating film ($SiO_2$ on the left side) had the highest impurity concentration under the condition of the beam energy of 20 keV.

It was found from FIG. 17(B) that the impurity concentration in the oxide semiconductor film became higher as the beam energy became higher. In addition, it was found that a region at the highest impurity concentration was able to be formed in the vicinity of the interface between the oxide semiconductor film and the first insulating film under any of the three calculated conditions.

[Sheet Resistance Evaluation]

Results of measuring the sheet resistance of a film where an oxide insulating film is stacked over an oxide semiconductor film after adding impurities to the film are described below.

[Evaluation Method]

Evaluation was performed in the following procedure.

First, an oxide semiconductor film with a thickness of approximately 40 nm to 50 nm was deposited over a glass substrate. The oxide semiconductor film was deposited by a sputtering method using a metal oxide target whose atomic ratio was In:Ga:Zn=1:1:1.2.

Next, an approximately 100-nm-thick silicon oxide film was deposited over the oxide semiconductor film. The silicon oxide film was deposited by a plasma CVD method using a silane gas and a nitrous oxide gas as a deposition gas. Note that the substrate temperature in the deposition was 350° C.

Then, treatment for supplying oxygen into the oxide semiconductor film was performed. The treatment for supplying oxygen was performed in such a manner that a metal oxide film was deposited over a silicon oxide film by a sputtering method in an oxygen-containing atmosphere, heat treatment was performed at 400° C. for 1 hour after oxygen was supplied into the silicon oxide film, and oxygen was supplied to the oxide semiconductor film from the silicon oxide film. After that, the metal oxide film was removed by etching. The metal oxide film was formed under conditions similar to those for the oxide semiconductor film.

Then, the impurities were added. The impurities were added using two kinds of apparatus, a plasma ion doping apparatus not including a mass separation mechanism and an ion implantation apparatus including a mass-separation mechanism. In addition, as a gas for supplying boron, a $B_2H_6$ gas was used in the ion doping apparatus, and a $BF_3$ gas was used in the ion implantation apparatus. On the other hand, a $PH_3$ gas was used as a gas for supplying phosphorus. In the plasma ion doping apparatus, a plurality of samples with different impurity dosage and acceleration voltage were manufactured. In the ion implantation apparatus, a plurality of samples with different dosage and beam energy were manufactured. Furthermore, for comparison, samples to which the impurities were not added were also manufactured.

Then, the treatment for supplying oxygen into the oxide semiconductor film was performed again. Here, four kinds of samples, which were samples subjected to heat treatment under three different temperature conditions of 250° C., 350° C., and 400° C. after the deposition of the metal oxide film and a sample not subjected to heat treatment, were manufactured.

Lastly, the sheet resistance was measured after the silicon oxide film was removed and a titanium electrode was formed by a sputtering method.

[Sheet Resistance]

Each graph in FIG. 18 shows results of sheet resistance of the samples doped with boron by a plasma doping method. FIG. 18(A) shows results with an acceleration voltage of 20 kV. FIG. 18(B) shows results with an acceleration voltage of 40 kV. FIG. 18(C) shows results with an acceleration voltage of 60 kV. In addition, each graph shows dosage conditions of $1\times10^{15}$ $cm^{-2}$ to $1.5\times10^{16}$ $cm^{-2}$. Furthermore, each graph shows each dosage of the samples on which heat treatment was not performed and the samples on which heat treatment was performed at each temperature side by side.

As shown in FIGS. 18(A) to 18(C), it was found that the resistance of the oxide semiconductor film was lowered by addition of boron. In addition, compared to the samples under the condition with the acceleration voltage of 20 kV, the samples under the conditions with the acceleration voltages of 40 kV and 60 kV had high sheet resistance as the dosage became high. Therefore, it was also found from the TRIM simulation results shown in FIG. 17(A) that the resistance was stably lowered by adding the impurity such that the vicinity of an interface between the oxide semiconductor film and an oxide insulating film formed above the oxide semiconductor film had the highest impurity concentration.

Furthermore, in the samples to which boron was added except the sample under the condition of the lowest dosage (the condition of $1\times10^{15}$ $cm^{-2}$), a phenomenon of an increase in resistance by heat treatment was hardly seen, and the low resistance was maintained before and after the heat treatment.

Figure 19A:
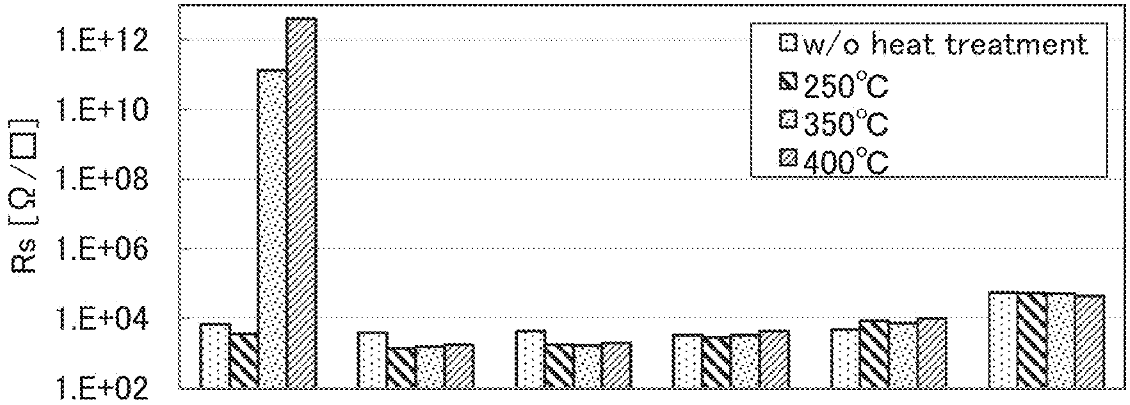
FIGS. 19A and 19B Sheet resistance measurement results.
Figure 19B:
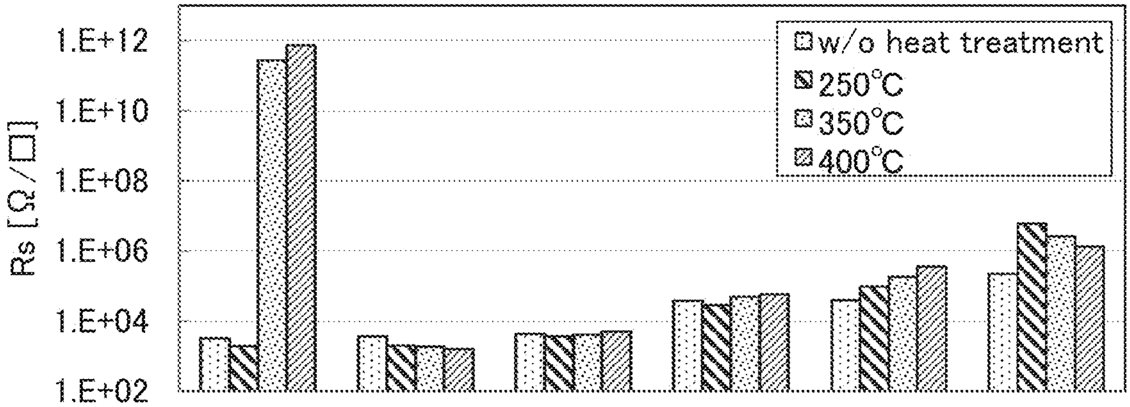

FIGS. 19(A) and 19(B) show results of sheet resistance of the samples doped with phosphorus by a plasma doping method. FIG. 19(A) shows results with an acceleration voltage of 60 kV, and FIG. 19(B) shows results with an acceleration voltage of 70 kV.

It was found that even when phosphorus was added as the impurity element, the resistance of the oxide semiconductor film was lowered. Furthermore, the resistance tended to become higher as the dosage became higher, and it was found that there was the range of optimal dosage.

Next, evaluation results of sheet resistance when the impurity element is added using an ion implantation apparatus including a mass separation mechanism are shown. Compared to a plasma doping method, an ion implantation method is a method that can perform more accurate control with a mass separation mechanism because the mixing of an impurity ion other than a target ion hardly occurs.

Figure 20A:
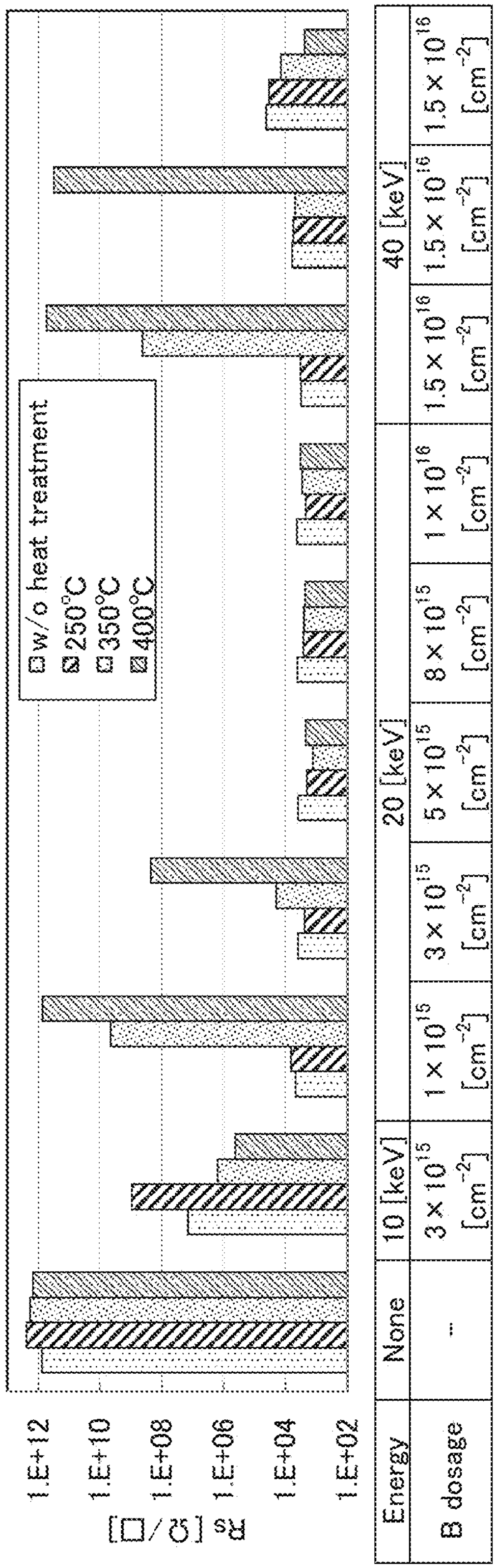
FIGS. 20A and 20B Sheet resistance measurement results.
Figure 20B:
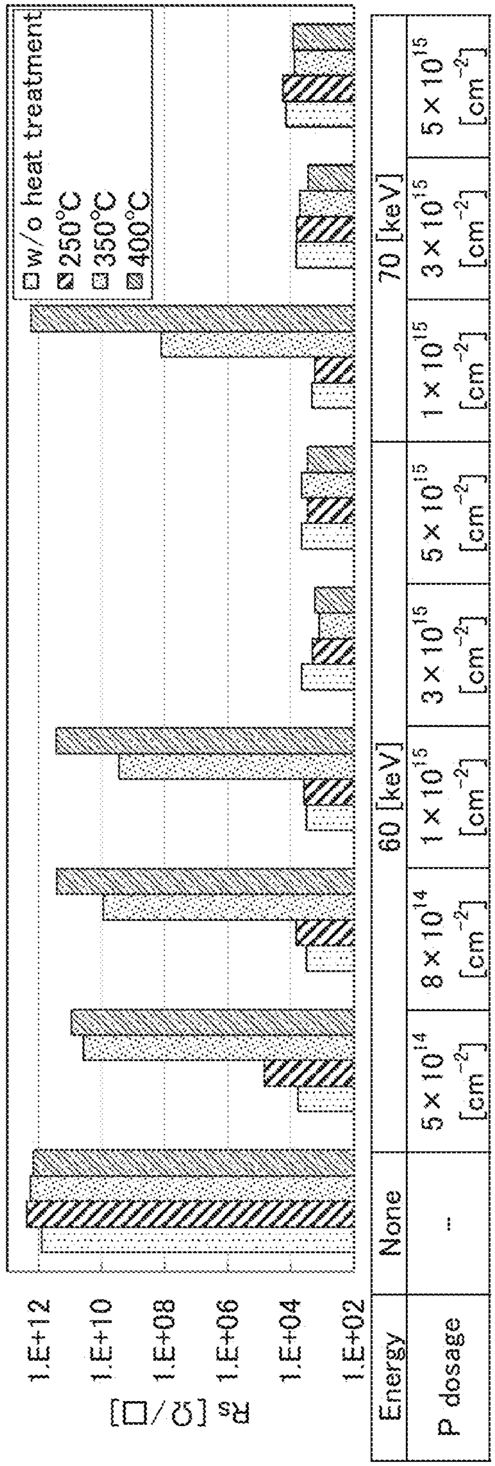

FIG. 20(A) shows results when boron ($^{11}B$) is added, and FIG. 20(B) shows results when phosphorus ($^{31}P$) is added. In addition, samples to which the impurity element is not added are also shown in FIGS. 20(A) and 20(B).

Also in the case of using the ion implantation apparatus, a tendency similar to that of the plasma doping method was observed.

In addition, when the plasma ion doping method is compared to the ion implantation method, the plasma ion doping method has a tendency to make resistance low and stable at low dosage. This is probably because the plasma ion doping apparatus does not include a mass spectrometry mechanism, and thus the resistance of the oxide semiconductor film is influenced by the impurity ion other than the target ion.

[Impurity Concentration Evaluation]

Measurement results of concentration distribution of the impurity element in the depth direction are described below using the samples manufactured as described above. The measurement was performed by secondary ion mass spectrometry (SIMS). Two kinds of samples, which were a sample to which boron ($^{11}B$) was added and a sample to which phosphorus ($^{31}P$) was added to the oxide semiconductor film by the ion implantation apparatus, were used. Conditions for adding boron were a beam energy of 20 keV and a dosage of $5\times10^{15}$ $cm^{-2}$. Conditions for adding phosphorus were a beam energy of 60 keV and a dosage of $5\times10^{15}$ $cm^{-2}$.

Figure 21A:
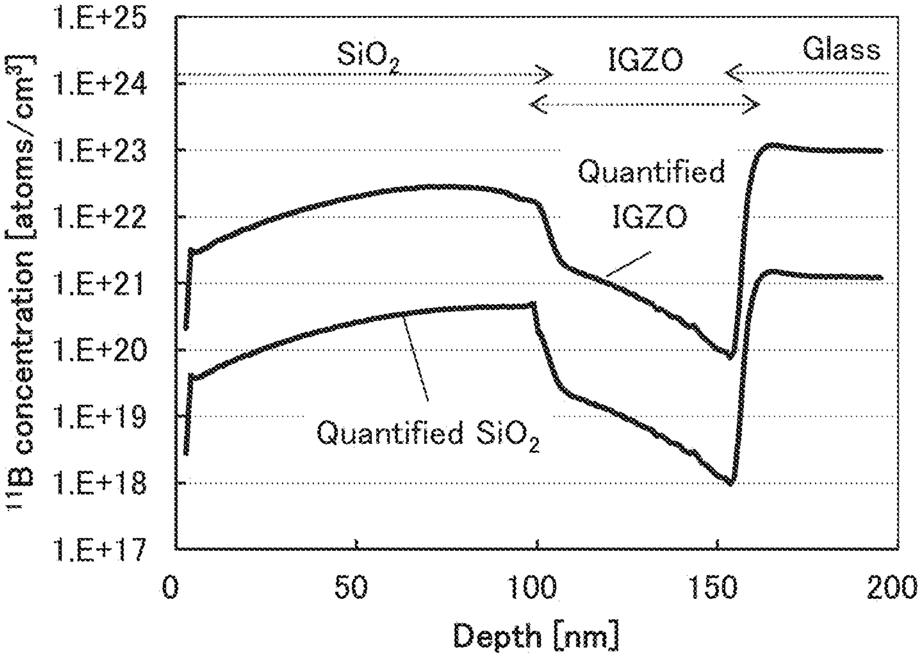
FIGS. 21A and 21B Impurity concentration measurement results.
Figure 21B:
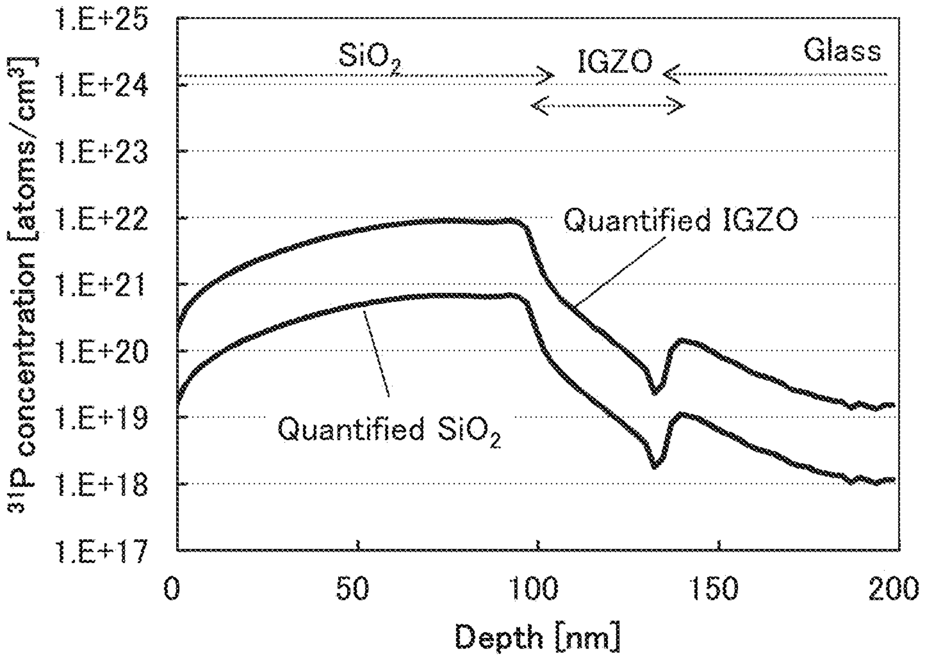

FIG. 21(A) shows SIMS analysis results of samples to which boron is added, and FIG. 21(B) shows SIMS analysis results of samples to which phosphorus is added. In addition, in each graph, two quantified profiles of a silicon oxide film ($SiO_2$) as a reference sample and an oxide semiconductor film (IGZO) are shown side by side.

It was found from FIG. 21(A) that the silicon oxide film has a concentration gradient such that the boron concentration is higher in a portion closer to an interface between the silicon oxide film and the oxide semiconductor film. In contrast, it was found that the oxide semiconductor film has a concentration gradient such that the boron concentration is higher in a portion closer to the interface between the oxide semiconductor film and the silicon oxide film. That is, it was found that a region at the highest boron concentration was positioned in the vicinity of the interface. It was found that the concentration gradient of the oxide semiconductor film is larger than that of the silicon oxide film.

Samples shown in FIG. 21(B) to which phosphorus was added had a tendency substantially similar to that of the samples in FIG. 21(A). That is, it was also found that in the samples to which phosphorus was added, a region at the highest phosphorus concentration was positioned in the vicinity of the interface between the silicon oxide film and the oxide semiconductor film and the concentration gradient of the oxide semiconductor film is larger than that of the silicon oxide film.

The above results reveal that a stable oxide semiconductor film with extremely low resistance can be formed by adding an impurity element such as boron or phosphorus to an oxide semiconductor layer through an oxide insulating film. Furthermore, it was found that an increase in resistance was not observed by providing a region at the highest concentration in the vicinity of an interface between the oxide insulating film and the oxide semiconductor film even when treatment for supplying oxygen to the oxide semiconductor film was performed. This result is probably because an impurity element such as boron or phosphorus is added to the oxide insulating film, so that an oxygen blocking property is provided to the oxide insulating film and oxygen is less likely to be diffused.

Example 2

As described below, transistors of one embodiment of the present invention were manufactured and electrical characteristics thereof were evaluated.

[Sample Manufacture]

For the structures of the manufactured transistors, the transistor 100A described in Embodiment 1 and illustrated in FIG. 3 can be referred to. In addition, a plurality of samples with different conditions for adding boron and phosphorus used as impurity elements were manufactured. Furthermore, for comparison, samples to which the impurity elements were not added were manufactured in a similar manner.

First, an approximately 100-nm-thick tungsten film was formed over a glass substrate by a sputtering method and processed to obtain a first gate electrode. Then, as a first gate insulating layer, an approximately 240-nm-thick silicon nitride film, an approximately 60-nm-thick silicon nitride film, and an approximately 5-nm-thick silicon oxynitride film were stacked to be formed by a plasma CVD method.

Next, an approximately 40-nm-thick metal oxide film was deposited over the first gate insulating layer and processed to obtain a semiconductor layer. The metal oxide film was deposited by a sputtering method using an In—Ga—Zn oxide target (In:Ga:Zn=1:1:1.2 [atomic ratio]). Then, heat treatment was performed at a temperature of 400° C. in a nitrogen atmosphere for 1 hour, and heat treatment was subsequently performed at 400° C. in a mixed atmosphere of oxygen and nitrogen for 1 hour.

Next, an approximately 100-nm-thick silicon oxynitride film to be a second gate insulating layer was formed by a plasma CVD method. After that, heat treatment was performed at a temperature of 400° C. in a nitrogen atmosphere for 1 hour. Then, as oxygen supply treatment, plasma treatment was performed in an oxygen-containing atmosphere.

Next, an approximately 20-nm-thick metal oxide film was deposited over the second gate insulating layer by a sputtering method. The metal oxide film was deposited by a sputtering method using an In—Ga—Zn oxide target (In:Ga:Zn=1:1:1.2 [atomic ratio]).

Then, an approximately 100-nm-thick molybdenum film was deposited over the metal oxide film by a sputtering method. After that, part of the molybdenum film and part of the metal oxide film were removed by etching, so that a second gate electrode and a metal oxide layer were obtained.

Then, treatment for adding the impurity elements was performed using the second gate electrode as a mask. A plasma ion doping apparatus was used for addition of the impurities. In addition, a $B_2H_6$ gas was used as a gas for supplying boron, and a $PH_3$ gas was used as a gas for supplying phosphorus. A plurality of samples with different impurity dosage and acceleration voltage were manufactured. A plurality of samples with different impurity dosage and acceleration voltage were manufactured. Furthermore, for comparison, samples to which the impurities were not added were also manufactured.

Next, an approximately 300-nm-thick silicon oxynitride film was deposited by a plasma CVD method as a protective insulating layer covering the transistors. The deposition temperature of the silicon oxynitride film was 220° C. Then, heat treatment was performed under conditions of a temperature of 350° C. in a nitrogen atmosphere for 1 hour. Next, an opening was formed in part of the insulating layer covering the transistors and part of the second gate insulating layer, and a molybdenum film was deposited by a sputtering method and then processed to obtain a source electrode and a drain electrode. After that, an approximately 1.5-μm-thick acrylic film was formed as a planarization layer and heat treatment was performed under conditions of a temperature of 250° C. in a nitrogen atmosphere for 1 hour.

Through the above process, the transistors formed over the glass substrate were obtained.

[$I_d$-$V_g$ Characteristics of Transistor]

Next, $I_d$-$V_g$ characteristics of the manufactured transistors were measured.

Note that as conditions for measuring the $I_d$-$V_g$ characteristics of the transistors, voltage applied to the first gate electrode (hereinafter also referred to as gate voltage ($V_g$)) and voltage applied to the second gate electrode (also referred to as ($V_{bg}$)) were applied from −15 V to +20 V in steps of 0.25 V. In addition, voltage applied to the source electrode (hereinafter also referred to as source voltage ($V_s$)) was 0 V (comm), and voltage applied to the drain electrode (hereinafter also referred to as drain voltage ($V_d$)) was 0.1 V and 20 V.

Figure 23:
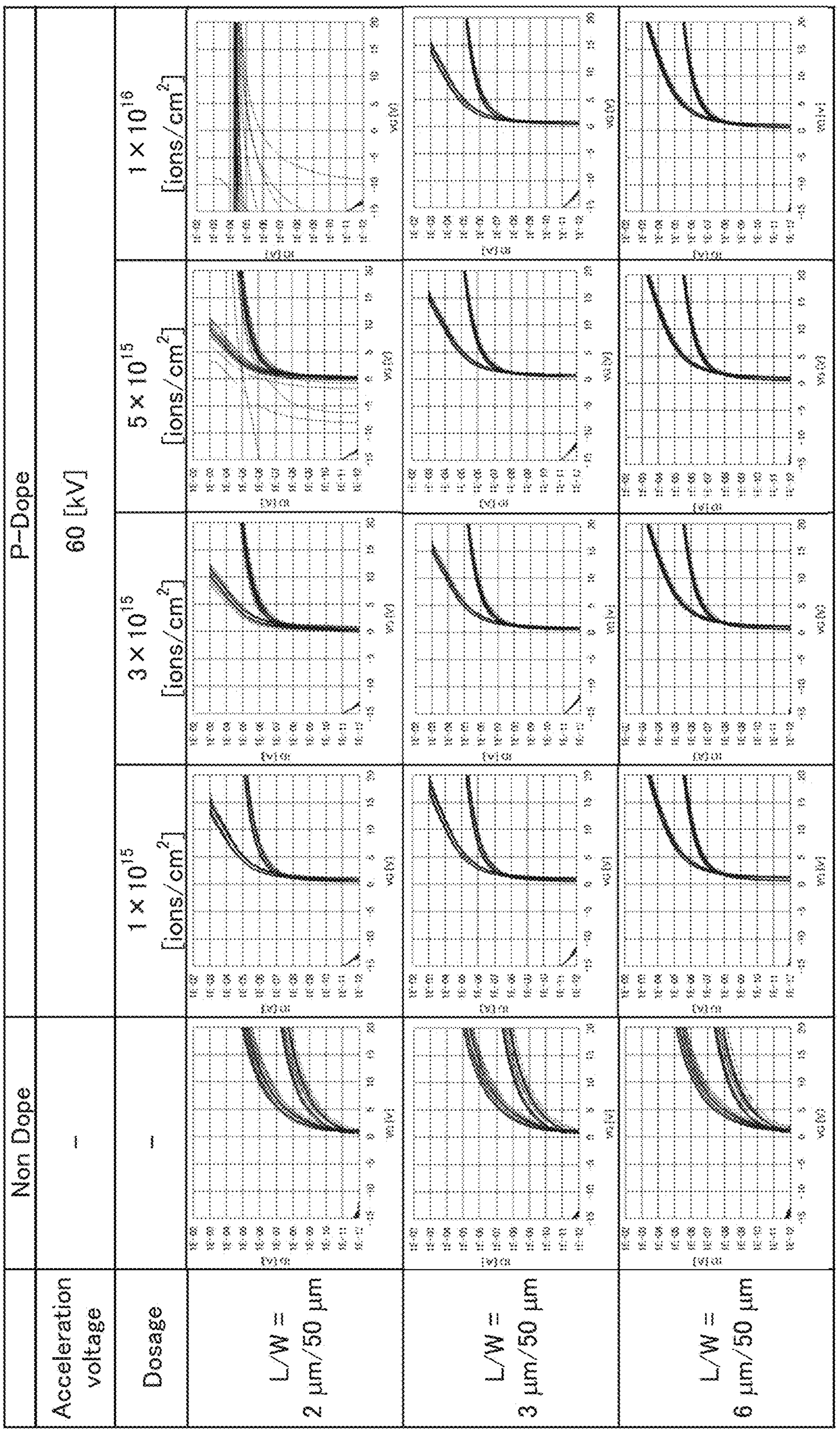
FIG. 23 Electrical characteristics of transistors.

FIG. 22 shows $I_d$-$V_g$ characteristics of transistors to which boron is added (B-Dope transistors), and FIG. 23 shows $I_d$-$V_g$ characteristics of transistors to which phosphorus is added. In FIG. 22 and FIG. 23, results with different conditions for adding the impurities are shown side by side in a horizontal direction. In addition, in each graph, transistors to which the impurity is not added (Non Dope transistors) are also shown side by side. FIG. 22 and FIG. 23 each show three kinds of transistors with a channel width of 50 μm and channel lengths of 2 μm, 3 μm, and 6 μm.

As shown in FIG. 22, it was found that a large amount of current can flow through the transistors to which boron was added compared to the transistors to which the impurity was not added. This means that the resistance of a source region and a drain region can be sufficiently low. In addition, even the transistors with the short channel length of 2 μm under a condition of an acceleration voltage of 20 kV exhibited favorable characteristics regardless of the dosage. On the other hand, the transistors under a condition of a high acceleration voltage of 60 kV tended to have lower current values than the transistors under other conditions. This tendency matches with the tendencies observed in the results of the sheet resistance and the like in Example 1.

In addition, as shown in FIG. 23, the transistors to which phosphorus was added also exhibited favorable electrical characteristics like the case of boron. Note that in some transistors with the short channel length under conditions of high dosage, the threshold voltage varied on a negative side.

Note that here, a plasma ion doping apparatus not including a mass separation mechanism was used as an apparatus used for adding the impurity elements; thus, hydrogen as well as a target element might be added. Therefore, a negative shift of the threshold voltage observed in the transistors with the short channel length in FIG. 22 and FIG. 23 might be influenced by hydrogen. Consequently, the use of an ion implantation apparatus including a mass separation mechanism probably enables manufacture of transistors with better electrical characteristics.

Example 3

As described below, transistors of one embodiment of the present invention were manufactured and reliability thereof were evaluated.

For the transistors whose reliability is evaluated, the manufacturing process described in Example 2 can be referred to. Boron was used as an impurity element, and the impurity element was added using a plasma ion doping apparatus. Acceleration voltage was 20 kV and dosage was $5\times10^{15}$ $cm^{-2}$. In addition, the deposition temperature of a silicon oxynitride film functioning as a protective layer was 350° C.

Figure 24A:
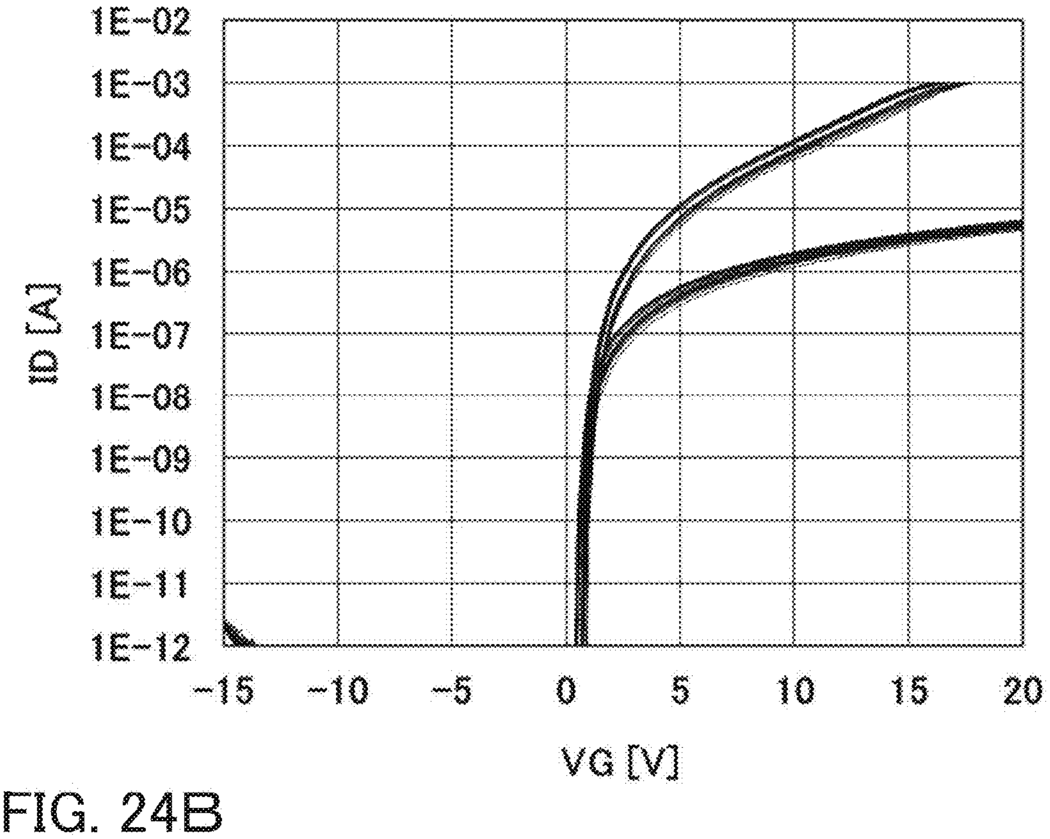
FIGS. 24A and 24B Evaluation results of electrical characteristics and reliability of transistors.

FIG. 24(A) shows $I_d$-$V_g$ characteristics of the manufactured transistors. As for the size of the transistors, channel length is 3 μm and channel width is 50 μm.

Then, a gate bias stress test (a GBT test) was performed on the transistors as reliability evaluation. In the GBT test, a substrate over which the transistors were formed was held at 60° C., 0 V was applied to a source and a drain of the transistor, and a voltage of 20 V or −20 V was applied to a gate; this state was held for 1 hour. Here, a test in which positive voltage is applied to a gate in a dark test environment is referred to as PBTS, and a test in which negative voltage is applied to a gate in a dark test environment is referred to as NBTS. In addition, PBTS in a state where a sample is irradiated with light is referred to as PBITS, and NBTS in a state where a sample is irradiated with light is referred to as NBITS. For light irradiation, white LED light with approximately 10000 lx was used.

Figure 24B:
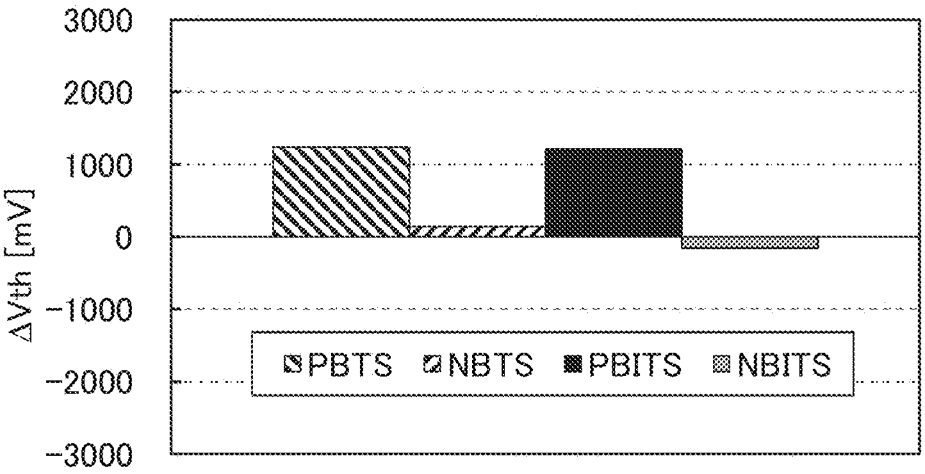

FIG. 24(B) shows the variable value of the threshold voltage ($\Delta V^{th}$) before and after the gate bias stress test. As shown in FIG. 24(B), it was found that the amount of change in the threshold voltage of the manufactured transistors was extremely small.

As described above, it was found that the transistors of one embodiment of the present invention had favorable electrical characteristics and high reliability.

Example 4

In this example, the oxygen blocking property of an insulating film containing an oxide to which an impurity element was added was evaluated by thermal desorption spectroscopy (TDS).

[Evaluation 1]

Here, after treatment for supplying oxygen to an oxide insulating film over an oxide semiconductor film was performed, samples supplied with impurities were manufactured and subjected to TDS measurement.

[Sample Manufacture]

First, an approximately 40-nm-thick oxide semiconductor film was deposited over a glass substrate. The oxide semiconductor film was deposited by a sputtering method using a metal oxide target whose atomic ratio was In:Ga:Zn=1:1:1.2.

Next, an approximately 100-nm-thick silicon oxide film was deposited over the oxide semiconductor film. The silicon oxide film was deposited by a plasma CVD method using a silane gas and a nitrous oxide gas as a deposition gas. Note that the substrate temperature in the deposition was 350° C.

Then, treatment for supplying oxygen into the oxide semiconductor film was performed. The treatment for supplying oxygen was performed in such a manner that a metal oxide film was deposited over a silicon oxide film by a sputtering method in an oxygen-containing atmosphere, heat treatment was performed at 400° C. for 1 hour after oxygen was supplied into the silicon oxide film, and oxygen was supplied to the oxide semiconductor film from the silicon oxide film. After that, the metal oxide film was removed by etching. The metal oxide film was formed under conditions similar to those for the oxide semiconductor film.

Then, the impurities were added. The impurities were added using an ion implantation apparatus including a mass-separation mechanism. Here, samples in which boron ($^{11}B$), phosphorus ($^{31}P$), and argon ($^{40}Ar$) were respectively implanted as the impurities were manufactured. Note that a sample in which the impurity was not implanted was also manufactured as a comparative sample.

The impurities were implanted under optimal conditions such that ions were able to reach the oxide semiconductor film through the silicon oxide film. Conditions for implanting boron were a beam energy of 20 keV and a dosage of $5\times10^{15}$ $cm^{-2}$. Conditions for implanting phosphorus were a beam energy of 60 keV and a dosage of $5\times10^{15}$ $cm^{-2}$. Conditions for implanting argon were a beam energy of 70 keV and a dosage of $5\times10^{15}$ $cm^{-2}$.

[TDS Analysis Result]

Figure 25:
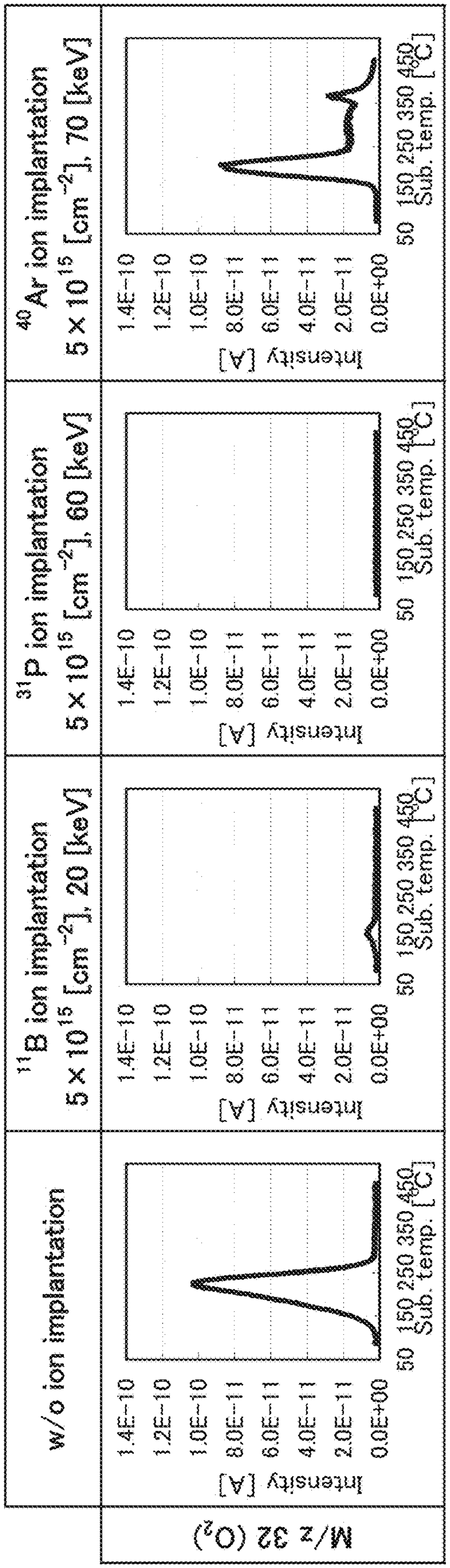
FIG. 25 TDS analysis results.

FIG. 25 shows TDS analysis results of oxygen molecules (a mass-to-charge ratio (M/z)=32). In each graph, the vertical axis represents detection intensity, and the horizontal axis represents substrate temperature.

It was found that in the sample without ion implantation, oxygen was released from a substrate temperature of approximately 150° C. to 300° C. On the other hand, it was found that oxygen was hardly released from the samples in which boron and phosphorus were implanted. This result showed that excess oxygen in the silicon oxide film was stabilized by implantation of boron and phosphorus to inhibit outward diffusion.

Meanwhile, it was found that the release of oxygen was significantly observed in the sample in which argon was implanted and an effect of inhibiting outward diffusion was small. In addition, although not shown here, it was found that oxygen and argon (M/z=20 and M/z=40) were released from the sample in which argon was implanted within the substrate temperature range of approximately 250° C. to 430° C. As a result, it is suggested that argon, which is a rare gas, has little interaction with oxygen in silicon oxide and an effect of stabilizing excess oxygen is expected to be not so large.

[Evaluation 2]

Here, a sample was manufactured in which a second oxide insulating film was formed over a first oxide insulating film subjected to treatment for supplying oxygen and impurities were supplied to the second oxide insulating film, and the oxygen blocking property of the second oxide insulating film was evaluated by TDS measurement.

[Sample Manufacture]

First, an approximately 150-nm-thick silicon oxide film was deposited over a glass substrate as a first oxide insulating film. The silicon oxide film was deposited under conditions similar to those for Evaluation 1.

Then, treatment for supplying oxygen to the first oxide insulating film was performed. The treatment for supplying oxygen was performed in such a manner that a metal oxide film was deposited over the silicon oxide film by a sputtering method in an oxygen-containing atmosphere, and oxygen was supplied into the silicon oxide film. After that, the metal oxide film was removed by etching. The metal oxide film was deposited using an indium tin oxide target containing silicon.

Next, an approximately 100-nm-thick silicon oxide film was deposited as a second oxide insulating film by a method similar to the above method.

Then, the impurities were added. The impurities were added using an ion implantation apparatus including a mass-separation mechanism. Here, samples in which boron ($^{11}B$), phosphorus ($^{31}P$), and argon ($^{40}Ar$) were respectively implanted as the impurities were manufactured as in Evaluation 1. Note that a sample in which the impurity was not implanted was also manufactured as a comparative sample.

The impurities were implanted under optimal conditions such that ions are implanted in only a second silicon oxide film. Conditions for implanting boron were a beam energy of 5 keV and a dosage of $5\times10^{15}$ $cm^{-2}$. Conditions for implanting phosphorus were a beam energy of 10 keV and a dosage of $5\times10^{15}$ $cm^{-2}$. Conditions for implanting argon were a beam energy of 10 keV and a dosage of $5\times10^{15}$ $cm^{-2}$.

[TDS Analysis Result]

Figure 26:
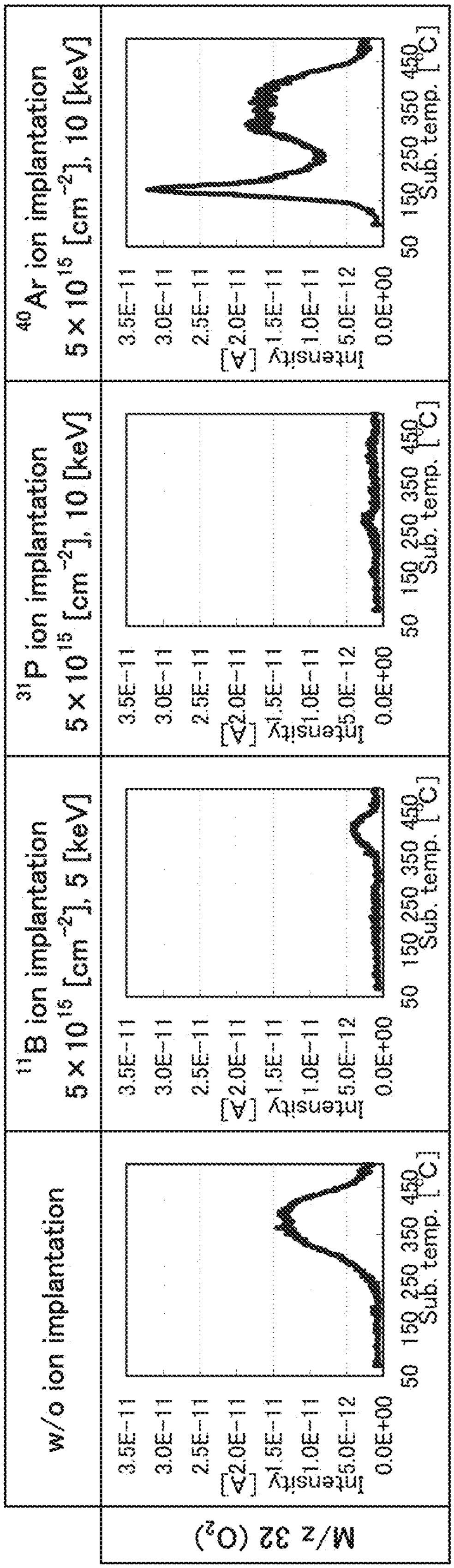
FIG. 26 TDS analysis results.

FIG. 26 shows TDS analysis results.

It was found that in the sample without ion implantation, oxygen was released from a substrate temperature of approximately 250° C. to 450° C. On the other hand, it was found that oxygen was hardly released from the samples in which boron and phosphorus were implanted. This result showed that excess oxygen in the silicon oxide film was stabilized by implantation of boron and phosphorus to inhibit outward diffusion.

Meanwhile, it was found that oxygen was released from the sample in which argon was implanted from a low temperature (around 150° C.) compared to the samples in which argon was not implanted. This was probably because damage to the second oxide insulating film was caused at the time of ion implantation, which resulted in a state where the release or diffusion of oxygen was likely to occur.

The above results showed that implantation of boron and phosphorus in the oxide insulating film resulted in a state where excess oxygen was less likely to be released. Furthermore, it was found that the oxide insulating film can have a function of blocking oxygen diffusion by implantation of boron and phosphorus.

Example 5

In this example, XPS analysis results of manufactured samples subjected to ion implantation are described.

Here, the following two kinds of samples were manufactured and analyzed. A first sample was a sample where an oxide semiconductor film was directly subjected to ion implantation. A second sample was a sample where a stacked film of an oxide insulating film stacked over an oxide semiconductor film was subjected to ion implantation.

[Sample Manufacture]

First, the first sample is described. An approximately 40-nm-thick oxide semiconductor film was deposited over a glass substrate. For a deposition method, Example 4 can be referred to. Next, boron ($^{11}B$) was implanted in the oxide semiconductor film by an ion implantation method. Conditions for implanting boron were a beam energy of 5 keV and a dosage of $1\times10^{16}$ $cm^{-2}$.

The description of Evaluation 1 in Example 4 except for ion implantation conditions can be referred to for the second sample. Ions were implanted by an ion implantation method under optimal conditions such that boron ($^{11}B$) was able to reach the oxide semiconductor film. Conditions for implanting boron were a beam energy of 20 keV and a dosage of $1\times10^{16}$ $cm^{-2}$.

[XPS Analysis]

The two kinds of samples manufactured as described above were subjected to XPS analysis. As an X-ray source for XPS measurement, Mg-Kα (1253.6 eV) was used. A combination of the XPS analysis and sputtering enabled analysis in a depth direction. In sputtering, argon ions were used and an acceleration voltage was 2.0 kV. The speed of sputtering converted into $SiO_2$ was approximately 5 nm/min.

Figure 27A:
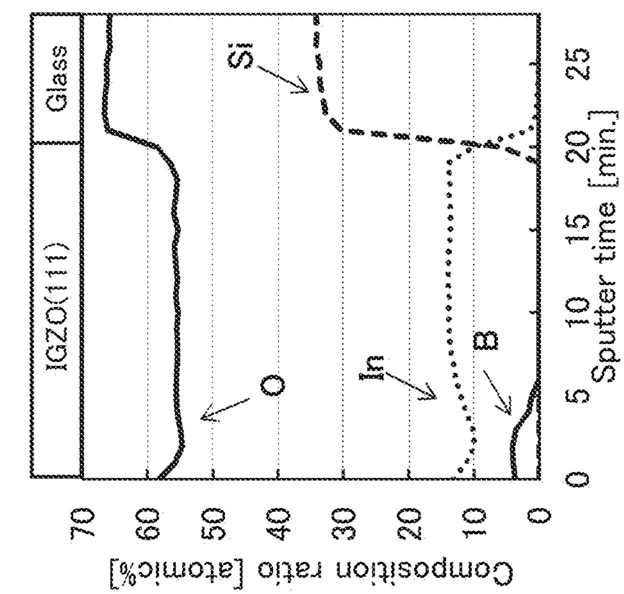
FIGS. 27A to 27C XPS analysis results.

FIG. 27(A) shows depth profiles obtained through XPS analysis in samples of oxide semiconductor films directly subjected to ion implantation. The horizontal axis represents sputtering time (sputter time), and the vertical axis represents atomic ratio (composition ratio).

As shown in FIG. 27, boron with a concentration of several atomic percent was detected in the vicinity of the oxide semiconductor film (IGZO).

Figure 27B:
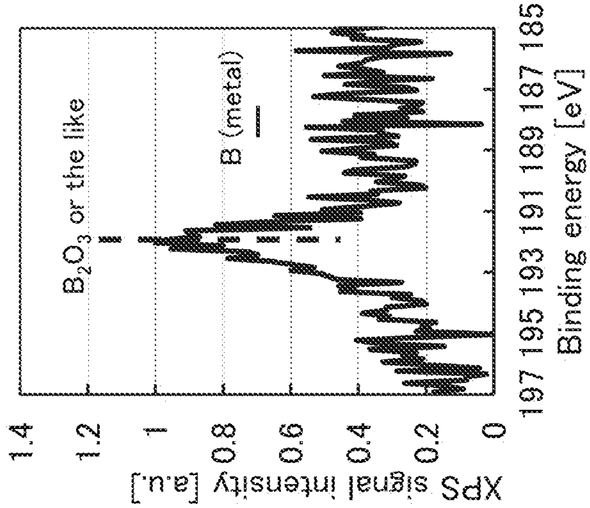

FIG. 27(B) shows an XPS spectrum within the energy range where a peak related to the 1s orbital of boron in an oxide semiconductor (IGZO) is obtained. The horizontal axis represents binding energy, and the vertical axis represents photoelectron intensity. A peak was observed at around 192 eV and no peak was observed at around 188 eV; thus, it was found that boron in the oxide semiconductor film existed in an oxidation state and boron hardly existed alone.

Figure 27C:
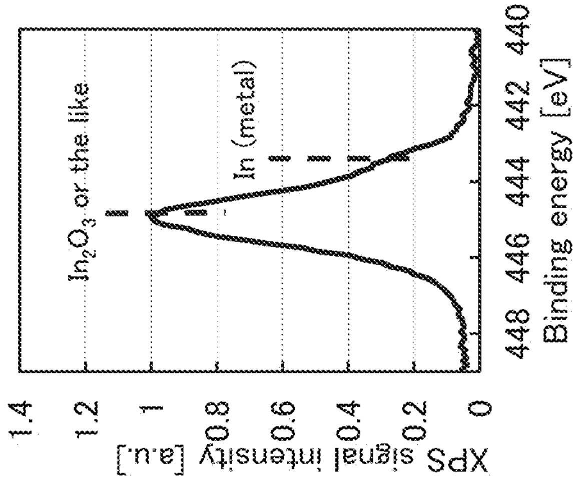

FIG. 27(C) shows an XPS spectrum within the energy range where a peak related to the $3d_{5/2}$ orbital of indium is obtained. A peak was observed at around 443 eV, which indicated that indium existed in a metal state. Accordingly, it was suggested that boron took oxygen bonded to indium away to generate oxygen vacancies.

Figure 28A:
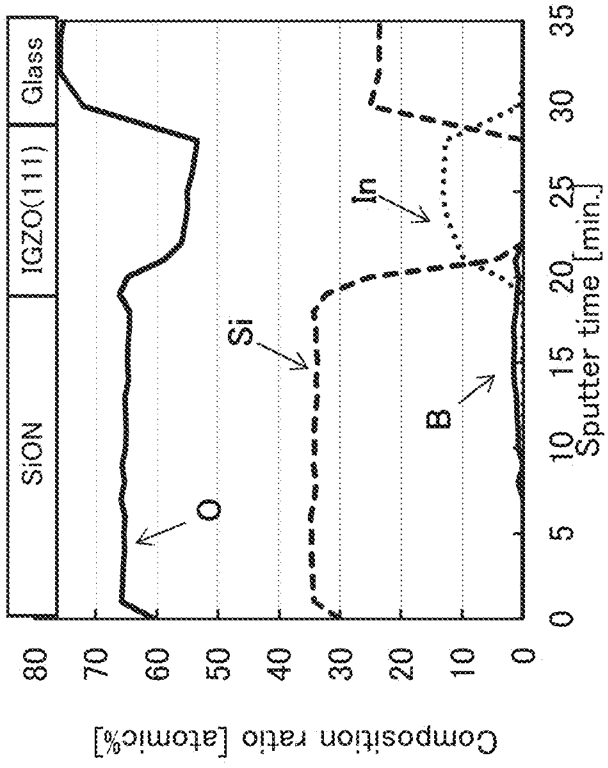
FIGS. 28A and 28B XPS analysis results.

FIG. 28(A) shows depth profiles obtained through XPS analysis in a sample of a stacked film of an oxide insulating film stacked over an oxide semiconductor film subjected to ion implantation. Boron with a concentration of several atomic percent was detected in the vicinity of an interface between the oxide insulating film (SiON) and the oxide semiconductor film (IGZO).

Figure 28B:
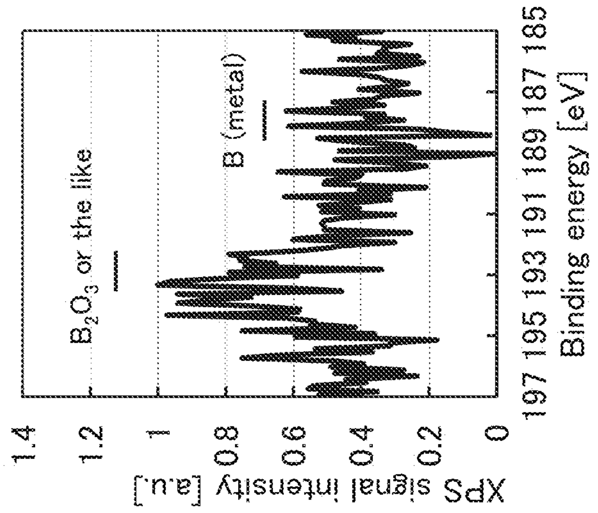

FIG. 28(B) an XPS spectrum within the energy range where a peak related to the Is orbital of boron in an oxide insulating film (SiON) is obtained. As in the oxide semiconductor film, it was found that boron also in the oxide insulating film existed in an oxidation state and boron hardly existed alone. Accordingly, it was found that boron was bonded to oxygen in the oxide insulating film.

It was found from the above results that boron implanted into the oxide semiconductor film and the oxide insulating film was bonded to oxygen in the films and existed in an oxide state.

Example 6

In this example, transistors of one embodiment of the present invention were manufactured and electrical characteristics thereof were evaluated.

[Sample Manufacture]

First, a first gate electrode, a first gate insulating layer, a semiconductor layer, and a second gate insulating layer were formed over a glass substrate by a method similar to the method described in Example 2. Then, an approximately 10-nm-thick aluminum oxide film was deposited over the second gate insulating layer by a sputtering method, an approximately 5-nm-thick titanium film, an approximately 300-nm-thick aluminum film, and an approximately 50-nm-thick titanium film were sequentially deposited, and some of these metal films and the aluminum oxide films were removed by etching to obtain a second gate electrode and a metal oxide layer.

Then, impurity elements were implanted by an ion implantation method using the second gate electrode as a mask. Here, two kinds of samples, which were a sample in which boron ($^{11}B$) was implanted and a sample in which phosphorus ($^{31}P$) was implanted, were manufactured. Conditions for implanting boron were a beam energy of 15 keV and a dosage of $3\times10^{15}$ $cm^{-2}$. Conditions for implanting phosphorus were a beam energy of 45 keV and a dosage of $1\times10^{15}$ $cm^{-2}$.

Then, a protective insulating layer was formed by a method similar to the method in Example 2 and was subjected to heat treatment. For a source electrode and a drain electrode, a stacked film of an approximately 50-nm-thick tungsten film, an approximately 400-nm-thick aluminum film, and an approximately 100-nm-thick titanium film, which were deposited by a sputtering method, was used. Next, a planarization layer was formed as in Example 2, and heat treatment was performed.

Through the above steps, two kinds of samples using boron or phosphorus as the impurity element were obtained.

[$I_d$-$V_g$ Characteristics of Transistor]

Next, $I_d$-$V_g$ characteristics of the manufactured transistors were measured. For measurement conditions, Example 2 can be referred to.

FIG. 29 shows $I_d$-$V_g$ characteristics of transistors using boron as the impurity element and transistors using phosphorus as the impurity element. FIG. 29 shows three kinds of transistors with a channel width of 50 μm and channel lengths of 2 μm, 3 μm, and 6 μm. The number of measurement points in each transistor is 20.

As shown in FIG. 29, it was found that both the transistors to which boron was added and the transistors to which phosphorus was added had extremely favorable electrical characteristics.

REFERENCE NUMERALS

100 and 100A: transistor, 102: substrate, 103, 110, 116, and 118: insulating layer, 103*d*, 108*n*, and 110*d*: region, 106, 106*c*, 112, 120*a*, and 120*b*: conductive layer, 108 and 108*c*: semiconductor layer, 112*f*: conductive film, 114: metal oxide layer, 114*f*: metal oxide film, 130A and 130B: capacitor, 140: impurity element, 141*a*, 141*b*, and 142: opening portion.

The invention claimed is:

1. A method for manufacturing a semiconductor device comprising a transistor, comprising the steps of:

forming an oxide semiconductor layer;

forming an oxide film comprising a region in contact with a side surface of the oxide semiconductor layer and a region in contact with a top surface of the oxide semiconductor layer;

forming a first conductive layer over the oxide film;

forming an insulating layer comprising a region in contact with a top surface of the first conductive layer, a region in contact with a side surface of the first conductive layer, and a region in contact with a top surface of the oxide film;

performing heat treatment to supply oxygen to the oxide semiconductor layer from the oxide film; and performing an impurity element doping treatment to the oxide semiconductor layer through the oxide film before the formation of the insulating layer, wherein a channel formation region of the oxide semiconductor layer and the first conductive layer overlap with each other, wherein the impurity element is phosphorous, boron, magnesium, aluminum, or silicon, and wherein the impurity element is doped to achieve a region with a concentration distribution where a concentration of the impurity element in the oxide film becomes higher as the impurity element becomes closer to the oxide semiconductor layer.

2. The method for manufacturing a semiconductor device according to claim 1, wherein the heat treatment is performed within a temperature range of higher than or equal to 200° C. to lower than or equal to 400° C.

3. The method for manufacturing a semiconductor device according to claim 1, wherein the formation of the insulating layer is performed within a temperature range of higher than or equal to 150° C. to lower than or equal to 400° C.

4. The method for manufacturing a semiconductor device according to claim 1, wherein the insulating layer comprises any one of a silicon nitride, silicon nitride oxide, silicon oxynitride, aluminum oxide, aluminum oxynitride, aluminum nitride, hafnium oxide, and hafnium aluminate.

5. The method for manufacturing a semiconductor device according to claim 1, wherein the impurity element is doped to achieve a region with a concentration distribution where a concentration of the impurity element becomes the highest in a boundary between the oxide semiconductor layer and the oxide film, in a vicinity of the oxide film in the oxide semiconductor layer, or in a vicinity of the oxide semiconductor layer in the oxide film.

6. The method for manufacturing a semiconductor device according to claim 1, wherein the impurity element is doped to the oxide semiconductor layer by a plasma ion doping method or an ion implantation method.

7. The method for manufacturing a semiconductor device according to claim 6, wherein when the impurity element is boron:

an acceleration voltage is within a range of higher than or equal to 7 kV and lower than or equal to 70 kV, and a dosage of boron is greater than or equal to $1\times10^{14}$ $ions/cm^2$ and lower than or equal to $5\times10^{16}$ $ions/cm^2$.

8. The method for manufacturing a semiconductor device according to claim 6, wherein when the impurity element is phosphorus:

an acceleration voltage is within a range of higher than or equal to 30 kV and lower than or equal to 90 kV, and a dosage of phosphorus is greater than or equal to $1\times10^{14}$ $ions/cm^2$ and lower than or equal to $5\times10^{16}$ $ions/cm^2$.

9. The method for manufacturing a semiconductor device according to claim 1, further comprising the step of:

forming a second conductive layer below the oxide semiconductor layer, wherein the second conductive layer overlaps with the channel formation region of the oxide semiconductor layer and the first conductive layer, and wherein the first conductive layer is in contact with the second conductive layer through an opening formed in the oxide film.

10. The method for manufacturing a semiconductor device according to claim 9, wherein one or both of the first conductive layer and the second conductive layer are configured to be a gate electrode of the transistor.

11. The method for manufacturing a semiconductor device according to claim 1, further comprising a metal oxide layer, wherein the metal oxide layer is sandwiched between the first conductive layer and the oxide film, and wherein the insulating layer comprises a region in contact with a side surface of the metal oxide layer.

12. The method for manufacturing a semiconductor device according to claim 11, wherein an end portion of the first conductive layer and an end portion of the metal oxide layer are aligned with each other.

13. The method for manufacturing a semiconductor device according to claim 1, wherein the impurity element is doped to achieve a region with a concentration distribution where a concentration of the impurity element in the oxide semiconductor layer becomes higher as the impurity element becomes closer to the oxide film.

14. The method for manufacturing a semiconductor device according to claim 1, wherein the oxide film is formed such that it comprises a region containing excess oxygen.

* * * * *